(12) United States Patent
Hashimoto et al.

(10) Patent No.: US 11,916,513 B2
(45) Date of Patent: Feb. 27, 2024

(54) OSCILLATOR

(71) Applicant: NEC Corporation, Tokyo (JP)

(72) Inventors: Yoshihito Hashimoto, Tokyo (JP);
Tsuyoshi Yamamoto, Tokyo (JP);
Tomohiro Yamaji, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 18/134,145

(22) Filed: Apr. 13, 2023

(65) Prior Publication Data

US 2023/0299719 A1 Sep. 21, 2023

Related U.S. Application Data

(63) Continuation of application No. 17/573,841, filed on Jan. 12, 2022, now Pat. No. 11,658,613.

(30) Foreign Application Priority Data

Jan. 28, 2021 (JP) .................. 2021-012488

(51) Int. Cl.
*H03B 15/00* (2006.01)
*H01L 39/22* (2006.01)
*H10N 60/12* (2023.01)

(52) U.S. Cl.
CPC .......... *H03B 15/003* (2013.01); *H10N 60/12* (2023.02)

(58) Field of Classification Search
CPC ........ G06N 10/00; G06N 10/40; G06N 99/00; H01L 39/025; H01L 39/22; H01L 39/223; H01P 3/003; H03B 15/003; H10N 60/12
See application file for complete search history.

(56) References Cited

U.S. PATENT DOCUMENTS

| 2018/0322408 A1 | 11/2018 | Chen | H01P 3/003 |
|---|---|---|---|
| 2019/0044044 A1 | 2/2019 | Lampert | G06N 10/00 |
| 2019/0065981 A1 | 2/2019 | Chen | H05K 1/181 |
| 2022/0138811 A1 | 5/2022 | Siddiqi | G06N 10/20 |
| | | | 718/100 |

FOREIGN PATENT DOCUMENTS

JP 2018-524795 A 8/2018

*Primary Examiner* — Levi Gannon
(74) *Attorney, Agent, or Firm* — Sughrue Mion, PLLC

(57) ABSTRACT

An oscillator in which crosstalk can be reduced is provided. An oscillator includes a SQUID, a transmission line connected to the SQUID, a ground plane, and a first connection circuit disposed in a vicinity of a node of an electric field of a standing wave that is generated when the oscillator is oscillating, the first connection circuit connecting parts of the ground plane located on both sides of the transmission line to each other.

4 Claims, 65 Drawing Sheets

OSCILLATOR

INCORPORATION BY REFERENCE

This application is a Continuation of U.S. application Ser. No. 17/573,841, filed on Jan. 12, 2022, which is based upon and claims the benefit of priority from Japanese patent application No. 2021-12488, filed on Jan. 28, 2021, the disclosure of which is incorporated herein in its entirety by reference.

TECHNICAL FIELD

The present disclosure relates to an oscillator, and in particular to a technique for reducing crosstalk in a superconducting quantum circuit.

BACKGROUND ART

How to reduce crosstalk in a chip of a quantum circuit where a plurality of quantum bits are integrated is an important problem to be solved. Note that crosstalk means a phenomenon in which, for example, when a control signal is input to a given quantum bit, that control signal couples with another quantum bit for some reason and hence the other quantum bit is also unintentionally controlled. Specifically, for example, it is a phenomenon in which the resonance frequency of the other quantum bit is changed. In experiments, crosstalk is also observed when a DC (Direct Current) control signal is input to a quantum bit as well as when a control signal having a high frequency such as 20 GHz is input to a quantum bit.

A chip of a superconducting quantum circuit is manufactured by using, for example, a coplanar waveguide structure. Published Japanese Translation of PCT International Publication for Patent Application, No. 2018-524795 discloses a technique by which crosstalk in such a quantum circuit chip can be reduced. In the configuration disclosed in this document, GNDs (grounds) on both sides of a core line of a coplanar waveguide are kept at potentials equal to each other by electrically connecting the GNDs on both sides of the core line by using an air bridge. In this way, a slot line mode is suppressed and, as a result, crosstalk can be reduced.

SUMMARY

However, research and development regarding superconducting quantum circuits are still being conducted, so it has been required to provide new technologies for reducing crosstalk.

The present disclosure has been made to solve the above-described problem, and an example object thereof is to provide an oscillator in which crosstalk can be reduced.

In a first example aspect, an oscillator includes:
 a SQUID (Superconducting QUantum Interference Device);
 a transmission line connected to the SQUID;
 a ground plane; and
 a first connection circuit disposed in a vicinity of a node of an electric field of a standing wave that is generated when the oscillator is oscillating, the first connection circuit connecting parts of the ground plane located on both sides of the transmission line to each other.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENT

In the following description, the Josephson junction means an element having a structure in which a thin insulating film is sandwiched between a first superconductor and a second superconductor. Further, a SQUID (Superconducting QUantum Interference Device) is a component in which two Josephson junctions are connected in a loop by superconducting lines. Further, some or all of the circuits described hereinafter are, for example, formed by using lines (wiring lines) made of a superconductor, and are used in an environment having a temperature of, for example, 10 mK (milli-Kelvin) in order to obtain a superconducting state.

[Preliminary Study]

Firstly, a problem of crosstalk in a chip of a superconducting quantum circuit in which a plurality of quantum bit are integrated will be described.

Figure 1:
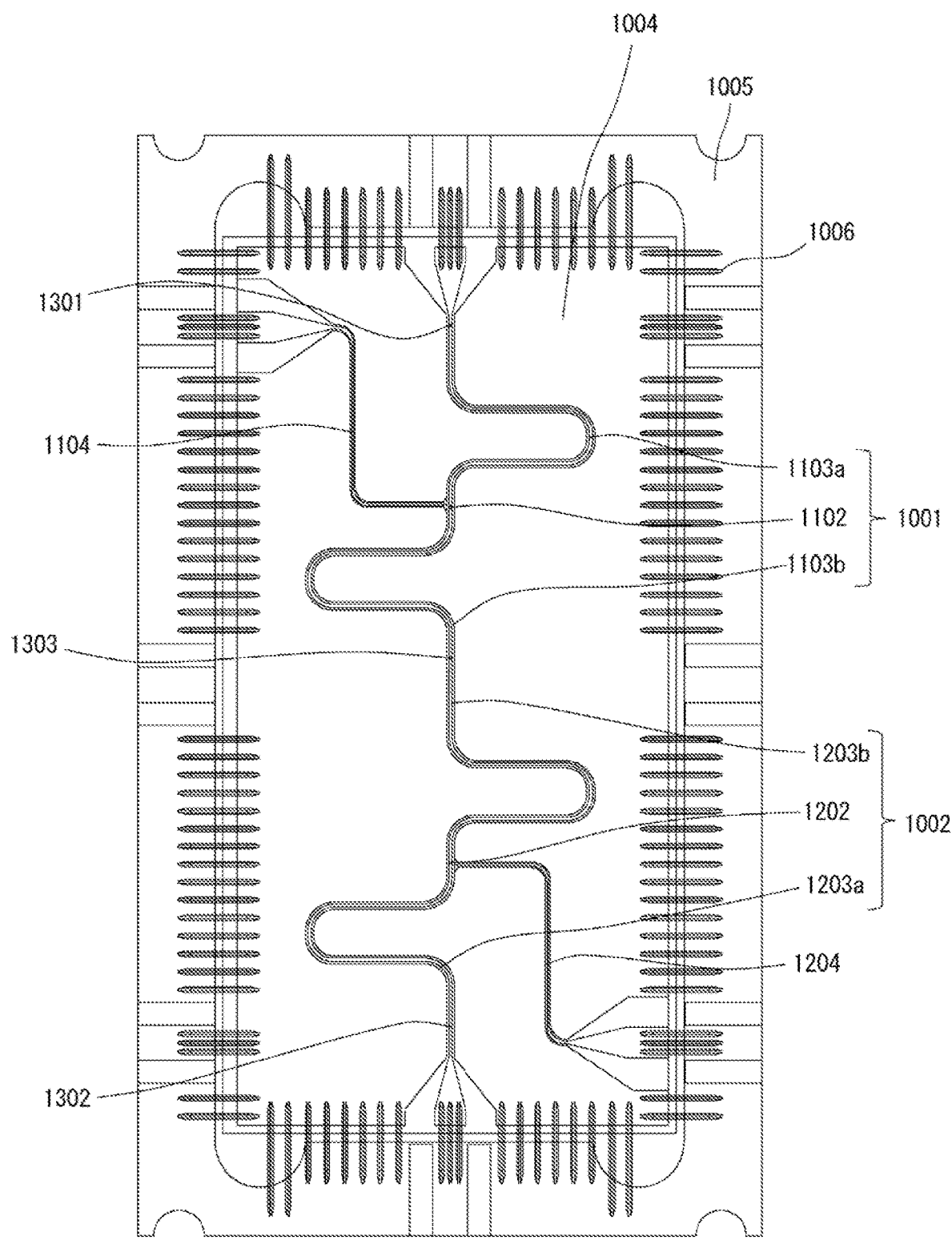
FIG. 1 shows a chip layout on a 2-bit distributed constant-type superconducting quantum circuit.
Figure 2:
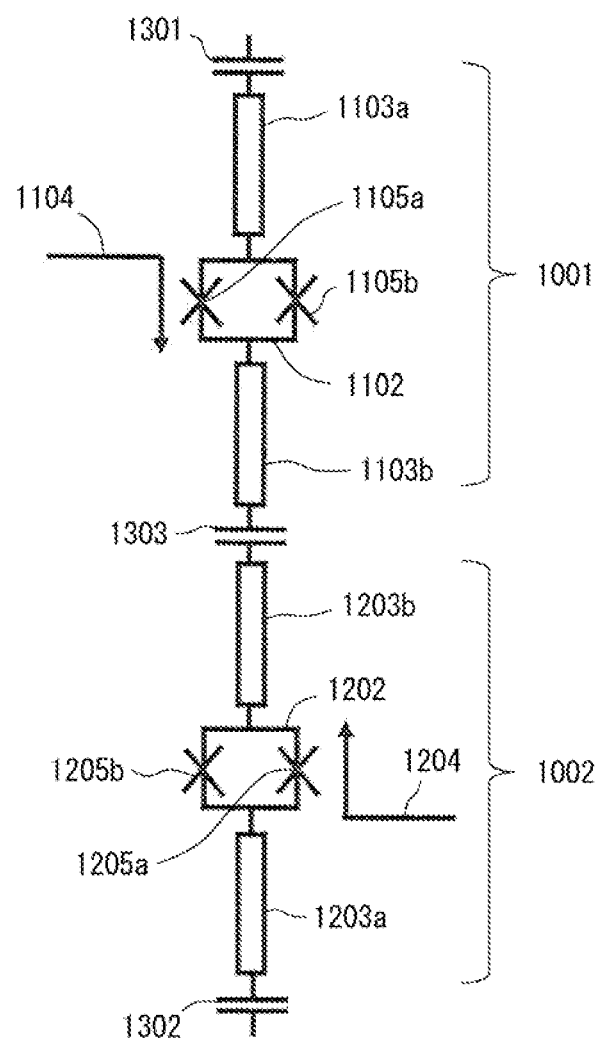
FIG. 2 shows an equivalent circuit of a 2-bit distributed constant-type superconducting quantum circuit.

As an example of a chip of a quantum circuit in which a plurality of quantum bits are integrated, FIG. 1 shows a chip layout of a 2-bit distributed constant-type superconducting quantum circuit. FIG. 2 shows an equivalent circuit of the 2-bit distributed constant-type superconducting quantum circuit shown in FIG. 1. This 2-bit distributed constant-type superconducting quantum circuit has a configuration in which a first quantum bit 1001 and a second quantum bit 1002 are coupled with each other through a capacitor 1303. The first and second quantum bits 1001 and 1002 have configurations similar to each other. The first quantum bit 1001 has a configuration in which each of two distributed constant lines is connected to a respective one of both ends of a SQUID 1102. Each of these distributed constant lines has a length corresponding to ¼ of a wavelength corresponding to the operating frequency of the first quantum bit 1001, so they are referred to as λ/4 lines 1103a and 1103b, respectively, hereinafter. When the operating frequency of the first quantum bit 1001 is about 10 GHz, the length of each of the λ/4 lines 1103a and 1103b is about 2 to 3 mm. A control line 1104 is magnetically coupled with the SQUID 1102. In other words, the control line 1104 and the SQUID 1102 are magnetically coupled with each other by their mutual inductance in a noncontact manner. The resonance frequency of the first quantum bit 1001 can be set by inputting a DC control signal thereto from the control line 1104. In a state in which a DC control signal for setting the resonance frequency to a certain frequency is being input to the control line 1104, it is possible to make the first quantum bit 1001 oscillate by further inputting a control signal having a frequency twice the set resonance frequency to the control line 1104. The operating frequency (the set resonance frequency) of the first quantum bit 1001 is, for example, about 10 GHz. Therefore, when the first quantum bit 1001 is operated, a signal in which a DC control signal and a high-frequency control signal having a frequency of about 20 GHz are superimposed is input to the first quantum bit 1001 from the control line 1104. The configuration and how to operate the second quantum bit 1002 are similar to those of the first quantum bit 1001, and therefore detailed descriptions thereof are omitted.

In the configuration shown in the drawing, the first and second quantum bits 1001 and 1002 are located on a chip 1004 which is electrically connected to wiring lines on a printed circuit board (PCB) 1005 by using bonding wires 1006. The second quantum bit 1002 includes a SQUID 1202, a λ/4 line 1203a, and a λ/4 line 1203b. A control line 1204 is magnetically coupled with the SQUID 1202. Note that one end of the λ/4 line 1103a of the first quantum bit 1001 is connected to the SQUID 1102, and the other end of the λ/4 line 1103a is connected to a capacitor 1301. Further, one end of the λ/4 line 1103b of the first quantum bit 1001 is connected to the SQUID 1102, and the other end of the λ/4 line 1103b is connected to the capacitor 1303. Similarly, one end of the λ/4 line 1203a of the second quantum bit 1002 is connected to the SQUID 1202, and the other end of the λ/4 line 1203a is connected to a capacitor 1302. Further, one end of the λ/4 line 1203b of the second quantum bit 1002 is connected to the SQUID 1202, and the other end of the λ/4 line 1203b is connected to the capacitor 1303. As shown in FIG. 2, the SQUID 1102 is a component in which a Josephson junction 1105a and a Josephson junction 1105b are connected in a loop, and both ends of the SQUID 1102 are connected to the λ/4 lines 1103a and 1103b, respectively. Similarly, the SQUID 1202 is a component in which a Josephson junction 1205a and a Josephson junction 1205b are connected in a loop, and both ends of the SQUID 1202 are connected to the λ/4 lines 1203a and 1203b, respectively.

Figure 3A:
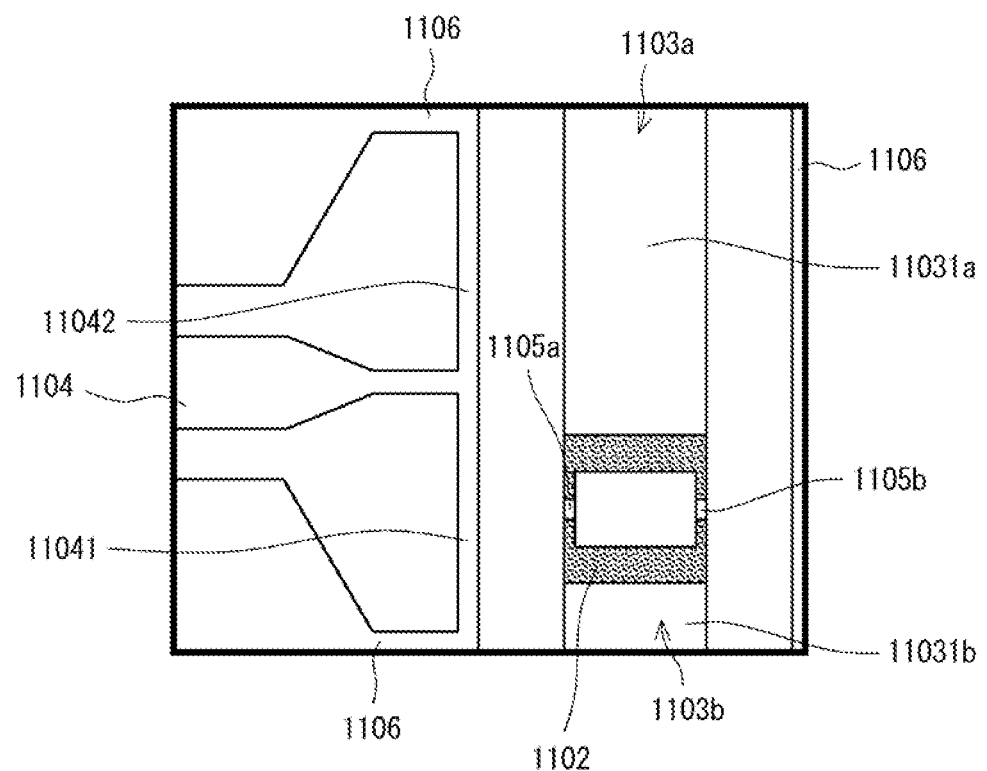
FIG. 3A is an enlarged view of a part of the chip layout of the 2-bit distributed constant-type superconducting quantum circuit in the vicinity of a SQUID thereof.
Figure 3B:
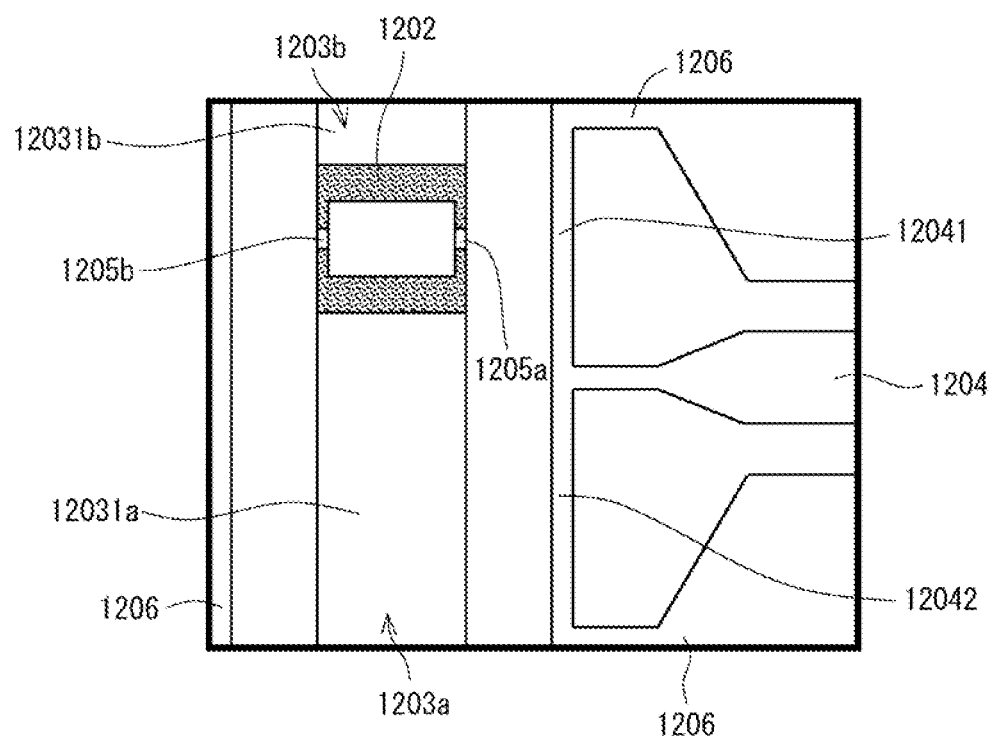
FIG. 3B is an enlarged view of a part of the chip layout of the 2-bit distributed constant-type superconducting quantum circuit in the vicinity of the SQUID thereof.

FIG. 3A shows an enlarged view of a part of the first quantum bit 1001 shown in FIG. 1 in the vicinity of the SQUID 1102 thereof. Further, FIG. 3B shows an enlarged view of a part of the second quantum bit 1002 shown in FIG. 1 in the vicinity of the SQUID 1202 thereof. Only the first quantum bit 1001 shown in FIG. 3A is described hereinafter, and the description of the second quantum bit 1002, which can be described in a similar manner, is omitted.

The tip of the control line 1104 separates into a first branch line 11041 and a second branch line 11042, of which the first branch line 11041 is laid out near the SQUID 1102 so that it magnetically couples with the SQUID 1102. Meanwhile, the second branch line 11042 is laid out away from the SQUID 1102 so that it does not magnetically couple with the SQUID 1102.

The control line 1104 and the λ/4 lines 1103a and 1103b are formed as a coplanar waveguide. The GND (ground) plane 1106 is located around the lines formed as the coplanar waveguide. The first and second branch lines 11041 and 11042 are both connected to this GND plane 1106. Note that by the above-described branching, the imbalance between the currents that flow from the control line 1104 to the parts of the GND plane 1106 located on both sides of the control line 1104 is suppressed.

Note that, in FIG. 3A, a symbol 11031a represents a core line of the λ/4 line 1103a, and a symbol 11031b represents a core line of the λ/4 line 1103b. Similarly, in FIG. 3B, a symbol 12031a represents a core line of the λ/4 line 1203a, and a symbol 12031b represents a core line of the λ/4 line 1203b. Further, in FIG. 3b, symbols 12041 and 12042 represent the first and second branch lines, respectively, of the control line 1204, and a symbol 1206 represents the GND plane.

Crosstalk means a phenomenon in which, for example, when a DC control signal or a high-frequency control signal is input to the first quantum bit 1001 from the control line 1104, that control signal couples with the SQUID 1202 of the second quantum bit 1002 for some reason and hence the second quantum bit 1002 is affected by the control signal. Specifically, it means a phenomenon in which, for example, the resonance frequency of the second quantum bit 1002 is changed.

Figure 4:
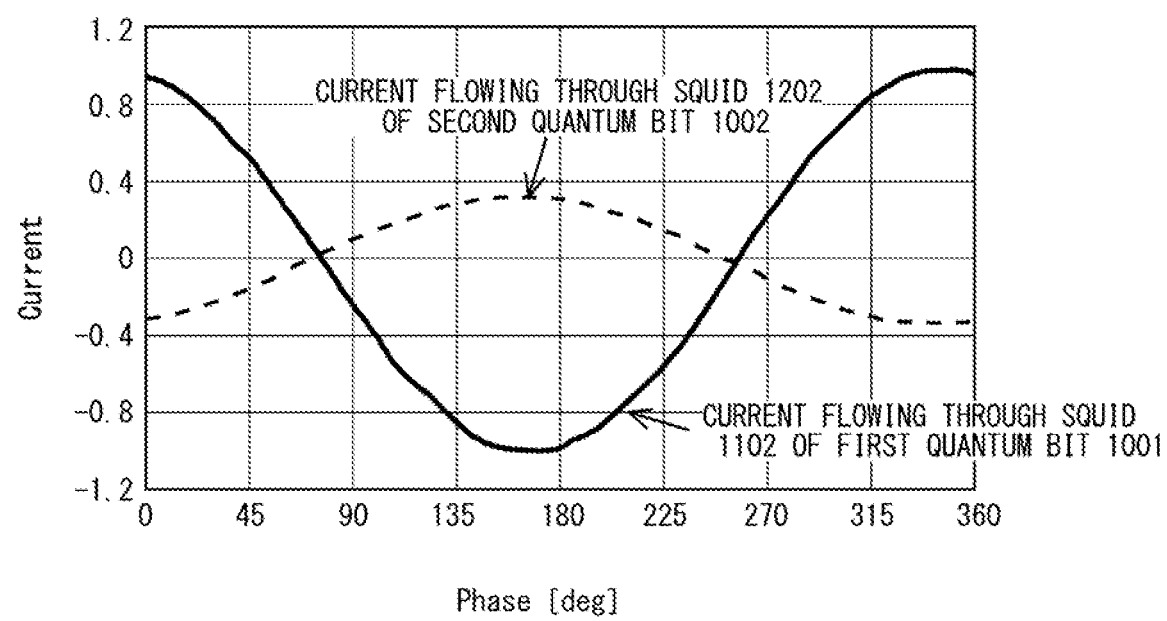
FIG. 4 is a graph showing a result of a simulation in which a control signal having a frequency of 20 GHz is input to a first quantum bit from a control line of the first quantum bit.

In order to understand the cause of this crosstalk, we have carried out simulations using electromagnetic-field analysis software. Note that the simulations were performed by using ANSYS HFSS manufactured by Ansys Japan, Inc. The results of the simulations showed that when a control signal having a frequency of 20 GHz was input to the first quantum bit 1001 from the control line 1104 thereof, a large current flowed along the λ/4 lines 1103a, 1103b, 1203b and 1203a. Further, the following results were also obtained. FIG. 4 is a graph showing a current that flows in the SQUID 1102 of the first quantum bit 1001 and a current that flows in the SQUID 1202 of the second quantum bit 1002 when a control signal having a frequency of 20 GHz is input to the first quantum bit 1001 from the control line 1104 thereof. Note that, in the graph shown in FIG. 4, the horizontal axis indicates the phase of the control signal. The vertical axis indicates the amount of the current. As shown in FIG. 4, a current that changes in a sine wave according to the phase flows through the SQUID 1102 of the first quantum bit 1001. Note that the vertical axis in FIG. 4 has been normalized so that the maximum value becomes one. Since the SQUID 1102 of the first quantum bit 1001 is designed so as to magnetically couple with the control line 1104, the flow of the current through the SQUID 1102 of the first quantum bit 1001 is the intended behavior. However, as shown in FIG. 4, a current also flows through the SQUID 1202 of the second quantum bit 1002, which should not flow therethrough in the design. The maximum value of the current flowing through the SQUID 1202 of the second quantum bit 1002 is 0.32, which means that a current as large as 32% of the current flowing through the SQUID 1102 of the first quantum bit 1001 flows through the SQUID 1202 of the second quantum bit 1002. That is, it can be understood that the SQUID 1202 of the second quantum bit 1002 is affected by high-frequency crosstalk.

The results shown in FIG. 4 indicate that when a high-frequency control signal having a frequency of 20 GHz is input from the control line 1104, a high-frequency electromagnetic field propagates along the $\lambda/4$ lines 1103a, 1103b, 1203b and 1203a. It is considered that this phenomenon is caused by the occurrence of a potential difference between the GND planes 1106 and 1206 located on both sides of the core lines 11031a, 11031b, 12031b and 12031a of the $\lambda/4$ lines 1103a, 1103b, 1203b and 1203a, which should desirably be at potentials equal to each other. Therefore, in order to solve the above-described problem, the GND planes 1106 and 1206 located on both sides of the core lines 11031a, 11031b, 12031b and 12031a of the $\lambda/4$ lines 1103a, 1103b, 1203b and 1203a should be short-circuited to each other. Specifically, as mentioned, for example, in Published Japanese Translation of PCT International Publication for Patent Application, No. 2018-524795, it is considered that this short-circuiting can be accomplished by providing air bridges at places along the $\lambda/4$ lines 1103a, 1103b, 1203b and 1203a. Further, regarding the interval between the air bridges, for example, there is a method in which the interval is made sufficiently shorter than the wavelength of an electromagnetic field that propagates through the quantum bit. Since the frequency of the control signal in the example examined here is 20 GHz, the aforementioned wavelength on a silicon substrate is about 5.9 mm. A case where air bridges are provided at intervals sufficiently shorter than this wavelength, for example, at intervals of 600 μm (about 1/10 of the wavelength) or shorter will be examined hereinafter. Note that the air bridge is a structure made of a conductive material such as a metal, and is a structure for electrically connecting GND planes located on both sides of a core line to each other. The air bridge has such a structure that it is not in contact with the core line, and intersects the core line in a three-dimensional manner (i.e., like an overpass). Therefore, the air bridge and the core line are not electrically connected to each other. Typically, the space between the air bridge and the core line is filled with air or is a vacuum. In the case of a superconducting quantum circuit, the space between the air bridge and the core line is a vacuum. However, since an air bridge is typically manufactured by using a semiconductor process technology, there is a possibility that some dielectric material such as a resist may remain near the air bridge during the manufacturing of the air bridge.

Figure 5:
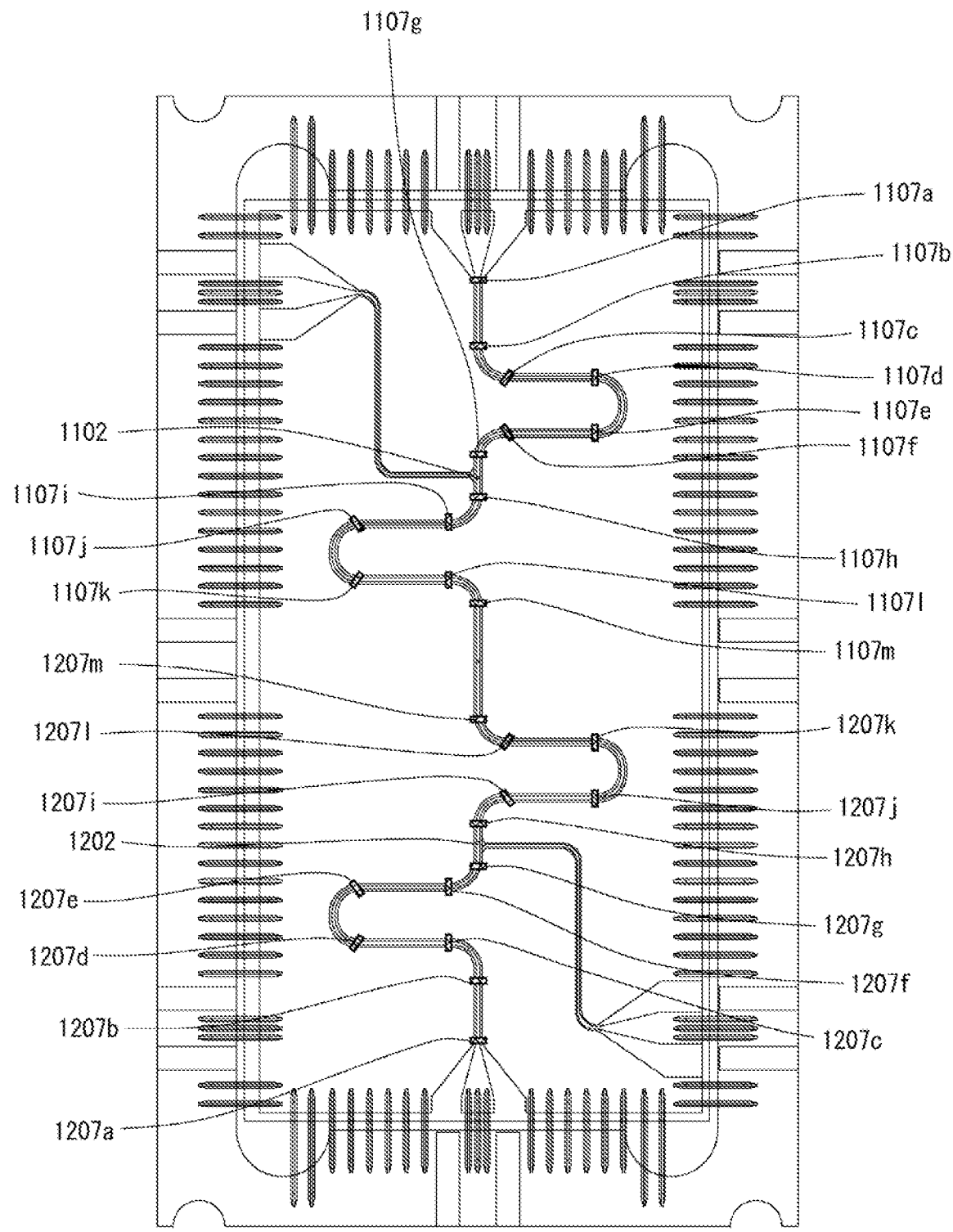
FIG. 5 shows a chip layout in a case where air bridges are disposed over the entire $\lambda/4$ line at intervals equal to or shorter than $\frac{1}{10}$ of a wavelength corresponding to 20 GHz.
Figure 6:
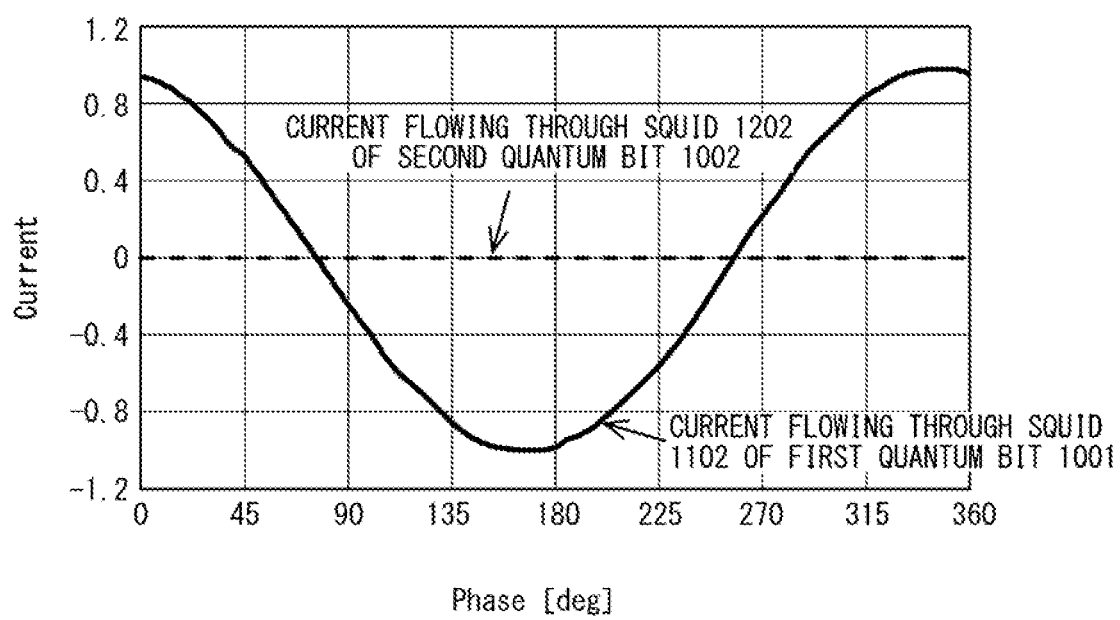
FIG. 6 is a graph showing a result of a simulation in which air bridges are disposed over the entire $\lambda/4$ line and a control signal having a frequency of 20 GHz is input to a first quantum bit from a control line of the first quantum bit.

FIG. 5 shows a chip layout in which air bridges 1107a to 1107m and air bridges 1207a to 1207m are provided for $\lambda/4$ lines 1103a, 1103b, 1203b and 1203a at intervals sufficiently shorter than the wavelength corresponding to the frequency of 20 GHz based on the above-described concept. Further, FIG. 6 also shows a result of a simulation in which a control signal having a frequency of 20 GHz is input to the first quantum bit 1001 from the control line 1104 thereof in the configuration shown in FIG. 5. By the provision of the air bridges 1107a to 1107m and 1207a to 1207m, the current flowing along the $\lambda/4$ lines 1103a, 1103b, 1203b and 1203a was suppressed. As a result, as shown in FIG. 6, the current flowing through the SQUID 1202 of the second quantum bit 1002 was reduced to about 1% of the current flowing through the SQUID 1102 of the first quantum bit 1001. Therefore, it can be understood that it is possible to significantly reduce the high-frequency crosstalk by providing a plurality of air bridges 1107a to 1107m and 1207a to 1207m over the entire $\lambda/4$ lines 1103a, 1103b, 1203b and 1203a at intervals sufficiently shorter than the wavelength of the control signal.

However, when air bridges are formed over the entire $\lambda/4$ lines 1103a, 1103b, 1203b and 1203a, there is a possibility that the Q-value (the Quality factor) of the quantum bit could deteriorate. One possible cause of this deterioration is a dielectric loss caused by a dielectric material such as a resist that remains when the air bridge is manufactured. A standing wave occurs in a quantum bit during the operation of the quantum bit. Since this standing wave is formed over the entire quantum bit, an electric field is also generated on the $\lambda/4$ lines during the operation of the quantum bit. Therefore, if air bridges are formed over the entire $\lambda/4$ lines 1103a, 1103b, 1203b and 1203a, an electric field generated on the $\lambda/4$ lines spreads into the inside of a dielectric material that remains near the air bridges, so that the dielectric loss in the dielectric material could cause a deterioration of the Q-value. Therefore, an example embodiment in which crosstalk can be reduced while preventing the Q-value of the quantum bit from deteriorating will be described.

First Example Embodiment

Figure 7:
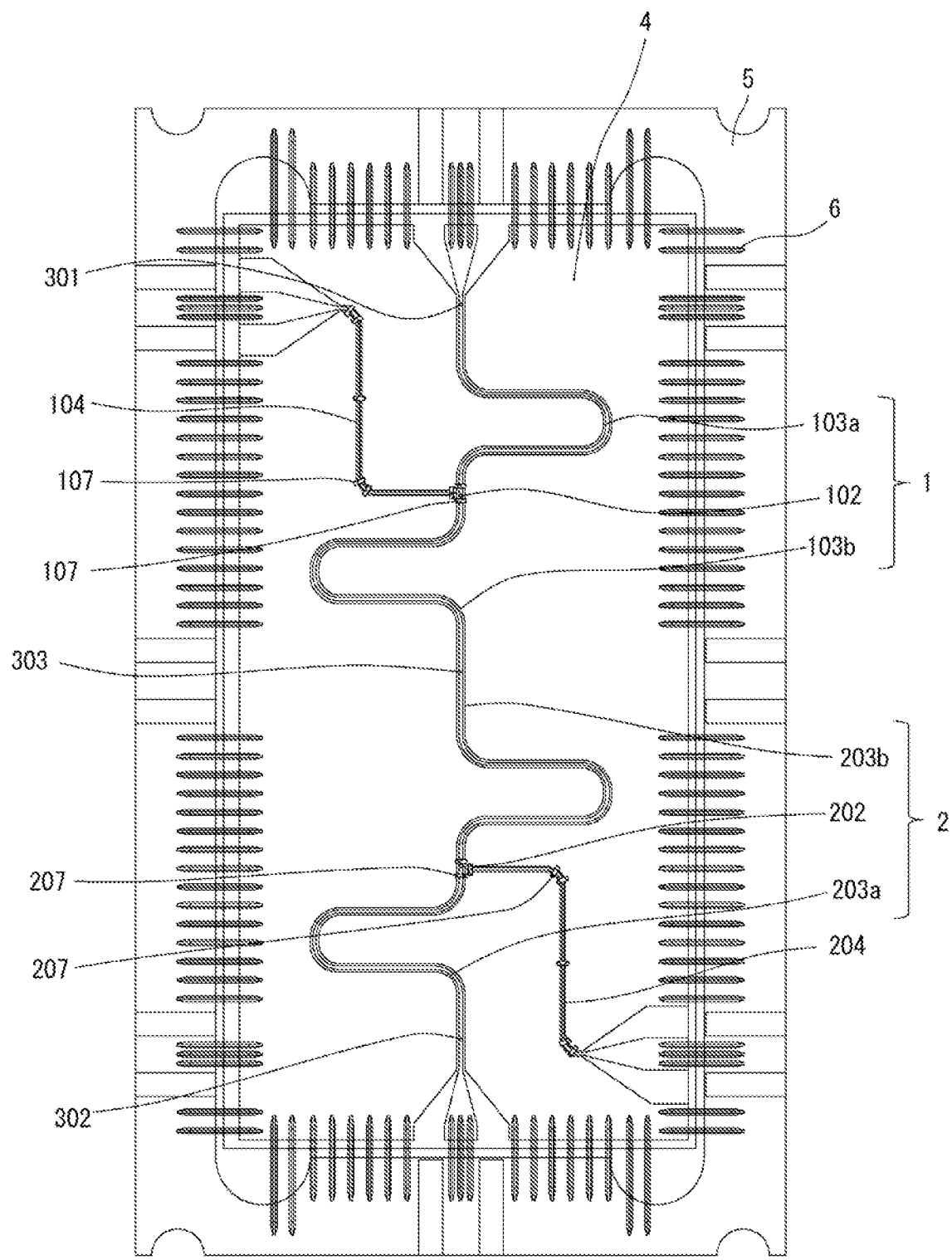
FIG. 7 shows a chip layout of a superconducting circuit according to a first example embodiment.
Figure 8:
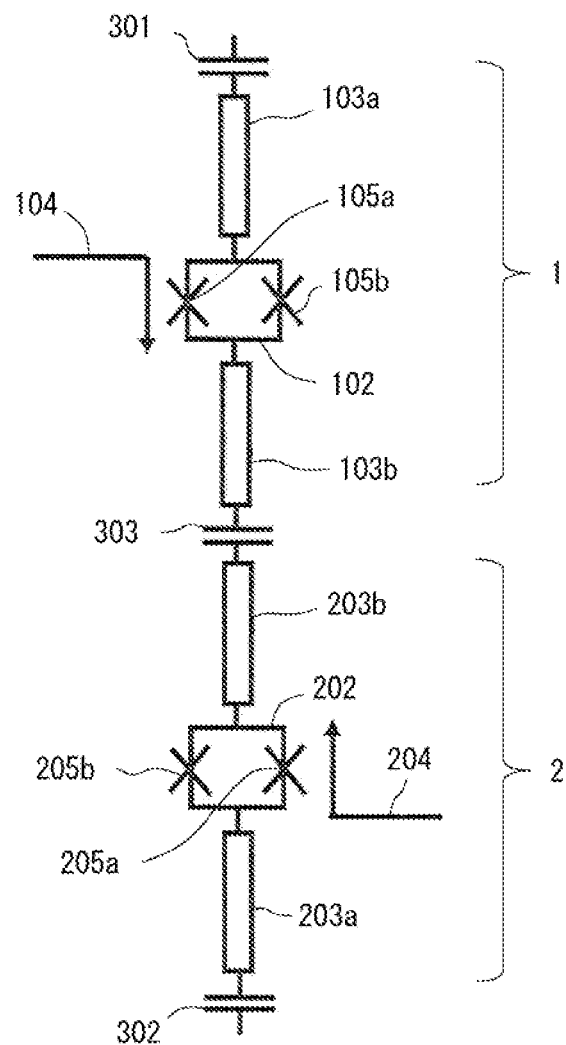
FIG. 8 shows an equivalent circuit of a superconducting circuit according to the first example embodiment.

FIG. 7 shows a chip layout of a 2-bit distributed constant-type superconducting quantum circuit in which two superconducting circuits (oscillators) each of which is one according to a first example embodiment are integrated. Since the superconducting circuit described here oscillates, it is also referred to as an oscillator. FIG. 8 shows an equivalent circuit of the 2-bit distributed constant-type superconducting quantum circuit shown in FIG. 7. The superconducting circuit according to the first example embodiment is a superconducting quantum bit, and in particular, is a first quantum bit 1 or a second quantum bit 2 in the equivalent circuit shown in FIG. 8. The 2-bit distributed constant-type superconducting quantum circuit shown in FIGS. 7 and 8 has a configuration in which the first and second quantum bits 1 and 2 are coupled through a capacitor 303. The first and second quantum bits 1 and 2 have configurations similar to each other.

The first quantum bit 1 has a configuration in which each of two distributed constant lines (transmission lines) is connected to a respective one of both ends of a SQUID 102. Each of these distributed constant lines has a length corresponding to 1/4 of a wavelength corresponding to the operating frequency (the resonance frequency) of the first quantum bit 1, so they are referred to as $\lambda/4$ lines 103a and 103b, respectively, hereinafter. When the operating frequency of the first quantum bit 1 is about 10 GHz, the length of each of the $\lambda/4$ lines 103a and 103b is about 2 to 3 mm. A control line 104 is magnetically coupled with the SQUID 102. In other words, the control line 104 and the SQUID 102 are magnetically coupled with each other by their mutual inductance in a noncontact manner. The resonance frequency of the first quantum bit 1 can be set by inputting a DC control signal thereto from the control line 104. In a state in which a DC control signal for setting the resonance frequency to a certain frequency is being input to the control line 104, it is possible to make the first quantum bit 1 oscillate by further inputting a control signal having a frequency twice the set resonance frequency to the control line 104. The operating frequency (the set resonance frequency) of the first quantum bit 1 is, for example, about 10 GHz. Therefore, when the first quantum bit 1 is operated, a signal in which a DC control signal and a high-frequency control signal having a frequency of about 20 GHz are superimposed is input to the first quantum bit 1 from the control line 104. The configuration and how to operate the second quantum bit 2 are similar to those of the first quantum bit 1, and therefore detailed descriptions thereof are omitted.

In the configuration shown in FIG. 7, the first and second quantum bits 1 and 2 are located on a chip 4 that is electrically connected to wiring lines on a printed circuit board 5 by using bonding wires 6. The second quantum bit 2 includes a SQUID 202, a $\lambda/4$ line 203a, and a $\lambda/4$ line 203b. A control line 204 is magnetically coupled with the SQUID 202. Note that one end of the $\lambda/4$ line 103a of the first quantum bit 1 is connected to one end of the SQUID 102, and the other end of the $\lambda/4$ line 103a is connected to a capacitor 301. Further, one end of the $\lambda/4$ line 103b of the first quantum bit 1 is connected to the other end of the SQUID 102, and the other end of the $\lambda/4$ line 103b is connected to the capacitor 303. Similarly, one end of the $\lambda/4$ line 203a of the second quantum bit 2 is connected to one end of the SQUID 202, and the other end of the $\lambda/4$ line 203a is connected to a capacitor 302. Further, one end of the $\lambda/4$ line 203b of the second quantum bit 2 is connected to the other end of the SQUID 202, and the other end of the $\lambda/4$ line 203b is connected to the capacitor 303.

As shown in FIG. 8, the SQUID 102 is a component in which a Josephson junction 105a and a Josephson junction 105b are connected in a loop, and both ends of the SQUID 102 are connected to the $\lambda/4$ lines 103a and 103b, respectively. Similarly, the SQUID 202 is a component in which a Josephson junction 205a and a Josephson junction 205b are connected in a loop, and both ends of the SQUID 202 are connected to the $\lambda/4$ lines 203a and 203b, respectively. Further, as will be described later, in this example embodiment, an air bridge 107 (see FIG. 7) is provided at a predetermined place for the first quantum bit 1, and an air bridge 207 (see FIG. 7) is provided in a predetermined place for the second quantum bit 2.

Figure 9:
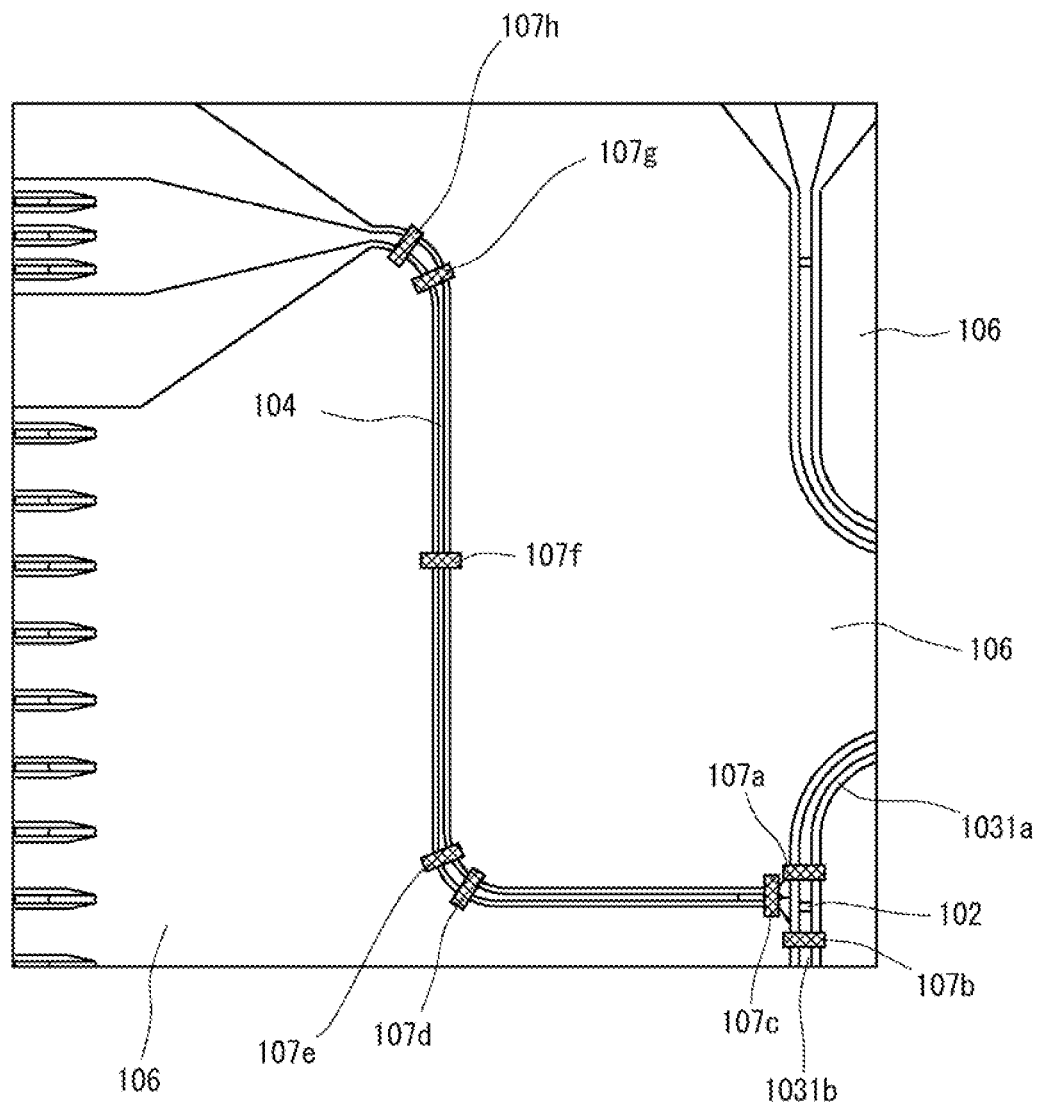
FIG. 9 is an enlarged view of a part of the chip layout of the superconducting circuit according to the first example embodiment in the vicinity of a first quantum bit thereof.
Figure 10A:
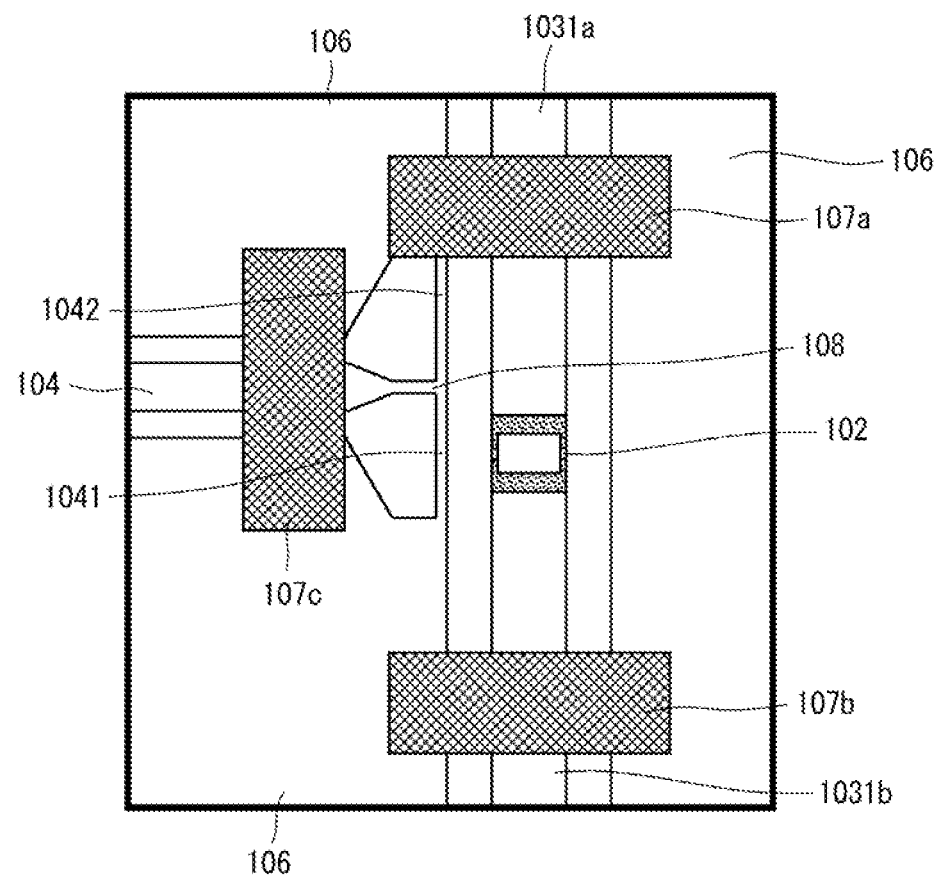
FIG. 10A is an enlarged view of a part of the chip layout of the superconducting quantum circuit according to the first example embodiment in the vicinity of a SQUID thereof.
Figure 10B:
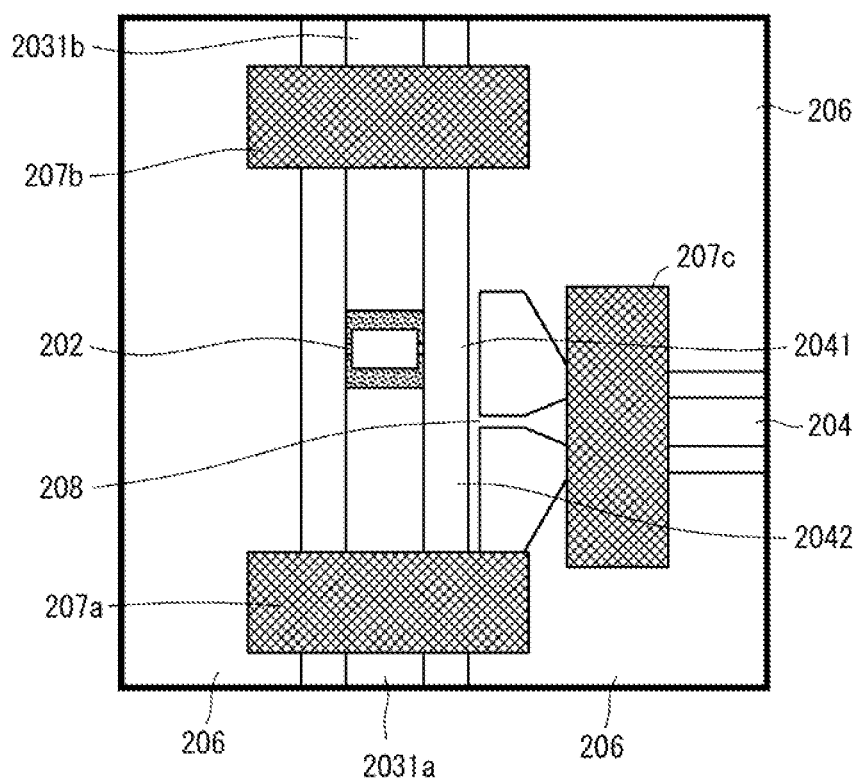
FIG. 10B is an enlarged view of a part of the chip layout of the superconducting quantum circuit according to the first example embodiment in the vicinity of the SQUID thereof.

FIG. 9 shows an enlarged view of the vicinity of the first quantum bit 1 in the chip layout shown in FIG. 7. Further, FIG. 10A shows an enlarged view of the vicinity of the SQUID 102 of the first quantum bit 1 in the chip layout shown in FIG. 7. Further, FIG. 10B shows an enlarged view of the vicinity of the SQUID 202 of the second quantum bit 2 in the chip layout shown in FIG. 7.

Only the first quantum bit 1 is described hereinafter, and the description of the second quantum bit 2, which can be described in a similar manner, is omitted. The tip of the control line 104 separates, at a branch point 108, into a first branch line 1041 and a second branch line 1042, of which the first branch line 1041 is laid out near the SQUID 102 so that it magnetically couples with the SQUID 102. Meanwhile, the second branch line 1042 is laid out away from SQUID 102 so that it does not magnetically couple with the SQUID 102. Specifically, in order to make the first branch line 1041 magnetically couple with the SQUID 102 while preventing the second branch line 1042 from magnetically coupling with the SQUID 102, the first branch line 1041 is wired (e.g., routed) along the SQUID 102, and the second branch line 1042 is wired in the direction opposite to the direction in which the first branch line 1041 is wired.

The control line 104 and the $\lambda/4$ lines 103a and 103b are formed as a coplanar waveguide. A GND plane 106 is located around the lines formed as the coplanar waveguide. The first and second branch lines 1041 and 1042 are both connected to this GND plane 106.

Note that, in the drawings, a symbol 1031a represents a core line of the $\lambda/4$ line 103a, and a symbol 1031b represents a core line of the $\lambda/4$ line 103b. Further, a symbol 2031a represents a core line of the $\lambda/4$ line 203a, and a symbol 2031b represents a core line of the $\lambda/4$ line 203b. Further, symbols 2041 and 2042 represent first and second branch lines, respectively, of the control line 204, and a symbol 208 represents a branch point thereof. Further, a symbol 206 represents a GND plane.

The difference between the superconducting quantum bit according to the first example embodiment and the superconducting quantum bit described above with reference to FIGS. 3A and 3B lies in their layouts. Specifically, the arrangement of air bridges in the superconducting quantum bit according to the first example embodiment differs from that in the superconducting quantum bit described above with reference to FIGS. 3A and 3B. As shown in FIGS. 9 and 10A, in the first quantum bit 1 according to the first example embodiment, air bridges 107A and 107B are provided, on the $\lambda/4$ lines 103A and 103B, only in the vicinity of a node of the electric field of a standing wave that is generated in the quantum bit during the operation of the quantum bit. That is, for the $\lambda/4$ lines 103a and 103b, the air bridges 107a and 107b are provided only in the vicinity of the node of the electric field of the standing wave that is generated when the superconducting quantum bit (the oscillator) is oscillating. In other words, on the $\lambda/4$ lines 103a and 103b, the air bridges 107a and 107b are provided only in the vicinity of the parts of the $\lambda/4$ lines 103a and 103b at which they are connected to the SQUID 102 (hereinafter also referred to as connection parts with the SQUID 102). In yet other words, on the $\lambda/4$ lines 103a and 103b, the air bridges 107a and 107b are provided only in the vicinity of the parts of the $\lambda/4$ lines 103a and 103b that are furthest from the parts thereof at which they are connected to the capacitors 301 and 303 (hereinafter also referred to as connection parts with the capacitors 301 and 303). Specifically, on the $\lambda/4$ lines 103a and 103b, the air bridges 107a and 107b are preferably provided only at places that are as close as possible to the connection parts with the SQUID 102. For example, on the $\lambda/4$ lines 103a and 103b, the air bridges 107a and 107b are preferably provided only at places $1/20$ or less of the length of the $\lambda/4$ line 103a or 103b from the connection parts with the SQUID 102. More preferably, on the $\lambda/4$ lines 103a and 103b, the air bridges 107a and 107b are provided only at places $1/30$ or less of the length of the $\lambda/4$ line 103a or 103b from the connection parts with the SQUID 102. In the example shown in FIGS. 9 and 10A, on the $\lambda/4$ lines 103a and 103b, the air bridges 107a and 107b are provided only at places about 60 μm from the connection parts with the SQUID 102 (i.e., only at places on the $\lambda/4$ lines 103a and 103b that are at a distance of about $1/30$ of the length of the $\lambda/4$ line 103a or 103b from the connection parts with the SQUID 102).

In this example embodiment, the length of the air bridge, i.e., the length from the part where one end of the air bridge is connected to the GND plane to the part where the other end of the air bridge is connected to the GND plane, is preferably as short as possible. Specifically, the length of the air bridge is preferably equal to or shorter than $1/10$ of the wavelength of a high-frequency control signal input from the control line on the chip, more preferably equal to or shorter than 1/30 thereof, and even more preferably equal to or shorter than 1/50 thereof. For example, when the frequency of the control signal is 20 GHz, the wavelength of the control signal on the chip is about 5.9 mm. Therefore, in this case, the length of the air bridge is preferably equal to or shorter than 590 μm, more preferably equal to or shorter than 196 μm, and even more preferably equal to or shorter than 118 μm.

Note that the above-described preferred lengths of the air bridge also apply to all the example embodiments described in this specification other than the first example embodiment, and to all the modified examples thereof described in this specification. Note that, in this example embodiment, the length of the air bridge was set to 62 μm. This length is about 1/95 of the wavelength of the control signal having a frequency of 20 GHz on the chip. The length of the air bridge was also set to 62 μm in all the example embodiments described in this specification other than the first example embodiment and all the modified examples thereof.

The standing wave generated in the first quantum bit 1 during the operation of the first quantum bit 1 forms antinodes of the electric field, on the λ/4 lines 103a and 103b, near the connection parts with the capacitors 301 and 303, and forms a node of the electric field, on the λ/4 lines 103a and 103b, near the connection parts with the SQUID 102. In other words, on the λ/4 lines 103a and 103b, the amplitude of the electric field is the largest near the connection parts with the capacitors 301 and 303, and the amplitude of the electric field decreases as the distance from the capacitors 301 and 303 increases. Further, the amplitude of the electric field is the smallest near the connection parts with the SQUID 102. In the first example embodiment, the air bridges 107a and 107b are provided, on the λ/4 lines, only in the vicinity of the node of the electric field of the standing wave, i.e., in the vicinity of the place where the electric field is the weakest. In this way, most of the components of the electric field of the standing wave that is generated in the first quantum bit 1 during the operation of the first quantum bit 1 are far from the air bridges 107a and 107b. Therefore, even in the case where a dielectric material such as a resist remains in the air bridges 107a and 107b, it is possible to reduce the electric field that spreads into the residue as much as possible. Therefore, it is possible to reduce the dielectric loss, and as a result, to prevent the Q-value of the first quantum bit 1 from deteriorating. Note that although it is not described, air bridges 207a and 207b are arranged in the second quantum bit 2 in a manner similar to that of the first quantum bit 1.

As shown in FIG. 9, in the superconducting circuit according to the first example embodiment, in addition to the air bridges 107a and 107b provided on the λ/4 lines, air bridges 107c to 107h are also provided at arbitrary places on the control line 104. Since the control line 104, which extends in a direction different from the direction of the λ/4 lines 103a and 103b, is far from the λ/4 lines 103a and 103b, the provision of the air bridges 107c to 107h on the control line 104 does not directly affect the Q-value of the first quantum bit 1. In other words, the disposition of the air bridges 107c to 107h on the control line 104 does not cause a deterioration of the Q-value of the first quantum bit 1. Note that, more specifically, the air bridges 107c to 107h are provided in the non-branched part of the control line 104 other than the first and second branch lines 1041 and 1042 thereof. In this example embodiment, an air bridge 207c and the like are provided on the control line 204 of the second quantum bit 2 in a similar manner.

Figure 11:
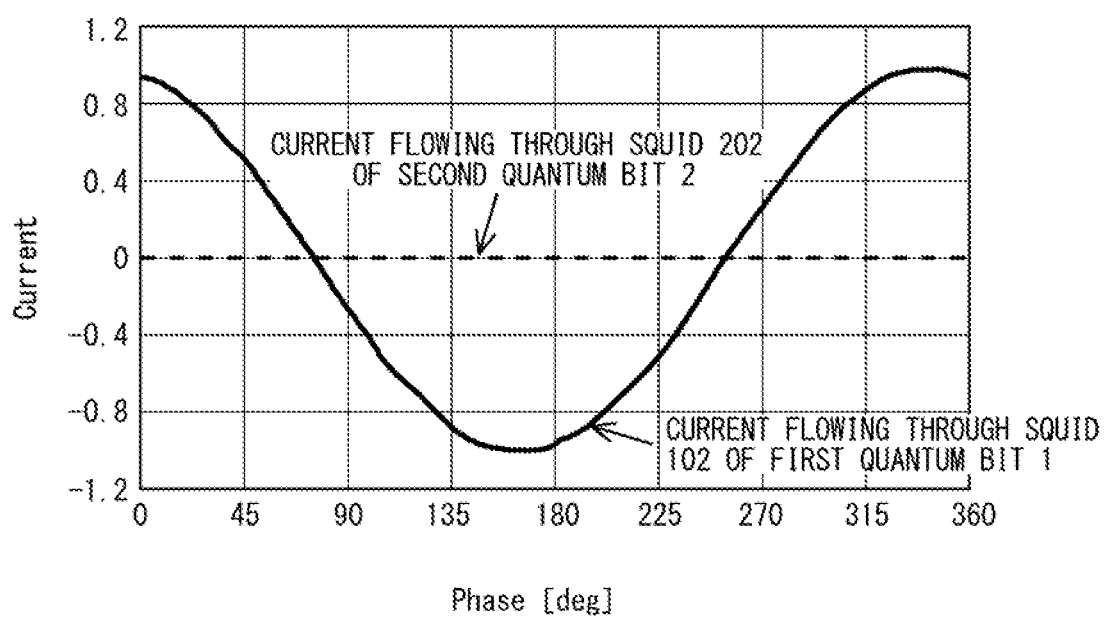
FIG. 11 is a graph showing a result of a simulation in which a control signal having a frequency of 20 GHz is input to a first quantum bit from a control line of the first quantum bit in the superconducting circuit according to the first example embodiment.

As described above, in this example embodiment, the air bridges 107a, 107b, 207a and 207b are provided only in the vicinity of the node of the electric field on the λ/4 lines 103a, 103b, 203a and 203b. In this way, it is possible to reduce high-frequency crosstalk while preventing the Q-values of the first and second quantum bits 1 and 2 from deteriorating. Results of simulations will be described hereinafter. FIG. 11 shows a result of a simulation in which a control signal having a frequency of 20 GHz is input to the first quantum bit 1 from the control line 104 thereof in the configuration according to the first example embodiment. As shown in FIG. 11, the current flowing through the SQUID 202 of the second quantum bit 2 was equal to or smaller than 1% of the current flowing through the SQUID 102 of the first quantum bit 1. This means that the use of the superconducting circuit according to the first example embodiment provides an advantageous effect that the high-frequency crosstalk can be reduced while preventing the Q-value of the quantum bit from deteriorating.

Note that the above-described superconducting circuit, i.e., the oscillator, can also be expressed as follows. The oscillator includes a SQUID, transmission lines (distributed constant lines) connected to the SQUID, a GND plane, and a connection circuit. Note that the connection circuit is a circuit that connects parts of the GND plane located on both sides of the transmission line to each other, and the above-described air bridge that connects parts of the GND plane across the transmission line correspond to this connection circuit. Further, this connection circuit is disposed in a place corresponding to the vicinity of the node of the electric field of a standing wave that is generated when the oscillator is oscillating. According to the above-described configuration, it is possible to reduce the crosstalk while preventing the Q-value of the quantum bit from deteriorating. Note that a connection circuit (an air bridge) may also be provided for the control line, which magnetically couples with the SQUID and to which a control signal is input, in order to reduce the crosstalk. That is, the oscillator may further include a connection circuit that connects parts of the GND plane located on both sides of the control line to each other (a circuit that connects parts of the GND plane across the control line, such as the air bridge 107c).

Second Example Embodiment

Figure 12:
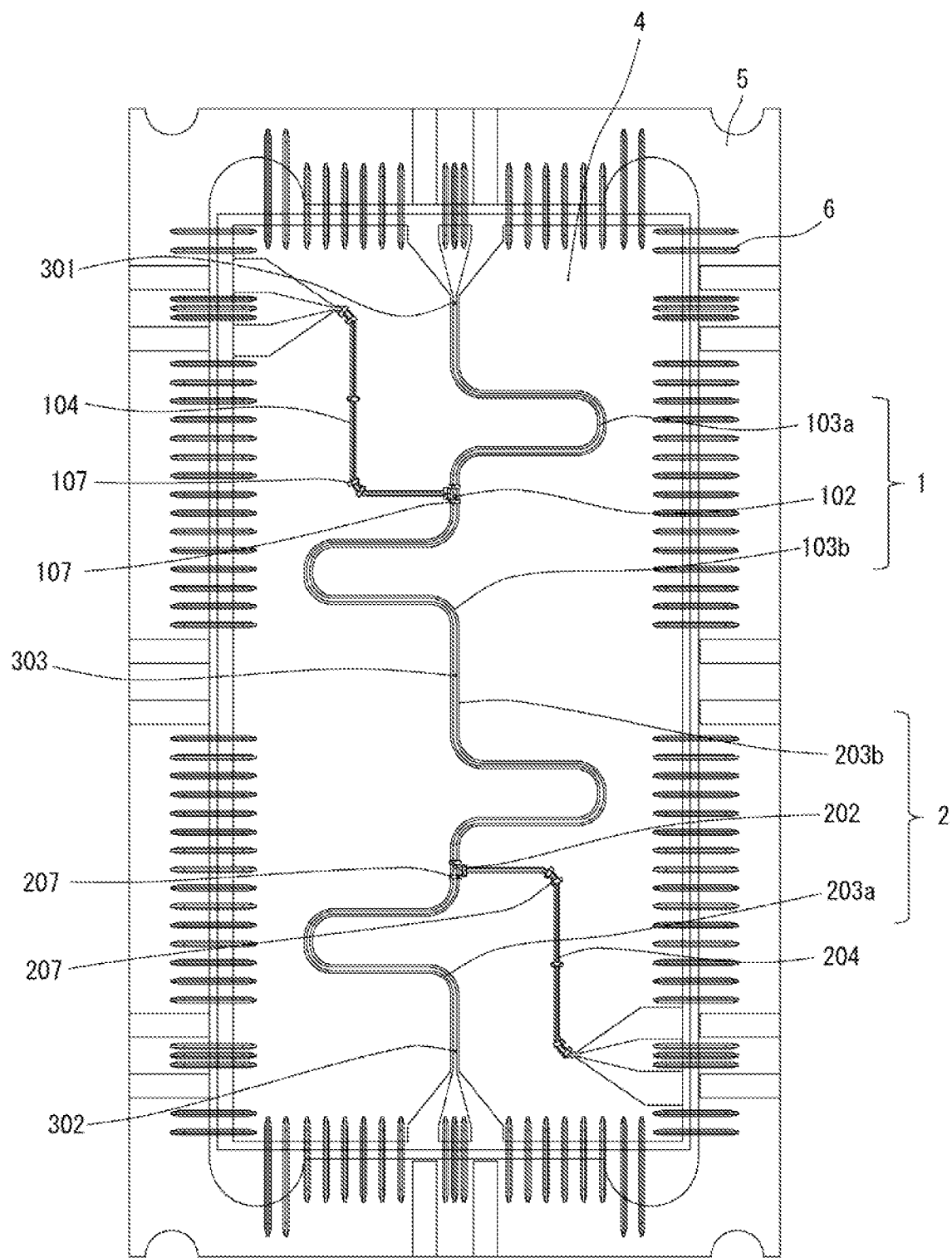
FIG. 12 shows a chip layout of a superconducting circuit according to a second example embodiment.

Next, a second example embodiment will be described. Note that descriptions of the components similar to those in the first example embodiment are omitted as appropriate. FIG. 12 shows a chip layout of a 2-bit distributed constant-type superconducting quantum circuit, in which two superconducting circuits (oscillators) each of which is one according to a second example embodiment are integrated. The configuration in the vicinity of the SQUIDs 102 and 202 in the chip layout shown in FIG. 12 differs from that in the first example embodiment. This difference will be described later by using an enlarged view. The superconducting circuit according to the second example embodiment is a superconducting quantum bit, and its equivalent circuit is similar to that shown in FIG. 8, so the description of the equivalent circuit is omitted here. The chip layout shown in FIG. 12 is one that is obtained by laying out, on a chip, a 2-bit distributed constant-type superconducting quantum circuit formed by coupling two quantum bits according to the second example embodiment with each other through a capacitor 303.

Figure 13:
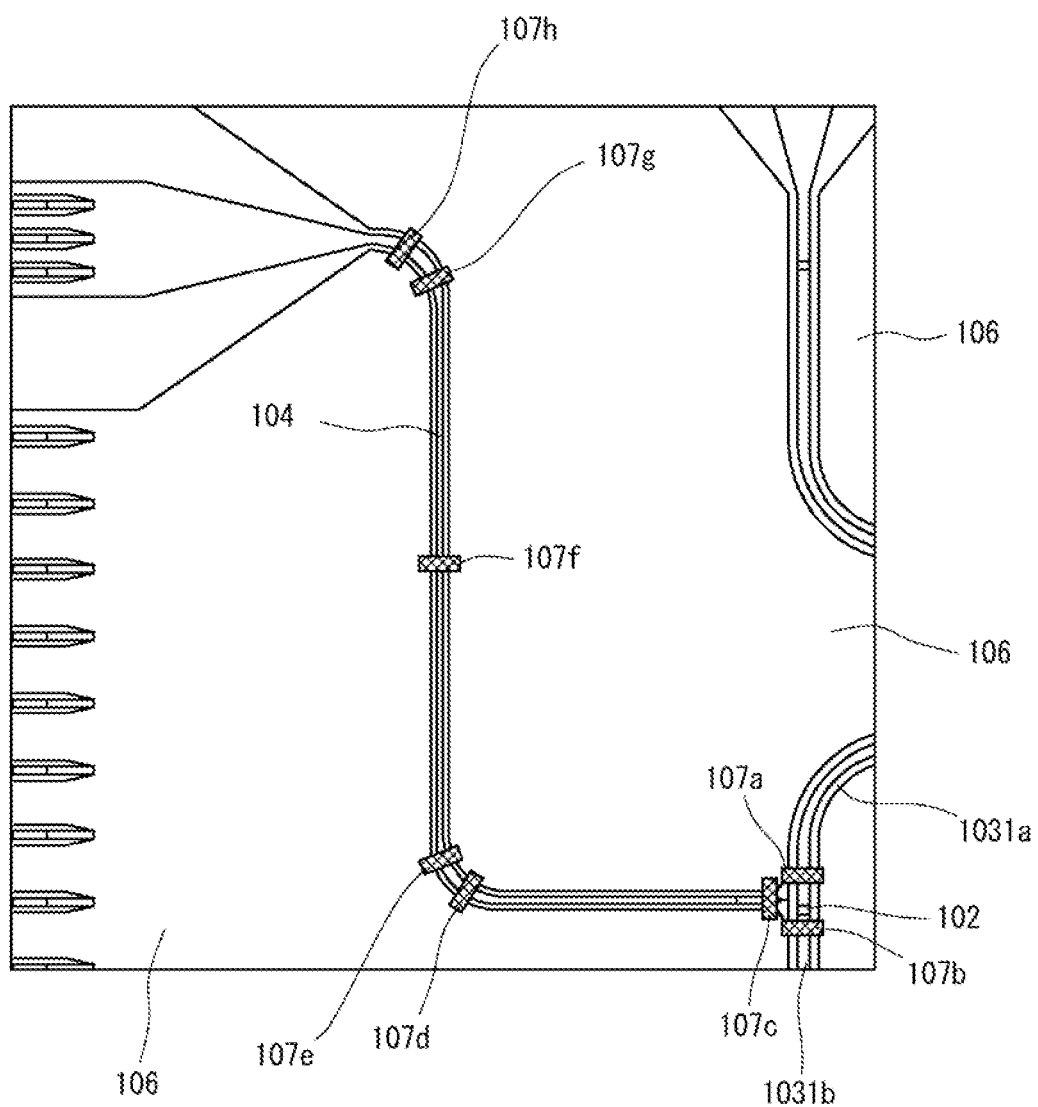
FIG. 13 is an enlarged view of the chip layout of the superconducting circuit according to the second example embodiment in the vicinity of a first quantum bit thereof.
Figure 14:
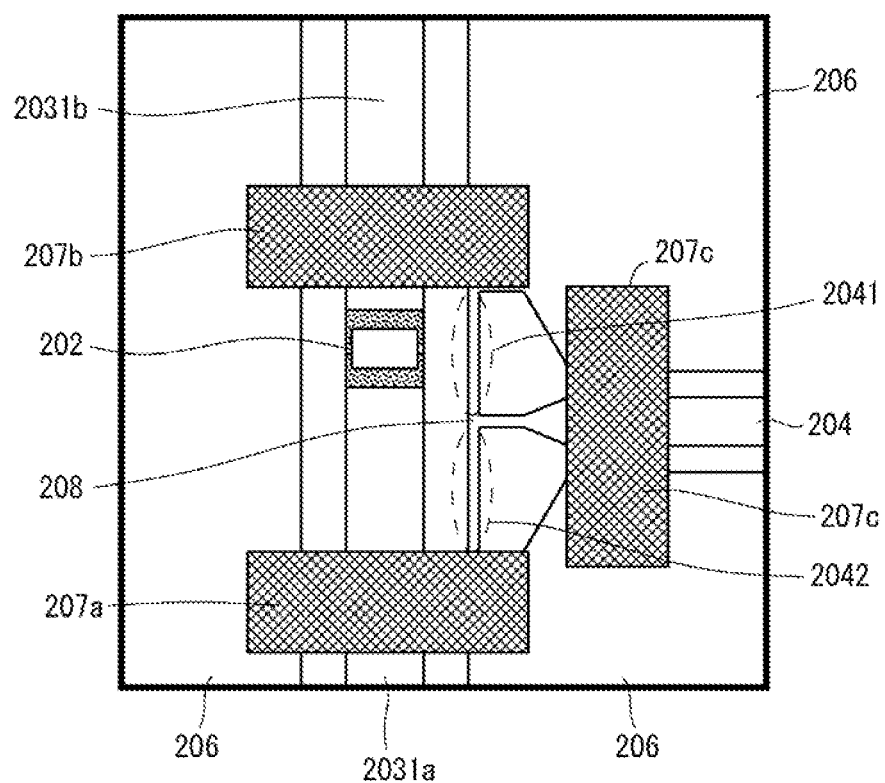
FIG. 14 is an enlarged view of the chip layout of the superconducting circuit according to the second example embodiment in the vicinity of a SQUID of a second quantum bit thereof.

The difference between the superconducting quantum bit according to the second example embodiment and that according to the first example embodiment lies in the arrangement of air bridges. FIG. 13 shows an enlarged view of the vicinity of the first quantum bit 1 in the chip layout shown in FIG. 12. As shown in FIG. 13, similarly to the first example embodiment, in the superconducting circuit according to the second example embodiment, air bridges 107a and 107b are provided, on the λ/4 lines 103a and 103b, only at places that are as close as possible to the connection parts with the SQUID 102, and air bridges 107c to 107h are also provided for the control line 104. However, the second example embodiment differs from the first example embodiment because a certain restriction is imposed on the positions of the air bridges 107a and 107b provided on the λ/4 lines 103a and 103b. This restriction will be described hereinafter. FIG. 14 shows an enlarged view of the vicinity of the SQUID 202 of the second quantum bit 2 in the chip layout shown in FIG. 12. Note that the positions of the air bridges 107a and 107b for the first quantum bit 1 are similar to those of the air bridges 207a and 207b for the second quantum bit 2.

Although the air bridges 207a and 207b provided in the first example embodiment do not have to be disposed at equal distances from the branch point 208 of the control line 204 as shown in FIG. 10B. In contrast, in the second example embodiment, as shown in FIG. 14, the air bridges 207a and 207b are provided at equal distances from the branch point 208 of the control line 204. In other words, the air bridges 207a and 207b are provided at the ends of the first and second branch lines 2041 and 2042, respectively, which have lengths equal to each other, i.e., at places on the first and second branch lines 2041 and 2042, respectively, at which they are connected to the ground, i.e., to the GND plane 206. Specifically, as shown in FIG. 14, in the second example embodiment, the air bridges 207a and 207b are provided, on the λ/4 lines 203a and 203b, at two places that are at equal distances from the branch point 208 of the control line 204. Note that they are at equal distances only in ideal cases, and in practice, the term "equal distances" includes manufacturing errors equal to or smaller than ±10%. That is, the difference between their distances may be equal to or smaller than 10% of the length of either one of them. As described above, in this example embodiment, it is sufficient if the air bridges 207a and 207b are provided at roughly equal distances from the branch point 208. In the first example embodiment, it is specified only that the air bridges 207a and 207b, which are provided in the vicinity of the connection parts with the SQUID 202 on the λ/4 lines 203a and 203b, should be provided as close as possible to the SQUID 202. Therefore, as shown in FIG. 10B, the positions of the two air bridges 207a and 207b in the vicinity of the connection parts with the SQUID 202 on the λ/4 lines 203a and 203b do not necessarily have to be at equal distances from the branch point 208 of the control line 204. The above-described point is the difference between the first and second example embodiments.

Note that the first and second branch lines 2041 and 2042 are arranged so that the amounts of the currents flowing through the first and second branch lines 2041 and 2042 are equal to each other and these currents flow in directions opposite to each other. Specifically, as shown in the drawing, the first and second branch lines 2041 and 2042 have configurations symmetrical to each other in the left/right direction. The first branch line 2041 is wired (i.e., routed) along the SQUID 202, and the second branch line 2042 is wired in the direction opposite to that of the first branch line 2041. Therefore, they are configured so that the first branch line 2041 magnetically couples with the SQUID 202 while the second branch line 2042 does not magnetically couple with the SQUID 202. More specifically, for example, as shown in FIG. 14, the control line 204 is a T-shaped line, and the first and second branch lines 2041 and 2042, which separate at the branch point 208, are arranged in a straight line (i.e., aligned with each other). That is, the angle between the first branch line 2041 and the non-branched part of the control line 204 is 90 degrees, and the angle between the second branch line 2042 and the non-branched part of the control line 204 is 90 degrees. Further the angle between the first and second branch lines 2041 and 2042 is 180 degrees. These angles are values in ideal cases, and in practice, they include manufacturing errors equal to or smaller than ±10% of these ideal angles.

Note that the positional relationship among the SQUID 202, the λ/4 lines 203a and 203b, and the control line 204 is, for example, as shown in FIG. 14 and will be described hereinafter. The λ/4 lines 203a and 203b and the SQUID 202 are arranged in a first direction (the up/down direction in the drawing) in the vicinity of the SQUID 202. Further, the first and second branch lines 2041 and 2042 are also wired in this first direction (the up/down direction in the drawing). Note that the non-branched part of the control line 204 extends in a second direction (the left/right direction in the drawing) in the vicinity of the SQUID 202, and extends from the branch point 208 so as to recede from the SQUID 202. That is, the non-branched part of the control line 204 is wired on the side of the branch point 208 opposite to the side thereof on which the SQUID 202 is located. The first branch line 2041 is located so as to be opposed to the SQUID 202, while the second branch line 2042 is located so as to be not opposed to the SQUID 202.

Figure 15:
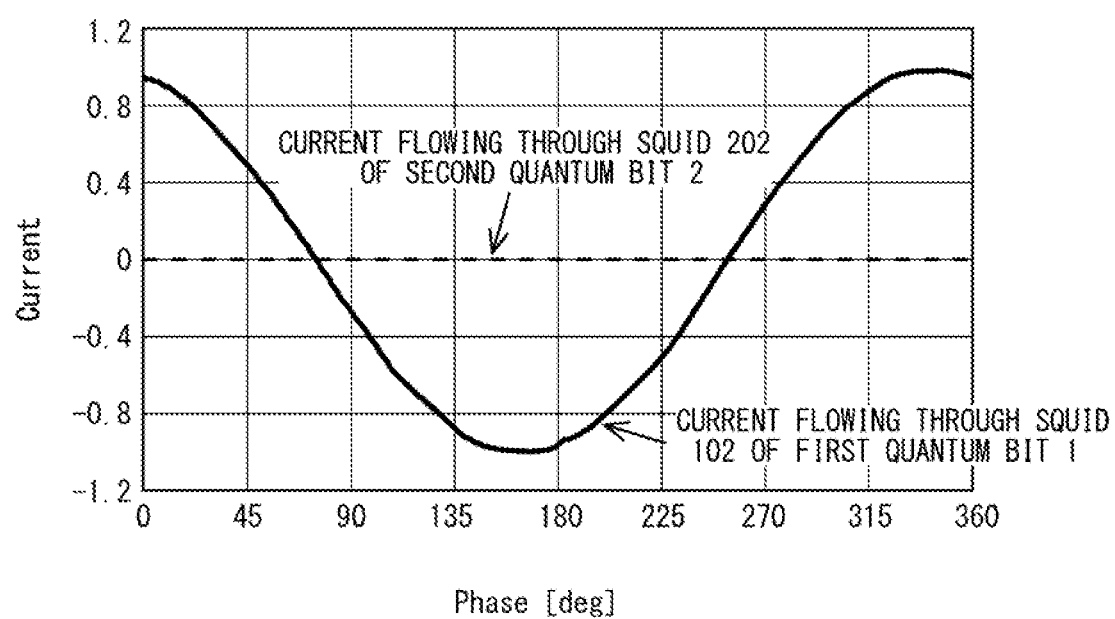
FIG. 15 is a graph showing a result of a simulation in which a control signal having a frequency of 20 GHz is input to a first quantum bit from a control line of the first quantum bit in a superconducting circuit according to the second example embodiment.

The aim of the above-described configuration in the second example embodiment will be described later. Firstly, FIG. 15 shows a result of a simulation in which a control signal having a frequency of 20 GHz is input to the first quantum bit 1 from the control line 104 thereof in the second example embodiment. As shown in FIG. 15, when a high-frequency control signal having a frequency of 20 GHz is input from the control line 104 of the first quantum bit 1, the current flowing through the SQUID 202 of the second quantum bit 2 is equal to or smaller than 1% of the current flowing through the SQUID 102 of the first quantum bit 1. That is, it can be understood that high-frequency crosstalk can also be significantly reduced in the second example embodiment as in the case of the first example embodiment. This means that, similarly to the first example embodiment, the second example embodiment provides an advantageous effect that the high-frequency crosstalk can be reduced while preventing the Q-value of the quantum bit from deteriorating.

[Regarding Additional Advantage Effect of Second Example Embodiment]

Next, the aim of the second example embodiment will be described. The means for reducing crosstalk when a high-frequency control signal such as a control signal having a frequency of 20 GHz is input from the control line has been described so far. However, in experiments, crosstalk is also observed when a DC control signal is input from the control line. It is considered that this phenomenon is caused because, for example, the SQUID 202 of the second quantum bit 2 senses (i.e., is affected by) a magnetic field that is generated when the DC control signal flows through the GND plane after flowing through the control line 104 of the first quantum bit 1. That is, it is considered that the mechanism due to which crosstalk is caused (in other words, the path and the way of the propagation of the current that causes crosstalk) differs from the mechanism due to which the high-frequency crosstalk propagating along the λ/4 line is caused described above. The second example embodiment is an example embodiment for reducing not only the high-frequency crosstalk described above, but also DC crosstalk (more precisely, crosstalk that is caused as a current flows through the GND plane). This example embodiment will be described hereinafter in detail.

Figure 16A:
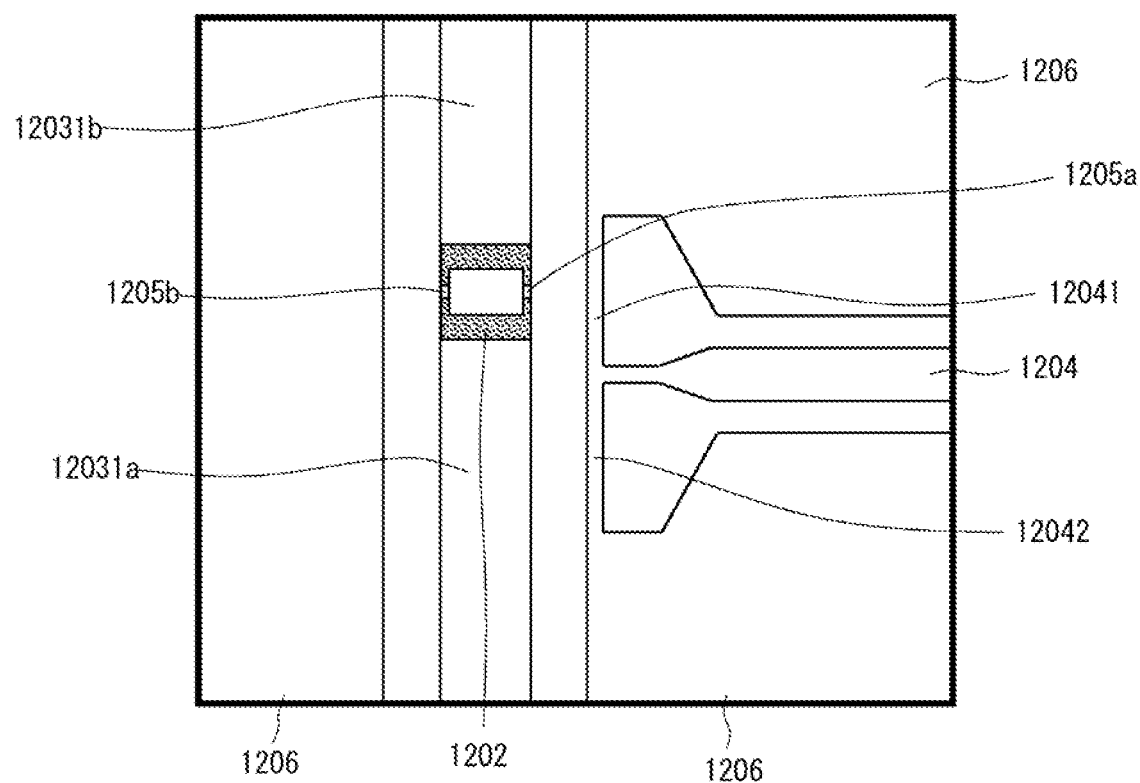
FIG. 16A shows a layout of a second quantum bit in the quantum circuit shown in FIG. 1.
Figure 16B:
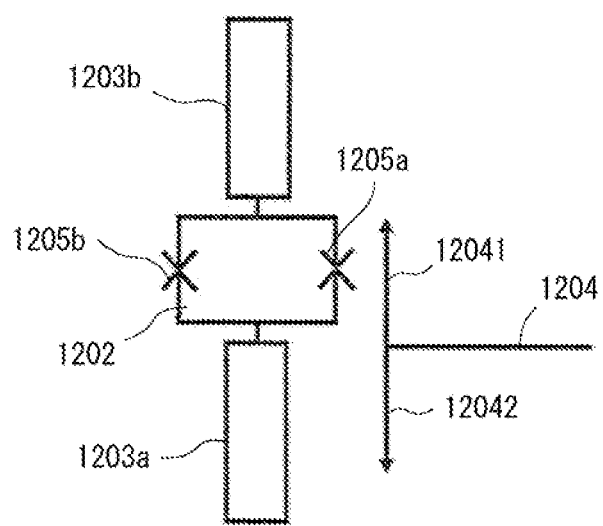
FIG. 16B shows an equivalent circuit of the second quantum bit in the quantum circuit shown in FIG. 1.
Figure 16C:
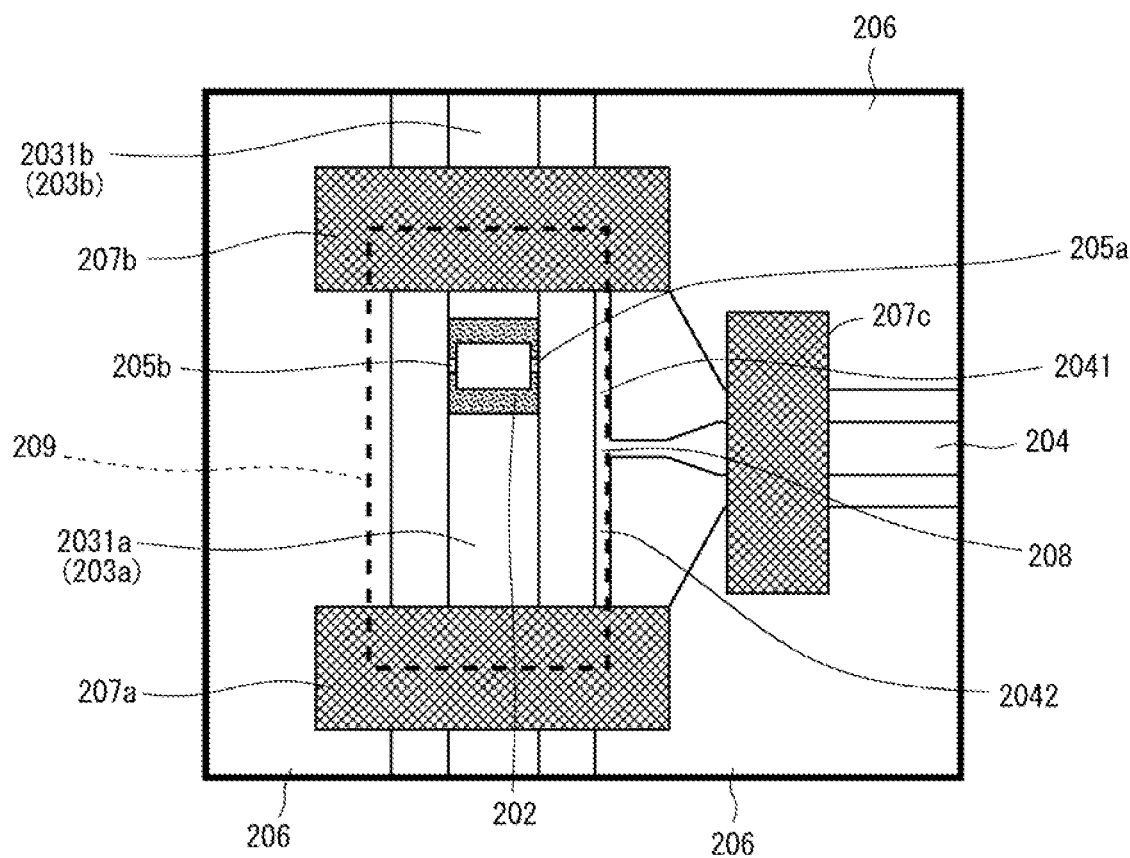
FIG. 16C shows a layout of a second quantum bit in the second example embodiment.
Figure 16D:
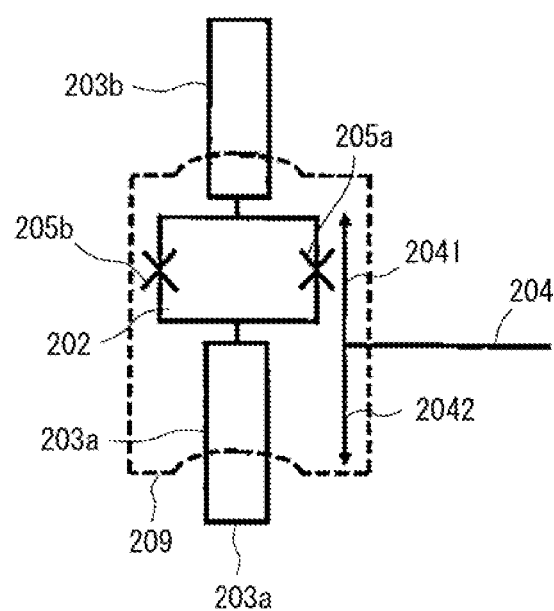
FIG. 16D shows an equivalent circuit of the second quantum bit in the second example embodiment.

FIG. 16A shows a layout of the second quantum bit 1002 in the quantum circuit shown in FIG. 1, i.e., the second quantum bit 1002 in which no air bridge is provided, and FIG. 16B shows its equivalent circuit. Further, FIG. 16C shows a layout of a second quantum bit 2 according to the second example embodiment, and FIG. 16D shows its equivalent circuit. As shown in FIGS. 16C and 16D, in the second example embodiment, air bridges 207a and 207b are disposed in the vicinity of the connection parts with the SQUID 202 on the λ/4 lines 203a and 203b so that they are equal distances from the branch point 208 of the control line 204. In this way, a superconducting loop 209 (a loop circuit indicated by dotted lines in FIGS. 16C and 16D) expressed as "a GND plane 206-an air bridge 207a-the GND plane 206-a second branch line 2042-a first branch line 2041-the GND plane 206-an air bridge 207b-the GND plane 206" is formed so as to surround the outside of the SQUID 202. That is, the superconducting loop 209 is a circuit made of a superconductor using the GND plane 206, the air bridges 207a and 207b, and the first and second branch lines 2041 and 2042. Note that the superconducting loop is also referred to as a superconducting loop circuit. As described above, the first and second branch lines 2041 and 2042 of the control line 204 are disposed on the superconducting loop 209. One of the properties unique to superconductivity is that a magnetic flux that passes through the inside of a superconducting loop must be conserved. The second example embodiment uses this property unique to superconductivity. Note that although it is not specifically restricted in the first example embodiment, the air bridges 207a and 207b, the GND plane 206, and the control line 204 for the second quantum bit 2 are made of a superconductor in this example embodiment as described above. This restriction also applies to the first quantum bit 1.

Figure 17A:
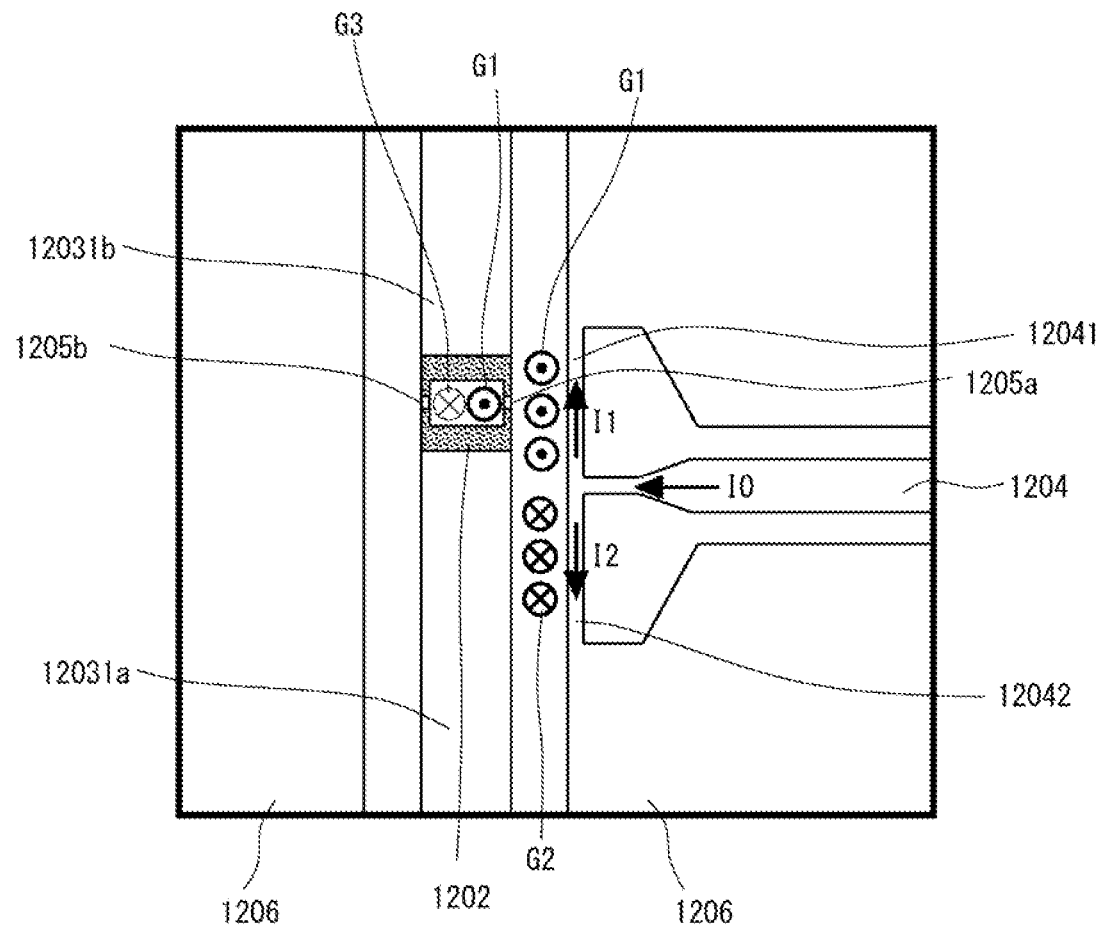
FIG. 17A is a diagram for explaining an operation for setting a resonance frequency of a second quantum bit for which no air bridge is provided.
Figure 17B:
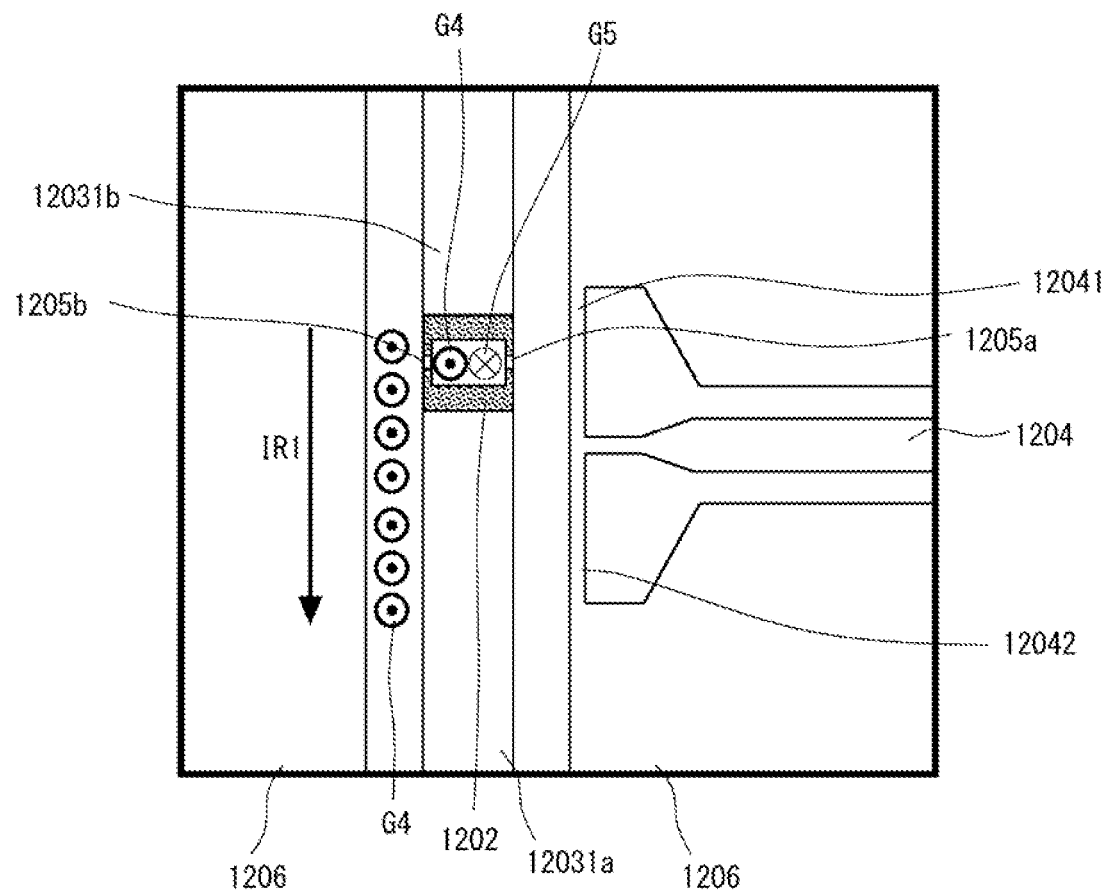
FIG. 17B is a diagram for explaining an operation of the second quantum bit for which no air bridge is provided when a DC current causing crosstalk is flowing in a GND plane.

FIGS. 17A and 17B are diagrams for explaining operations (i.e., behaviors) performed by the second quantum bit 1002 in which no air bridge is provided. FIG. 17A is a diagram for explaining an operation of the second quantum bit 1002 when the resonance frequency thereof is set, and FIG. 17B is a diagram for explaining an operation of the second quantum bit 1002 when a DC current, which causes crosstalk, is flowing through the GND plane 1206.

Firstly, referring to FIG. 17A, in the case of the quantum bit 1002 in which no air bridge is provided, the control of the resonance frequency of the quantum bit 1002 is performed as follows. That is, when a DC control current (a control signal) I0 is input from the control line 1204, the current I0 is divided into currents I1 and I2 that flow the first and second branch lines 12041 and 12042, respectively. As a result, a part of a magnetic flux G1 generated by the current I1 passes through the loop of the SQUID 1202. One of the properties unique to a SQUID is that a magnetic flux that passes through the loop of the SQUID must be an integral multiple of the flux quantum. Therefore, when the part of the magnetic flux G1 generated by the current I1 that passes through the loop of the SQUID 1202 is not exactly an integral multiple of the flux quantum, a circulating current flows through the SQUID 1202 so that the total magnetic flux that passes through the loop of the SQUID 1202 becomes an integral multiple of the flux quantum. The magnetic flux generated by this circulating current is indicated by a symbol G3 in the drawing. Note that the symbol G2 represents a magnetic flux generated by the current I2. On the other hand, when the part of the magnetic flux G1 generated by the current I1 that passes through the loop of the SQUID 1202 is exactly an integral multiple of the flux quantum, no circulating current flows through the SQUID 1202. As the amount and the direction of the control current I0 are changed, the amount and the direction of the current I1 are also changed, so that it is possible to change the magnitude and the direction of the part of the magnetic flux G1 generated by the current I1 that passes through the loop of the SQUID 1202, and thereby to change the amount and the direction of the circulating current flowing through the SQUID 1202. In this way, it is possible to control the amount and the direction of the circulating current flowing through the SQUID 1202, i.e., the current flowing through the Josephson junctions 1205a and 1205b, by controlling the amount and the direction of the control current I0. The equivalent inductance of a Josephson junction can be controlled by the amount of the current flowing through the Josephson junction. Therefore, it is possible to control the equivalent inductances of the Josephson junctions 1205a and 1205b by changing the amount and the direction of the control current I0. Therefore, it is possible to control the effective inductance of the SQUID 1202, and thereby to control the resonance frequency of the second quantum bit 1002. That is, the total inductance of the second quantum bit 1002, which is composed of the SQUID 1202 and the λ/4 lines 1203a and 1203b, can be changed by changing the effective inductance of the SQUID 1202. Therefore, it is possible to change the resonance frequency of the second quantum bit 1002. Meanwhile, since the current I2 and the SQUID 1202 are far from each other, the magnetic flux G2 generated by the current I2 hardly passes through the loop of the SQUID 1202. Note that since a superconductor has a property called perfect diamagnetism, no magnetic field can pass through the superconductor. Therefore, a magnetic field can pass through only places where no superconductor is present. Therefore, the magnetic flux G2 generated by the current I2 mainly passes through the gap between the core lines 12031a and 12031b of the λ/4 lines 1203a and 1203b and the GND plane 1206, so that the magnetic flux G2 generated by the current I2 does not affect the SQUID 1202 at all. The operations (i.e., behaviors) described so far are exactly the intended operations (i.e., behaviors).

Further, referring to FIG. 17B, a case where a DC current, which causes crosstalk, is flowing through the GND plane 1206 in the second quantum bit 1002 in which no air bridge provided will be examined. For this examination, for example, it is assumed that, in the 2-bit distributed constant-type quantum circuit shown in FIG. 1, the DC control current input to the first quantum bit 1001 flows from the control line 1104 to the GND plane 1106 and then to the GND plane 1206. When a DC current IR1, which causes crosstalk, is flowing in the GND plane 1206 as shown in FIG. 17B, a part of a magnetic flux G4 generated by the current IR1 passes through the loop of the SQUID 1202. Since a circulating current flows through the SQUID 1202 according to the magnitude and the direction of the magnetic flux that passes through the loop of the SQUID 1202 as described above, a current flows through Josephson junctions 1205a and 1205b. As a result, the effective inductance of the SQUID 1202 is changed due to the current IR1, and because of this change, the resonance frequency of the second quantum bit 1002 is changed. The above-described phenomenon is the mechanism due to which the DC crosstalk is caused. Such DC crosstalk can be observed in the second quantum bit 1002 when a DC control current is input to the first quantum bit 1001, and are also observed in experiments. Note that, in FIG. 17B, the magnetic flux generated by the circulating current is indicated by a symbol G5.

Figure 18A:
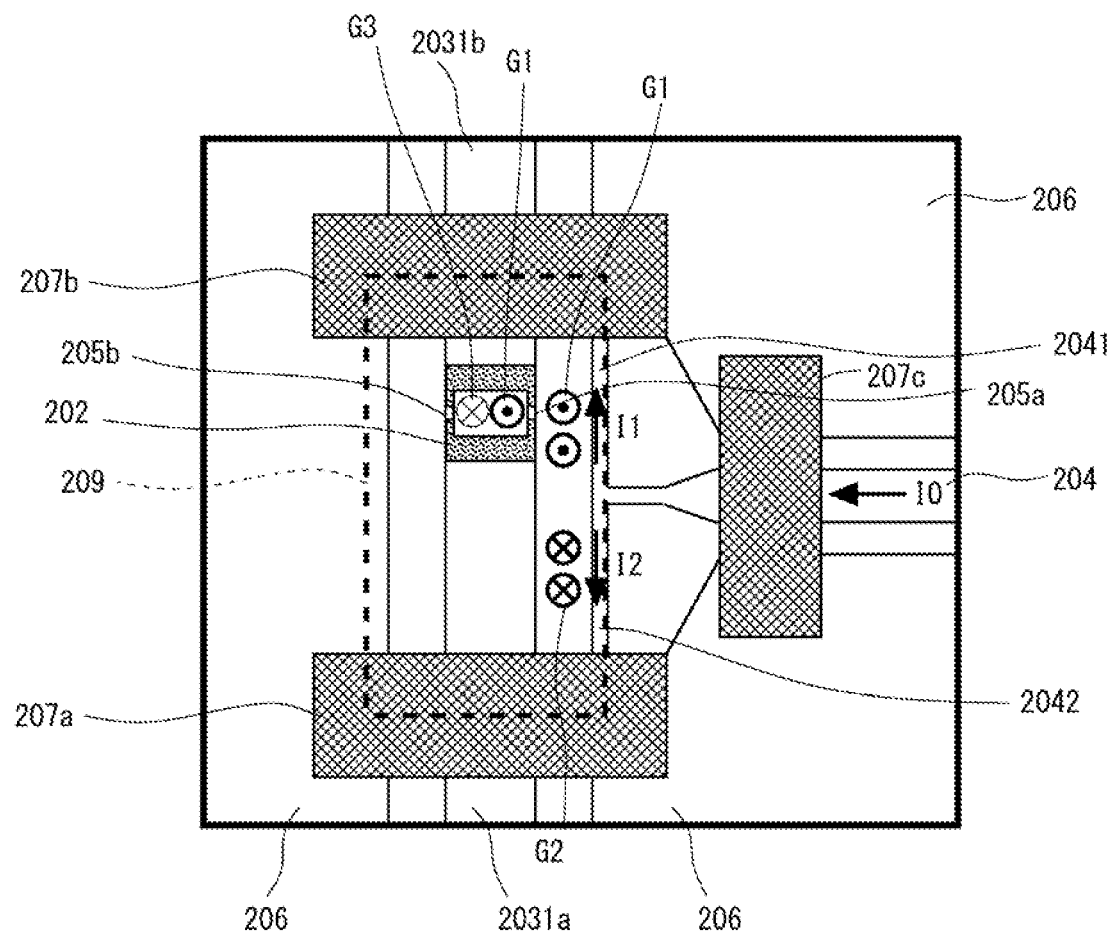
FIG. 18A is a diagram for explaining an operation of setting a resonance frequency of a second quantum bit according to in the second example embodiment.
Figure 18B:
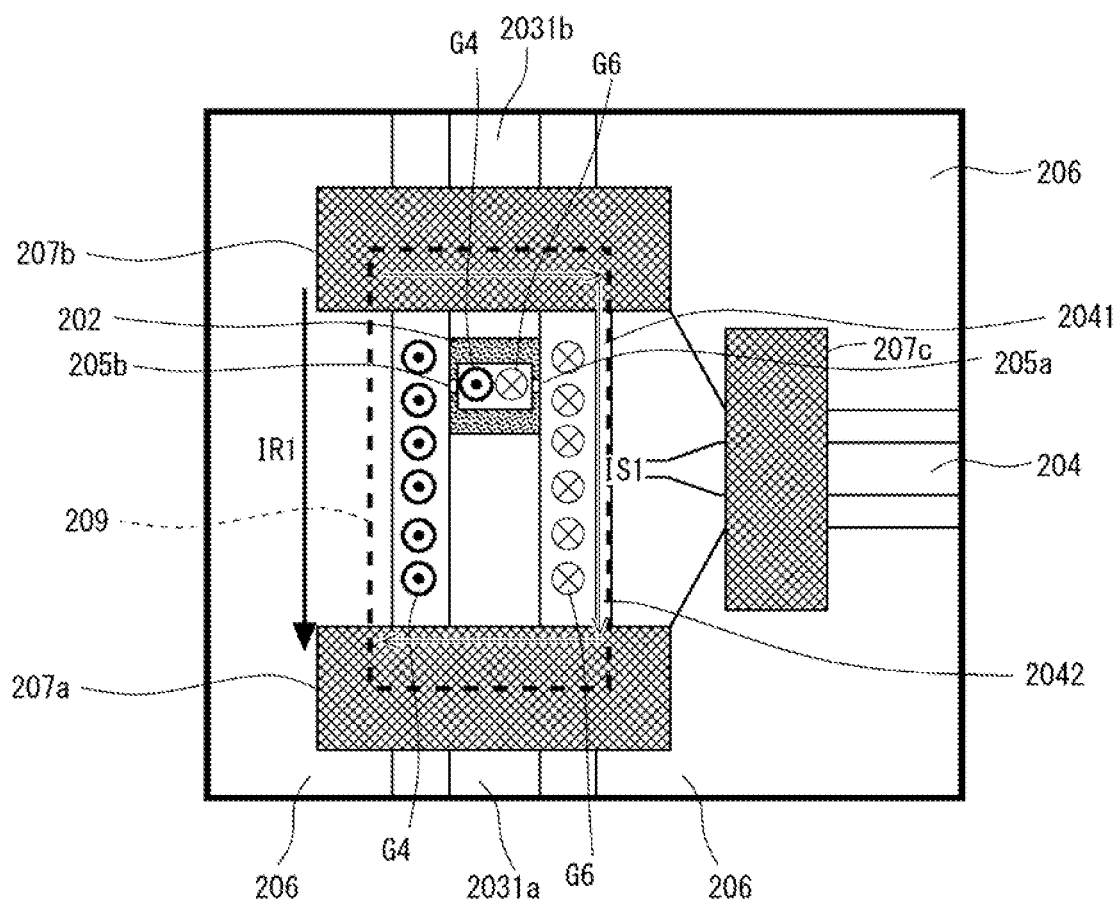
FIG. 18B is a diagram for explaining an operation of the second quantum bit according to the second example embodiment when a DC current causing crosstalk is flowing in a GND plane.

As a comparison to this, the operation (i.e., the behavior) of the second quantum bit 2 according to the second example embodiment will be described. FIGS. 18*a* and 18B are diagram for explaining operations (or behaviors) performed by the second quantum bit 2 according to the second example embodiment. FIG. 18A is a diagram for explaining an operation of the second quantum bit 2 when the resonance frequency thereof is set, and FIG. 18B is a diagram for explaining an operation of the second quantum bit 2 when a DC current, which causes crosstalk, is flowing through the GND plane 206.

Firstly, referring to FIG. 18A, the control of the resonance frequency of the second quantum bit 2 according to the second example embodiment is performed as follows. That is, when a DC control current I0 is supplied from the control line 204, the current I0 is divided into currents I1 and I2 that flow the first and second branch lines 2041 and 2042, respectively. As a result, a part of a magnetic flux G1 generated by the current I1 passes through the loop of the SQUID 202. Since a circulating current flows through the SQUID 202 according to the magnitude and the direction of this magnetic flux which passes through the loop of the SQUID 202 as described above, a current flows through Josephson junctions 205*a* and 205*b*. Therefore, the effective inductance of the SQUID 202 can be controlled by changing the amount and the direction of the control current I0. Therefore, it is possible to control the resonance frequency of the second quantum bit 2. A magnetic flux generated by this circulating current is indicated by a symbol G3 in the drawing. Meanwhile, since the current I2 and the SQUID 202 are far from each other, the magnetic flux G2 generated by the current I2 hardly passes through the loop of the SQUID 202. The magnetic flux G2 generated by the current I2 mainly passes through the gap between the core lines 2031*a* and 2031*b* of the λ/4 lines 203*a* and 203*b* and the GND plane 206, so that the magnetic flux G2 generated by the current I2 does not affect the SQUID 202 at all. Note that, in the second example embodiment, the air bridges 207*a* and 207*b* provided in the vicinity of the connection parts with the SQUID 202 on the λ/4 lines 203*a* and 203*b* are disposed so that they are at equal distances from the branch point 208 of the control line 204. Therefore, the first and second branch lines 2041 and 2042 have shapes identical to each other, and have inductances equal to each other. As mentioned above, there is a property unique to superconductivity, i.e., a property that a magnetic flux that passes through the inside of the superconducting loop 209 must be conserved. However, the amounts of the currents I1 and I2 are equal to each other and their directions are opposite to each other. Therefore, the magnitudes of the magnetic flux G1 (Magnetic Flux=Current×Inductance) generated by the current I1 and the magnetic flux G2 generated by the current I2 in the area inside the superconducting loop 209 are equal to each other, and their directions are opposite to each other, so that they cancel each other. Therefore, the magnetic flux in the area inside the superconducting loop 209 is conserved at zero (i.e., remains at zero). Therefore, no shielding current is generated in the superconducting loop 209 even when the control current is input. Accordingly, the resonance frequency is not set (i.e., is not changed) to an unintended frequency.

Further, referring to FIG. 18B, a case where a DC current, which causes crosstalk, is flowing through the GND plane 206 in the second quantum bit 2 according to the second example embodiment will be examined. When a DC current IR1, which causes crosstalk, is flowing in the GND plane 206 as shown in FIG. 18B, a part of a magnetic flux G4 generated by the current IR1 passes through the loop of the SQUID 202. However, as described above, because of the property unique to superconductivity, i.e., the property that the magnetic flux inside the superconducting loop 209 must be conserved, a shielding current IS1 flows as shown in FIG. 18B. That is, the shielding current IS1 flows through the path composed of the GND plane 206, the air bridge 207*b*, the GND plane 206, the first branch line 2041, the second branch line 2042, the GND plane 206, the air bridge 207*a*, and the GND plane 206. A magnetic flux G6 generated inside the superconducting loop 209 by the shielding current IS1 is completely canceled by the magnetic flux generated inside the superconducting loop 209 by the current IR1. This is because of the property unique to superconductivity, i.e., the property that the magnetic flux in the superconducting loop must be conserved as described above. A part of the magnetic flux G6 generated by the shielding current IS1 passes through the loop of the SQUID 202. The direction of the magnetic flux G4 generated in the loop of the SQUID 202 by the current IR1, which causes crosstalk, and that of the magnetic flux G6 generated in the loop of the SQUID 202 by the shielding current IS1 are opposite to each other. Therefore, since the magnetic flux G4 generated by the current IR1, which causes crosstalk, and the magnetic flux G6 generated by the shielding current IS1 cancel each other inside the loop of the SQUID 202, the magnetic flux that passes through the loop of the SQUID 202 becomes zero or very small. At least by the effect of the shielding current IS1, the magnetic flux that passes through the loop of the SQUID 202 becomes smaller than the part of the magnetic flux generated by the current IR1, which causes crosstalk, that passes through the loop of the SQUID 202. As a result, it is possible to reduce the changes in the effective inductance of the SQUID 202 caused by current IR1, which causes crosstalk, i.e., the changes in the resonance frequency of the second quantum bit 2, by the effect of the shielding current IS1. That is, the DC crosstalk can be reduced.

As described above, in the second example embodiment, it is possible, in addition to reducing the high-frequency crosstalk propagating along the λ/4 line while preventing the Q-value of the quantum bit from deteriorating, to reduce the DC crosstalk which is caused as the DC current propagates through the GND plane.

Note that the control line 204 is preferably disposed so that no shielding current flows in the superconducting loop 209 due to the control current (the control signal) of the control line. That is, as shown in this example embodiment, the control line 204 is preferably disposed so that two types of magnetic fluxes of which the magnitudes are equal to each other and the directions are opposite to each other pass through the superconducting loop 209 by the control current (the control signal) flowing through the control line 204. Note that the magnitudes of these two types of magnetic fluxes do not have to be exactly equal to each other, and may include some errors. That is, these two types of magnetic fluxes may be those having magnitudes roughly equal to each other. For example, the difference between them may be equal to or smaller than 10% of the magnitude of either one of them. However, the configuration in which two types of magnetic fluxes of which the magnitudes are roughly equal to each other and the directions opposite to each other pass through the superconducting loop 209 is not indispensable, though it is preferred as a configuration for reducing the effect of the current IR1, which causes crosstalk. Therefore, a superconducting circuit, i.e., an oscillator, which can provide the above-described advantageous effects can also be expressed as follows. The oscillator includes a SQUID, transmission lines (distributed constant lines) connected to the SQUID, a GND plane, and a connection circuit. Note that two transmission lines are connected to the SQUID. Further, one of the transmission lines is connected to one end of the SQUID, and the other transmission line is connected to the other end of the SQUID. Further, the connection circuit is a circuit that connects parts of the GND plane located on both sides of the transmission line to each other. Further, the connection circuit is provided for each of the two transmission lines. This connection circuit is provided in the vicinity of a node of the electric field of a standing wave that is generated when the oscillator is oscillating. Further, a superconducting loop circuit using the GND plane and the connection circuit is provided in the oscillator so as to surround the SQUID thereof. According to the above-described configuration, it is possible to reduce the high-frequency crosstalk propagating along the λ/4 line while preventing the Q-value of the quantum bit from deteriorating, and to reduce the DC crosstalk which is caused as the DC current propagates through the GND plane.

It should be noted that, in this example embodiment, the inventors carried out simulations for the position of an air bridge provided for the control line 104. The results of the simulations for the position of the air bridge provided for the control line 104 will be described hereinafter. The simulations were performed for a case where only one air bridge is provided on the control line in the second example embodiment. In particular, how the crosstalk reduction effect changes as the position of the air bridge provided on the control line is changed was examined by the simulations. Note that, in the following description, simulations for the first quantum bit will be described, and the description of simulations for the second quantum bit, from which similar results can be obtained, will be omitted.

Figure 19:
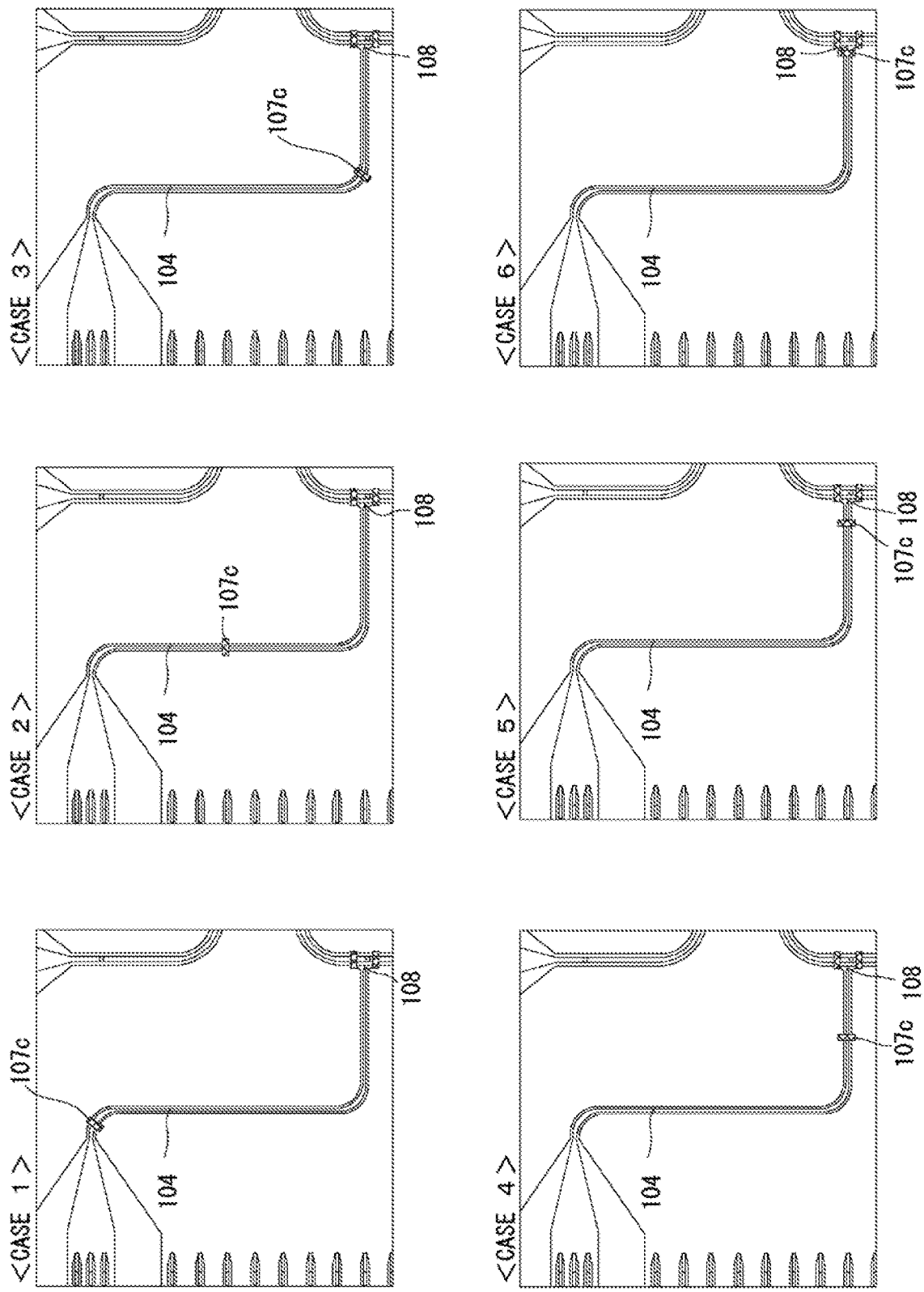
FIG. 19 shows six types of examples of configurations for which simulations were performed.

FIG. 19 shows six types of configurations for which simulations were performed. FIG. 19 shows six types of examples of configurations as examples of configurations in the case where only one air bridge is provided on the control line in the second example embodiment. In these six configuration examples, the distance from the branch point 108 of the control line 104 to the air bridge 107c on the control line 104 is changed from one configuration example to another. Specifically, simulations were performed for six types of cases in which the distance from the branch point 108 to the air bridge 107c on the control line 104 is about λ/4 (Case 1), about λ/6 (Case 2), about λ/10 (Case 3), about λ/20 (Case 4), about λ/50 (Case 5), and about λ/100 (Case 6). Note that λ is the wavelength of a signal having a frequency of 20 GHz input from the control line 104 on the chip, and is about 5.9 mm in this example embodiment. In each of the simulations, the percentage (%) of the current flowing through the SQUID 202 of the second quantum bit 2 to the current flowing through the SQUID 102 of the first quantum bit 1 when a control signal having a frequency of 20 GHz was input to the control line 104 of the first quantum bit 1 was examined. The value of this percentage indicates as follows: the larger this percentage is, the larger the effect of crosstalk is; and conversely, the smaller this percentage is, the smaller the effect of crosstalk is (i.e., the larger the crosstalk reduction effect is).

Figure 20:
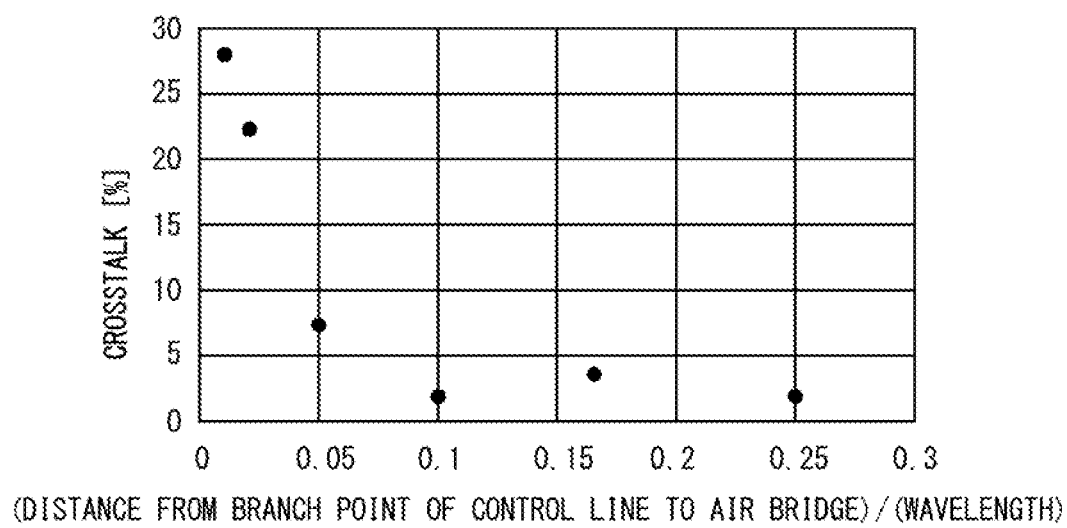
FIG. 20 is a graph showing results of the simulations for the six types of configurations.

FIG. 20 shows the results of the simulations. FIG. 20 is a graph showing the results of the simulations for the above-described six types of cases. In the graph shown in FIG. 20, the horizontal axis indicates the value that is obtained by dividing the distance (mm) from the branch point 108 of the control line 104 to the air bridge 107c provided on the control line 104 by the wavelength of a signal having a frequency of 20 GHz on the chip (i.e., by 5.9 mm). Further, in FIG. 20, the vertical axis indicates the ratio, expressed as a percentage, of the current flowing through the SQUID 202 of the second quantum bit 2 to the current flowing through the SQUID 102 of the first quantum bit 1. Points plotted in FIG. 20 correspond to, from the right side to the left side, the aforementioned Case 1, Case 2, Case 3, Case 4, Case 5, and Case 6, respectively.

As can be understood from the results shown in FIG. 20, when only one air bridge is provided on the control line in the second example embodiment, the crosstalk reduction effect increases when the air bridge provided on the control line is located far from the branch point as compared to when the air bridge is located close to the branch point of the control line. Note that it can be understood from FIG. 20 that in order to make the crosstalk smaller than 10%, the distance from the air bridge provided on the control line to the branch point of the control line is preferably equal to or longer than 1/20 of the wavelength of the control signal (i.e., the value on the horizontal axis in FIG. 20 is preferably equal to or higher than 0.05). Based on the above-described facts, it is considered as follows. When only one air bridge is provided on the control line, the distance between the air bridge provided on the control line and the branch point of the control line is preferably as long as possible in order to improve the crosstalk reduction effect. For example, the distance from the air bridge provided on the control line to the branch point of the control line is preferably equal to or longer than 1/20 of the wavelength of the high-frequency control signal (a control signal having a frequency twice the operating frequency of the quantum bit) input from the control line on the chip. In other words, the distance from the air bridge to the branch point on the control line is preferably equal to or longer than 1/20 of the wavelength of the control signal. More preferably, the distance from the air bridge provided on the control line to the branch point of the control line is preferably equal to or longer than 1/10 of the wavelength. Note that, in the second example embodiment, the number of air bridges provided on the control line may be two or more. Note that the above-described position of the air bridge provided on the control line may be adopted in the first example embodiment.

First Modified Example of Second Example Embodiment

In the second example embodiment, the first and second branch lines 2041 and 2042 have shapes identical to each other, and have inductances equal to each other. However, the same advantageous effects as those in the second example embodiment can be obtained even when the shapes of the first and second branch lines 2041 and 2042 are not identical to each other. In other words, even when the first and second branch lines 2041 and 2042 do not have inductances equal to each other, it is possible to make two types of magnetic fluxes having magnitudes equal to each other and directions opposite to each other pass through the superconducting loop 209 by the control current (the control signal) flowing through the control line 204. That is, advantageous effects similar to those in the second example embodiment can be obtained by other configurations. As an example of such a modified example of the second example embodiment, assume a case where, for example, the air bridges 207a and 207b are provided so that they are at equal distances from the branch point 208 of the control line 204, but the line width of the second branch line 2042 is larger than that of the first branch line 2041. That is, assume a case where the inductance L2 of the second branch line 2042 is smaller than the inductance L1 of the first branch line 2041. In this case, the control current I0 input from the control line 204 is divided into a current I1 flowing through the first branch line 2041 and a current I2 flowing through the second branch line 2042, and the current I0 is divided according to the ratio between the reciprocals of the inductances of these branch lines. That is, a relation I1:I2=L2:L1 holds. Therefore, a relation WA=I2L2 holds. Therefore, a magnetic flux I1L1 (the product of I1 and L1) generated by the current I1 flowing through the first branch line 2041 (the inductance L1) and a magnetic flux I2L2 (the product of I2 and L2) generated by the current I2 flowing through the second branch line 2042 (the inductance L2) are equal to each other irrespective of the values of the inductances L1 and L2. Note that since the air bridges 207a and 207b are disposed in the place where the first branch line 2041 is connected to the GND and the second branch line 2042 is connected to ground, respectively, i.e., disposed at the ends of the respective branch lines, the magnetic flux that is generated by the control current and passes through the inside of the superconducting loop 209 consists of the magnetic flux WA and the magnetic flux I2L2. Therefore, the magnetic flux generated by the current I1 in the area inside the superconducting loop 209 (Magnetic Flux=Current×Inductance) and the magnetic flux generated by the current I2 have magnitudes equal to each other and directions opposite to each other, so that they cancel each other. Therefore, although there is the property that the magnetic flux that passes through the inside of the superconducting loop 209 must be conserved as described above, the magnetic flux in the area inside the superconducting loop 209 is conserved at zero (i.e., remains at zero). Therefore, when the control current is input, no shielding current caused by the control current is generated in the superconducting loop 209, so that it does not affect the setting of the resonance frequency.

Second Modified Example of Second Example Embodiment

Figure 21:
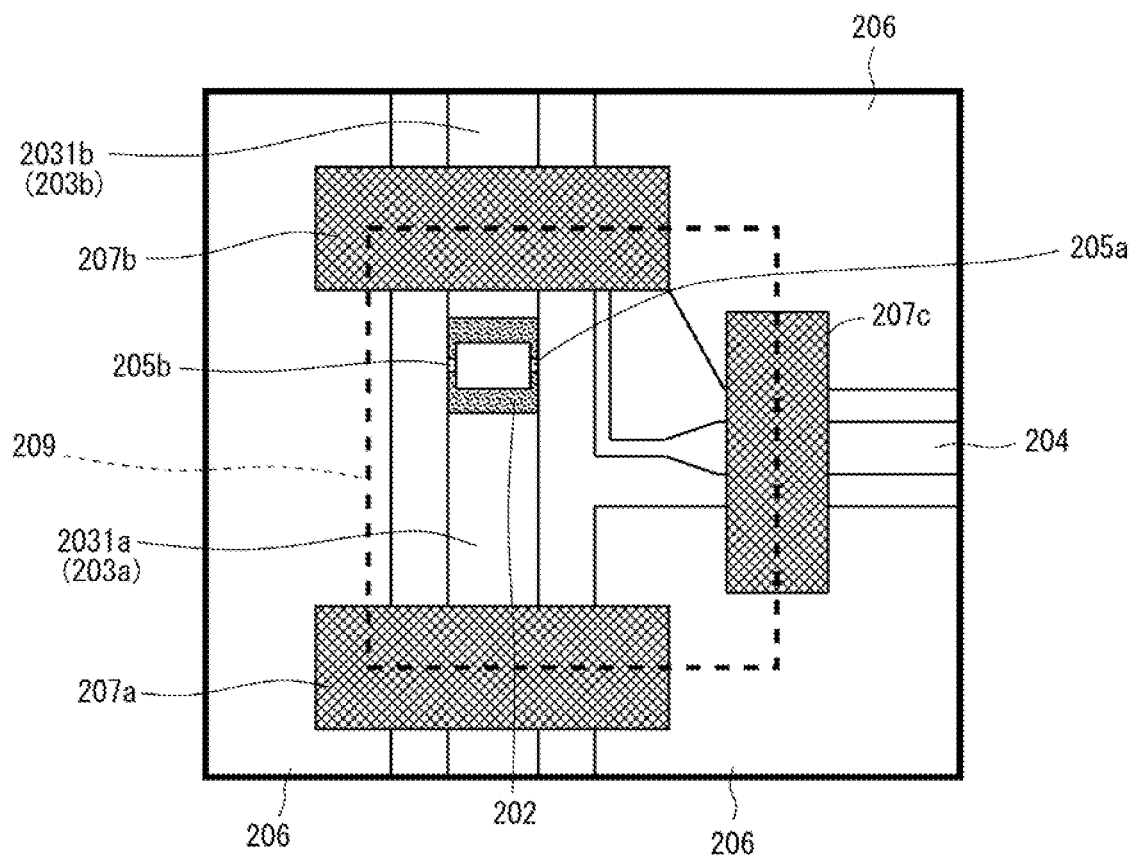
FIG. 21 shows a chip layout of a superconducting circuit according to a second modified example of the second example embodiment.
Figure 22:
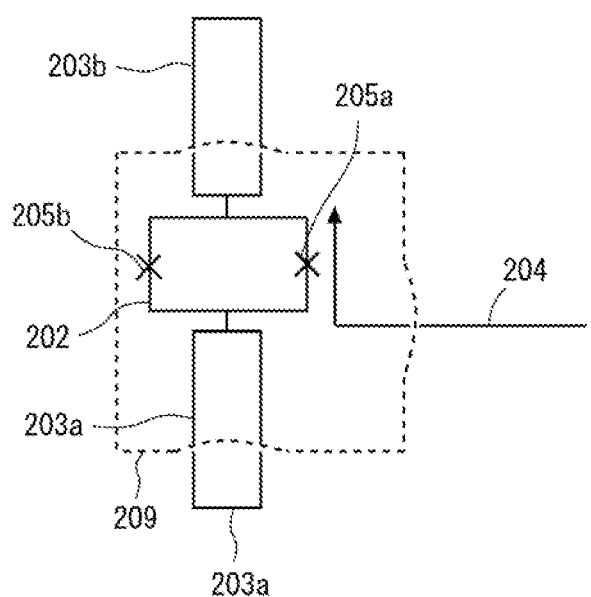
FIG. 22 shows an equivalent circuit of the superconducting circuit according to the second modified example of the second example embodiment.

FIG. 21 is a layout of a superconducting circuit according to a second modified example. Further, FIG. 22 shows an equivalent circuit of the superconducting circuit according to the second modified example. Similarly to the above-described example embodiment, the superconducting circuit according to this modified example can be used as a superconducting quantum bit. Note that, similarly to the description of the above-described example embodiment, a configuration of one quantum bit is described in detail with reference to the drawings, and the description of the other quantum bit(s) having a similar configuration is omitted. Further, descriptions of configurations similar to those in the second example embodiment will be omitted as appropriate, and differences therefrom will be described in detail. In the above-described example embodiment, the end side of the control line 204 separates into two branches, and the two ends of the control line 204 are connected to parts of the GND plane 206 located on both sides of the control line 204, respectively. In contrast, in this modified example, the end side of the control line 204 does not separate into branches, and the end of the control line 204 is connected to only one of parts of the GND plane 206 located on both sides of the control line 204. That is, in this modified example, the control line 204 is a single line having no branch. Note that the end side of the control line 204 is wired (i.e., routed) along the SQUID 202 so that the control line 204 magnetically couples with the SQUID 202. In the example shown in the drawing, the control line 204 is an L-shaped line, and specifically is configured as follows. That is, the control line 204 shown in FIG. 21 is an L-shaped line including a part extending along the SQUID 202 in a first direction (the up/down direction in the drawing) and a part extending in a second direction (the left/right direction in the drawing). That is, the control line 204 shown in FIG. 21 is bent at 90 degrees in the vicinity of the SQUID 202, and the part of the control line 204 extending in the second direction extends in a direction receding from the SQUID 202.

In the superconducting quantum bit according to this modified example, a superconducting loop 209 is formed by air bridges 207a, 207b and 207c so as to surround the outside of the SQUID 202. That is, in this modified example, the superconducting loop 209 is a circuit made of a superconductor using the GND plane 206 and the air bridges 207a, 207b and 207c. In the configuration shown in FIG. 21, the air bridges 207a and 207b are provided in the vicinity of the SQUID 202 as in the case of the first or second example embodiment. The air bridge 207a is a connection circuit made of a superconductor that connects parts of the GND plane 206 located on both sides of the λ/4 line 203a to each other, and the air bridge 207b is a connection circuit made of a superconductor that connects parts of the GND plane 206 located on both sides of the λ/4 line 203b to each other. Further, the air bridge 207c is a connection circuit made of a superconductor that connects parts of the GND plane 206 located on both sides of the control line 204 to each other.

In this modified example, the air bridges 207a and 207b are also provided, on the λ/4 lines 203a and 203b, only at places that are as close as possible to the connection parts with the SQUID 202 as in the case of the first and second example embodiments. Therefore, this modified example provides an advantageous effect similar to that described in the first and second example embodiments, i.e., the advantageous effect that the high-frequency crosstalk is reduced while preventing the Q-value of the quantum bit from deteriorating.

Further, this modified example has also a configuration in which the superconducting loop 209 surrounds the outside of the SQUID 202, and therefore provides an advantageous effect similar to that described in the second example embodiment, i.e., the advantageous effect that the crosstalk that is caused as a current flows through the GND plane is reduced by the effect of the shielding current.

Note that although the superconducting loop circuit using the first and second branch lines 2041 and 2042 is formed in the second example embodiment, such a superconducting loop circuit is not formed in this modified example. Theoretically, even when a superconducting loop circuit using the first and second branch lines 2041 and 2042 is formed, no shielding current is generated due to the control current flowing through the control line 204 as described above. However, if a shielding current caused by the control current is generated for some reason, a magnetic flux caused by the shielding current could significantly affect the SQUID 202. This is because there is a large mutual inductance between the first branch line 2041, which is formed in a linear shape, and the SQUID 202. If the magnetic flux caused by the aforementioned shielding current affects the SQUID 202, it hinders the setting of the resonance frequency to an intended value. Further, if the magnetic flux generated by the control current flowing through the second branch line 2042 passes through the loop of the SQUID 202 for some reason, it also hinders the setting of the resonance frequency to an intended value. To cope with this, in this modified example, the superconducting loop 209 surrounding the SQUID 202 does not use the first and second branch lines 2041 and 2042. That is, as described above, the superconducting loop 209 formed by the GND plane 206 and the air bridges 207a, 207b and 207c surrounds the SQUID 202. Therefore, as compared to the configuration shown in the second example embodiment, it is possible to prevent the setting of the resonance frequency to an intended value from being hindered. Further, since the control line 204 does not separate into branches, it is possible to increase the part of the control current that contributes to applying the magnetic flux to the SQUID 202 as compared to the case where the control line 204 separates into branches.

Third Example Embodiment

Figure 23:
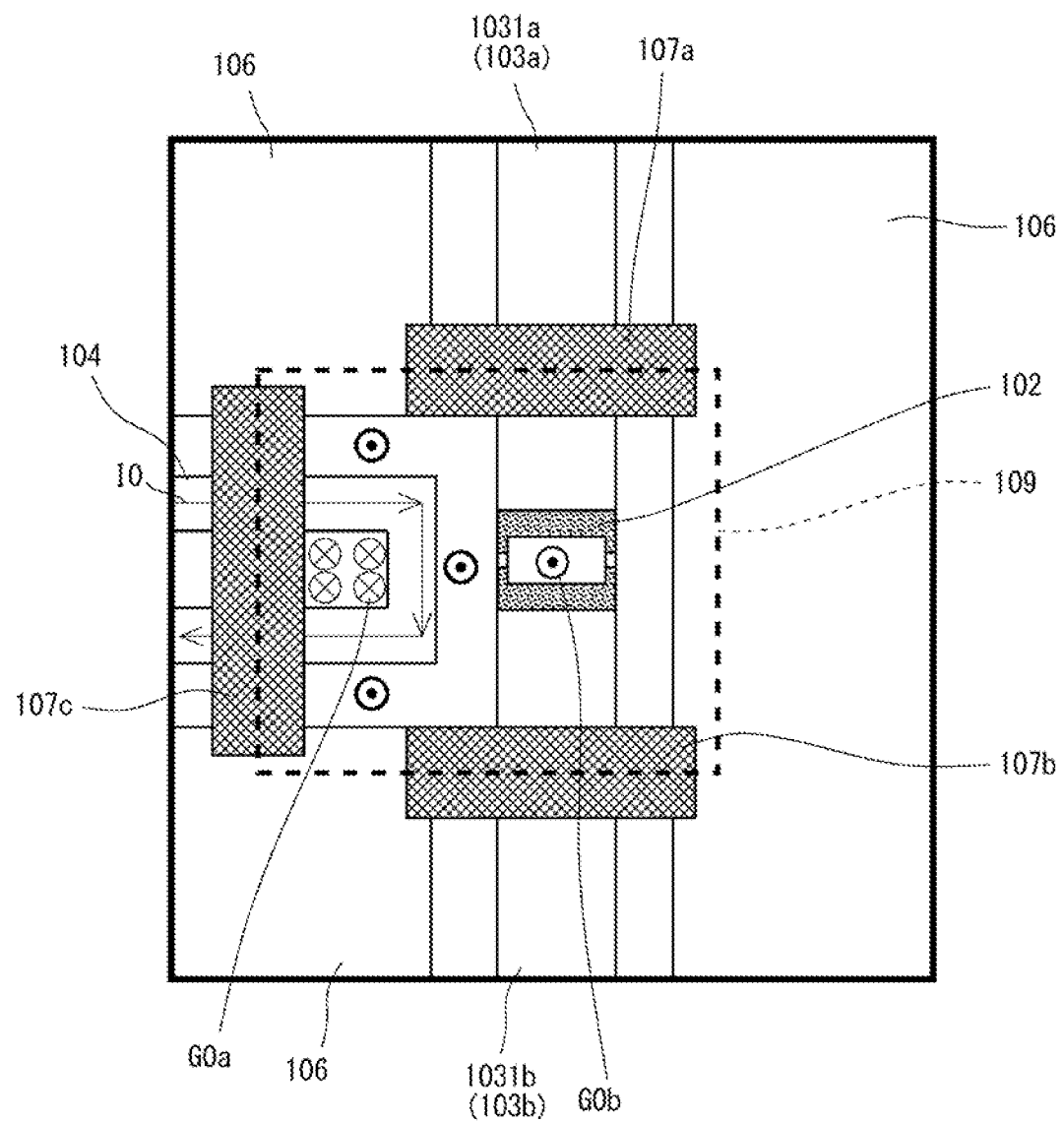
FIG. 23 is an enlarged view of a chip layout of a superconducting circuit according to a third example embodiment in the vicinity of a SQUID of a first quantum bit thereof.
Figure 24:
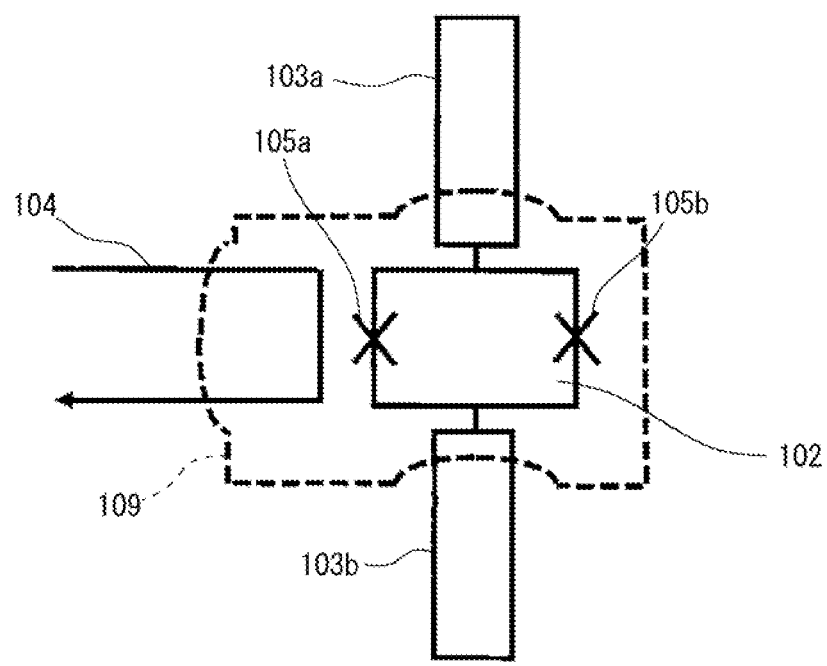
FIG. 24 shows an equivalent circuit of the superconducting circuit according to the third example embodiment.

FIG. 23 is a layout of a superconducting circuit according to a third example embodiment. Further, FIG. 24 shows an equivalent circuit of the superconducting circuit according to the third example embodiment. Similarly to the above-described example embodiments, the superconducting circuit according to the third example embodiment is a superconducting quantum bit. In the description of this example embodiment, similarly to the descriptions of the above-described example embodiments, a configuration of one quantum bit will be described in detail with reference to the drawings, and the description of the other quantum bit(s) having a similar configuration is omitted. Note that this also applies to the descriptions of other example embodiments and the like described later, unless otherwise specified. The equivalent circuit shown in FIG. 24 is similar to the equivalent circuit of the first quantum bit 1 or the second quantum bit 2 shown in FIG. 8, except that the configuration of the control line is different. Specifically, unlike the superconducting quantum bits of the first and second example embodiments, the control line 104 does not separate into branches in the superconducting quantum bit according to the third example embodiment. Further, a superconducting loop 109 is formed by air bridges 107a, 107b and 107c so as to surround the outside of the SQUID 102 in the superconducting quantum bit according to the third example embodiment. That is, in this example embodiment, the superconducting loop 109 is a circuit made of a superconductor using the GND plane 106 and the air bridges 107a, 107b and 107c. Further, a control line 104 has such a shape that it enters the superconducting loop 109 from the outside thereof, is folded back inside the superconducting loop 109, and then goes out from the superconducting loop 109 again. That is, in this example embodiment, the control line 104 is wired (i.e., routed) in a U-shape so that it is folded back in the vicinity of the SQUID 102. In this example embodiment, the air bridges 107a and 107b are provided in the vicinity of the SQUID 102 as in the case of the first or second example embodiment. In this example embodiment, the air bridge 107c connects the GND plane 106 across the control line 104 as in the case of the first and second example embodiments. However, in this example embodiment, the air bridge 107c is a connection circuit made of a superconductor that connects parts of the GND plane 106 located on both sides of the two straight sections, i.e., the outward and returning sections, of the U-shaped control line 104 to each other.

Note that the positional relationship among the SQUID 102, the λ/4 lines 103a and 103b, and the control line 104 is, for example, as shown in FIG. 23 and will be described hereinafter. The λ/4 lines 103a and 103b and the SQUID 102 are arranged in a first direction (the up/down direction in the drawing) in the vicinity of the SQUID 102. Further, the control line 104 extends in a second direction (the left/right direction in the drawing) in the vicinity of the SQUID 102, and is folded back in the vicinity of the SQUID 102. That is, the control line 104 is wired (i.e., routed) on the side of the folded-back part opposite to the side thereof on which the SQUID 102 is located.

In the third example embodiment, the air bridges 107a and 107b are also provided, on the λ/4 lines 103a and 103b, only at places that are as close as possible to the connection parts with the SQUID 102 as in the case of the first and second example embodiments. Therefore, the third example embodiment also provides an advantageous effect similar to that described in the first and second example embodiments, i.e., the advantageous effect that the high-frequency crosstalk is reduced while preventing the Q-value of the quantum bit from deteriorating.

Further, the third example embodiment has also a configuration in which the superconducting loop 109 surrounds the outside of the SQUID 102, and therefore provides an advantageous effect similar to that described in the second example embodiment, i.e., the advantageous effect that the crosstalk that is caused as a current flows through the GND plane is reduced by the effect of the shielding current. Further, as shown in FIG. 23, when the control current I0 is supplied from the control line 104 in order to control the quantum bit, the magnetic fluxes generated on the right and left sides of the control line 104 by the current I0 have magnitudes equal to each other and directions opposite to each other. Therefore, it is possible to make the magnetic fluxes G0a and G0b generated inside the superconducting loop 109 by the current I0 zero or very small in total. Therefore, it is possible to make the shielding current that is generated in the superconducting loop when the control current I0 is input from the control line 104 zero or very small. Accordingly, the setting of the resonance frequency is not affected.

Fourth Example Embodiment

Figure 25:
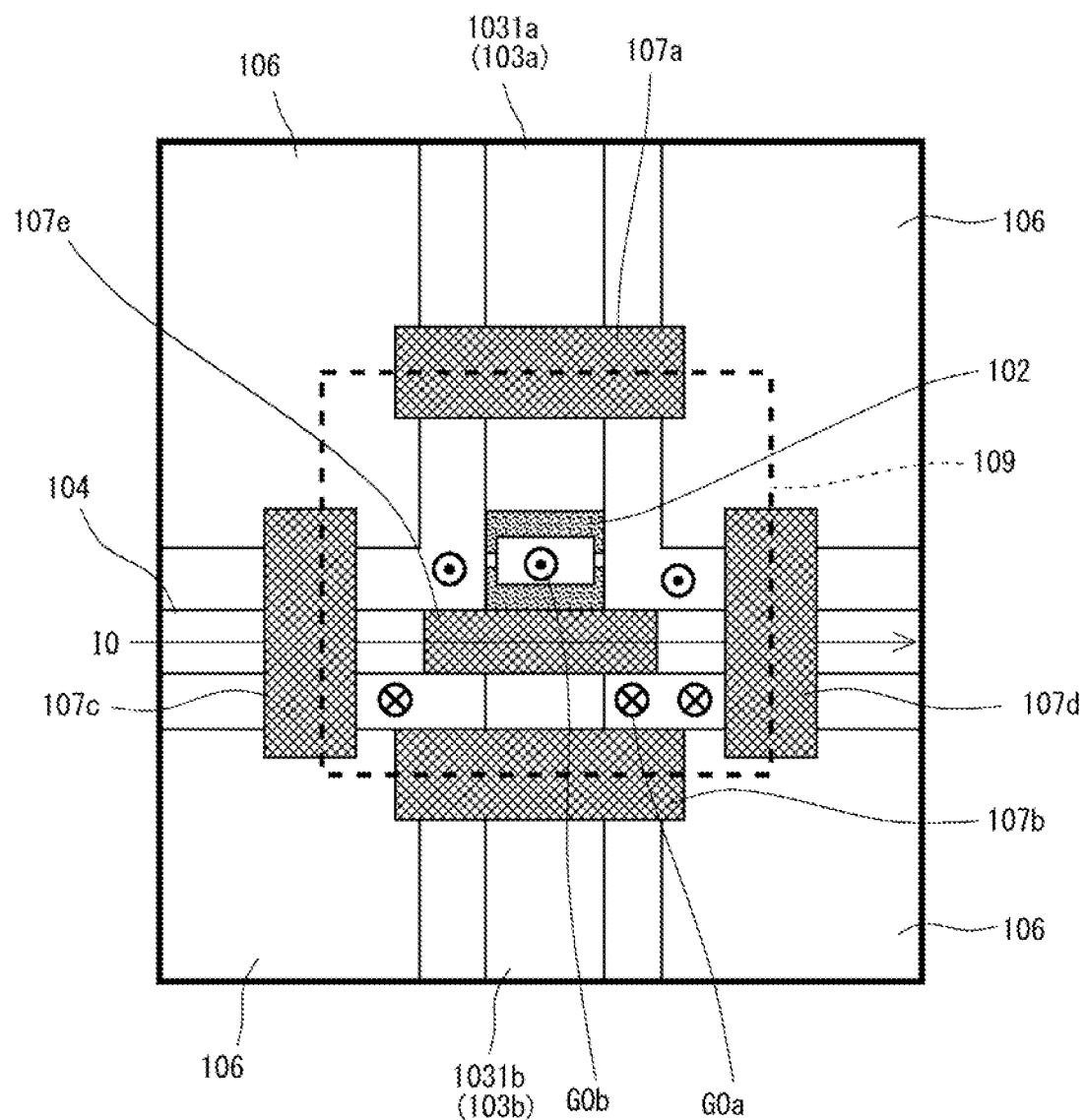
FIG. 25 is an enlarged view of a chip layout of a superconducting circuit according to a fourth example embodiment in the vicinity of a SQUID of a first quantum bit thereof.
Figure 26:
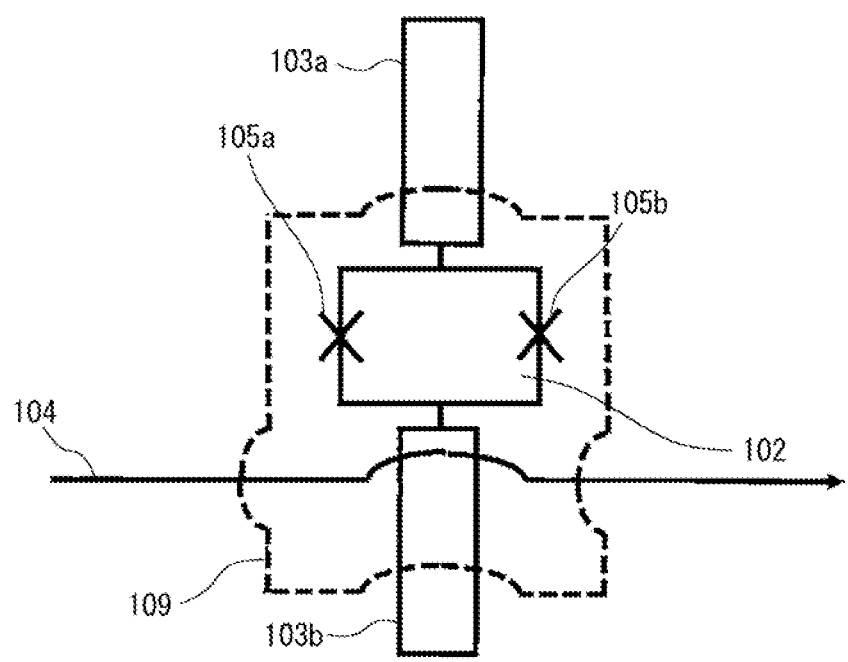
FIG. 26 shows an equivalent circuit of the superconducting circuit according to the fourth example embodiment.

FIG. 25 shows a layout of a superconducting circuit according to a fourth example embodiment. Further, FIG. 26 shows an equivalent circuit of the superconducting circuit according to the fourth example embodiment. Similarly to the above-described example embodiments, the superconducting circuit according to the fourth example embodiment is a superconducting quantum bit. In the description of this example embodiment, similarly to the descriptions of the above-described example embodiments, a configuration of one quantum bit will be described in detail with reference to the drawings, and the description of the other quantum bit(s) having a similar configuration is omitted. The equivalent circuit shown in FIG. 26 is similar to the equivalent circuit of the first quantum bit 1 or the second quantum bit 2 shown in FIG. 8, except that the configuration of the control line is different. Specifically, unlike the superconducting quantum bits of the first and second example embodiments, the control line 104 does not separate into branches in the superconducting quantum bit according to the fourth example embodiment. Further, a superconducting loop 109 is formed by air bridges 107*a*, 107*b*, 107*c* and 107*d* so as to surround the outside of the SQUID 102 in the superconducting quantum bit according to the fourth example embodiment. That is, in this example embodiment, the superconducting loop 109 is a circuit made of a superconductor using the GND plane 106 and the air bridges 107*a*, 107*b*, 107*c* and 107*d*. Further, a control line 104 has such a shape that it enters the superconducting loop 109 from the outside thereof, and then goes out from the superconducting loop 109 again. That is, in this example embodiment, the control line 104 is wired (i.e., routed) in a straight line and intersects with one of the two transmission lines (the λ/4 lines 103*a* and 103*b*) connected to the SQUID 102 in a three-dimensional manner (i.e., like an overpass). More specifically, as shown in FIG. 25, an air bridge 107*e* is provided in the middle of the control line 104 to cross over (i.e., cross above) the λ/4 line 103*b*. That is, the control line 104 and the λ/4 line 103*b* intersect with each other in a three-dimensional manner by the air bridge 107*e* (i.e., like an overpass). In this example embodiment, the air bridges 107*a* and 107*b* are provided in the vicinity of the SQUID 102 as in the case of the first and second example embodiments. In this example embodiment, the air bridges 107*c* and 107*d* connect parts of the GND plane 106 located on both sides of the control line 104 to each other by crossing over (i.e., crossing above) the control line 104 as in the case of the first and second example embodiments. The air bridges 107*c* and 107*d* are provided on both sides of the place where the control line 104 and the λ/4 line 103*b* intersect with each other in a three-dimensional manner.

Note that the positional relationship among the SQUID 102, the λ/4 lines 103*a* and 103*b*, and the control line 104 is, for example, as shown in FIG. 25 and will be described hereinafter. The λ/4 lines 103*a* and 103*b* and the SQUID 102 are arranged in a first direction (the up/down direction in the drawing) in the vicinity of the SQUID 102. Further, the control line 104 extends in a second direction (the left/right direction in the drawing) in the vicinity of the SQUID 102 while intersecting the λ/4 line 103*b* in a three-dimensional manner. In other words, the control line 104 is wired so as to cross over the transmission line in a direction intersecting the direction in which the transmission line and the SQUID are arranged.

In the fourth example embodiment, the air bridges 107*a* and 107*b* are also provided, on the λ/4 lines 103*a* and 103*b*, only at places that are as close as possible to the connection parts with the SQUID 102 as in the case of the first, second and third example embodiments. Therefore, the fourth example embodiment provides an advantageous effect similar to that described in the first, second and third example embodiments, i.e., the advantageous effect that the high-frequency crosstalk is reduced while preventing the Q-value of the quantum bit from deteriorating.

Further, the fourth example embodiment has also a configuration in which the superconducting loop 109 surrounds the outside of the SQUID 102, and therefore provides an advantageous effect similar to that described in the second and third example embodiments, i.e., the advantageous effect that the crosstalk that is caused as a current flows through the GND plane is reduced by the effect of the shielding current. Further, as shown in FIG. 25, when the control current I0 is supplied from the control line 104 in order to control the quantum bit, the magnetic fluxes generated on the right and left sides of the control line 104 by the current I0 have magnitudes equal to each other and directions opposite to each other. Therefore, it is possible to make the magnetic fluxes G0a and G0b generated inside the superconducting loop 109 by the current I0 zero or very small in total. Therefore, it is possible to make the shielding current that is generated in the superconducting loop when the control current I0 is input from the control line 104 zero or very small. Accordingly, the setting of the resonance frequency is not affected.

[Other Configuration]

In the first, second, third and fourth example embodiments, an air bridge is used as a connection circuit for electrically short-circuiting parts of the GND plane located on both sides of core lines of λ/4 line to each other, and any type of conductive material can be used as the material for such an air bridge. However, in order to make the potentials of the parts of the GND plane located on both sides of the core line as equal as possible, the conductive material preferably has an electrical resistance as small as possible. Further, most preferably, the conductive material is a material that becomes a superconductor at a temperature at which the quantum circuit is operated (about 10 mK). Note that since a superconducting loop circuit made of a superconductor is required to achieve the DC crosstalk reduction effect using a shielding current, the air bridge(s) and the GND plane(s) that constitute the superconducting loop circuit need to be made of a superconductor. Examples of the materials that become a superconductor at the temperature at which the quantum circuit is operated include aluminum (Al), tantalum (Ta), niobium (Nb), and alloys containing any of them. Further, the GNDs on both sides of the λ/4 line or the control line may be electrically short-circuited by using, instead of the air bridge, a bonding wire. Any type of conductor can be used as the material for such a bonding wire. However, the material for such a bonding wire preferably has an electrical resistance as small as possible, and most preferably, it is a material that becomes a superconductor at the temperature at which the quantum circuit is operated. Even when a bonding wire is used, the bonding wire must be made of a superconductor in order to achieve the DC crosstalk reduction effect using a shielding current. Examples of the materials that become a superconductor at the temperature at which the quantum circuit is operated include aluminum (Al). Further, instead of using the air bridge, the below-described connection circuit may be used. That is, a structure in which a TSV (Through Silicon Via) is formed in each of parts of the GND plane located on both sides of the core line of the λ/4 line, and wiring lines for electrically connecting these TSVs to each other are formed on the rear surface of the chip may be used as a connection circuit. The connection circuit that intersects the core line of the λ/4 line in a three-dimensional manner without being in contact with the core line of the λ/4 line can also be realized (i.e., formed) by using the above-described structure. Any type of conductive material can be used as the material for the TSVs and the wiring lines provided on the rear surface of the chip. However, in order to make the potentials of the parts of the GND planes located on both sides of the core line as equal as possible, the conductive material preferably has an electrical resistance as small as possible. Further, most preferably, the conductive material is a material that becomes a superconductor at the temperature at which the quantum circuit is operated (about mK). Note that since a superconducting loop circuit made of a superconductor is required to achieve the DC crosstalk reduction effect using a shielding current, the TSVs, the wiring lines provided on the rear surface of the chip, and the GND plane(s) that constitute the superconducting loop circuit need to be made of a superconductor. Examples of the materials that become a superconductor at the temperature at which the quantum circuit is operated include aluminum (Al), tantalum (Ta), niobium (Nb), and alloys containing any of them. Further, in a configuration in which a chip including a quantum circuit formed therein is connected to a substrate such as an interposer by using a flip-chip connecting technique (hereinafter also referred to as being flip-chip connected), instead of using the air bridges, bumps for connecting the chip to the substrate and wiring lines provided on the substrate may be used. That is, the parts of the GND plane located on both sides of the λ/4 line or the control line on the chip are electrically short-circuited to each other by bumps and wiring lines provided on the substrate. Even in this case, any type of conductive material can be used as the material for such bumps and wiring lines provided on the substrate. However, the material for such bumps and wiring lines preferably has an electrical resistance as small as possible, and most preferably, it is a material that becomes a superconductor at the temperature at which the quantum circuit is operated. For the bumps, examples of the materials that become a superconductor at the temperature at which the quantum circuit is operated include indium (In). Further, for the wiling lines in the interposer, examples of such materials include niobium (Nb) and aluminum (Al). Even in this case, the bumps and the wiring lines provided on the substrate must be a superconductor in order to achieve the DC crosstalk reduction effect using a shielding current.

Further, the first, second, third and fourth example embodiments have been described by using a 2-bit distributed constant-type quantum circuit as an example of the quantum circuit in which a plurality of quantum bits are integrated. However, the number of integrated quantum bits does not have to be two. That is, the above-described example embodiments can be applied to a quantum circuit in which three or more distributed constant-type quantum bits are integrated, and by doing so, similar advantageous effects can be obtained.

Further, although the distributed constant-type quantum bits have been described so far, the idea of reducing crosstalk that is caused as a current flows through a GND plane by the shielding effect of a superconducting loop can also be applied to lumped constant-type quantum bits. A lumped constant-type quantum bit will be described hereinafter.

Figure 27:
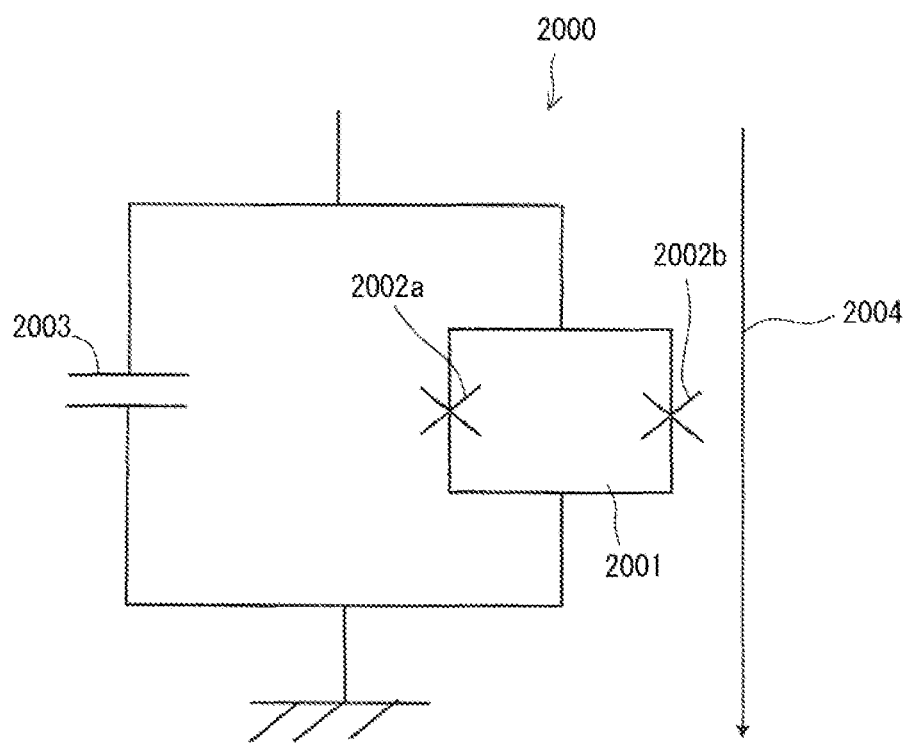
FIG. 27 shows an equivalent circuit of a lumped constant-type superconducting quantum bit.

FIG. 27 shows an example of an equivalent circuit of a lumped constant-type quantum bit 2000. A lumped constant-type quantum bit 2000 is a loop circuit in which each of the terminals of a SQUID 2001 is connected to a respective one of the terminals of a capacitor 2003 by a superconducting wiring line. In other words, the input and output terminals of the SQUID 2001 are shunted by the capacitor 2003. That is, it can be said that, by connecting the capacitor 2003 and the SQUID 2001 in a ring shape (i.e., in a circular fashion), a loop circuit in which the SQUID 2001 is incorporated into the loop line is formed. The SQUID 2001 is a loop circuit including two Josephson junctions 2002a and 2002b. That is, the SQUID 2001 is formed by connecting the two Josephson junctions 2002a and 2002b in a ring shape. One of the terminals of the SQUID 2001 may be connected to the ground. A control line 2004 is magnetically coupled with the SQUID 2001. In other words, the control line 2004 and the SQUID 2001 magnetically couple with each other by their mutual inductance in a noncontact manner.

In the distributed constant-type quantum bit shown in FIG. 2, a resonator is formed by using the SQUID and the λ/4 lines. As shown in FIG. 27, the lumped constant-type quantum bit 2000 differs from the distributed constant-type quantum bit because an LC resonant circuit is formed by the effective inductance of the SQUID 2001 and the capacitor 2003 in the lumped constant-type quantum bit 2000. A distributed constant-type quantum bit such as the one shown in FIG. 2 has a size roughly equal to the length of the wavelength corresponding to the operating frequency of the quantum bit, so that the size of the quantum bit is very large. In contrast, the lumped constant-type quantum bit 2000 such as the one shown in FIG. 27 does not use any distributed constant line, so that the quantum bit can be realized (i.e., formed) by a circuit that is very small compared to the wavelength corresponding to the operating frequency of the quantum bit 2000. Therefore, it has an advantage that when a large number of quantum bits 2000 are integrated, they can be integrated in a small area.

The way of operating the lumped constant-type quantum bit 2000 is similar to that for the distributed constant-type quantum bit shown in FIG. 2. That is, it is possible to set the resonance frequency of the quantum bit 2000 by inputting a DC control signal from the control line 2004. In a state in which a DC control signal for setting the resonance frequency to a certain frequency is being input to the control line 2004, it is possible to make the quantum bit 2000 oscillate by further inputting a control signal having a frequency twice the set resonance frequency to the control line 2004. The operating frequency (the set resonance frequency) of the quantum bit 2000 is, for example, about 10 GHz. Therefore, when the quantum bit 2000 is operated, a signal in which a DC control signal and a high-frequency control signal having a frequency of about 20 GHz are superimposed is input thereto from the control line 2004. Note that, as described above, the lumped constant-type quantum bit oscillates by the control signal from the control line. Therefore, a configuration including a lumped constant-type quantum bit may also be referred to as an oscillator.

Figure 28:
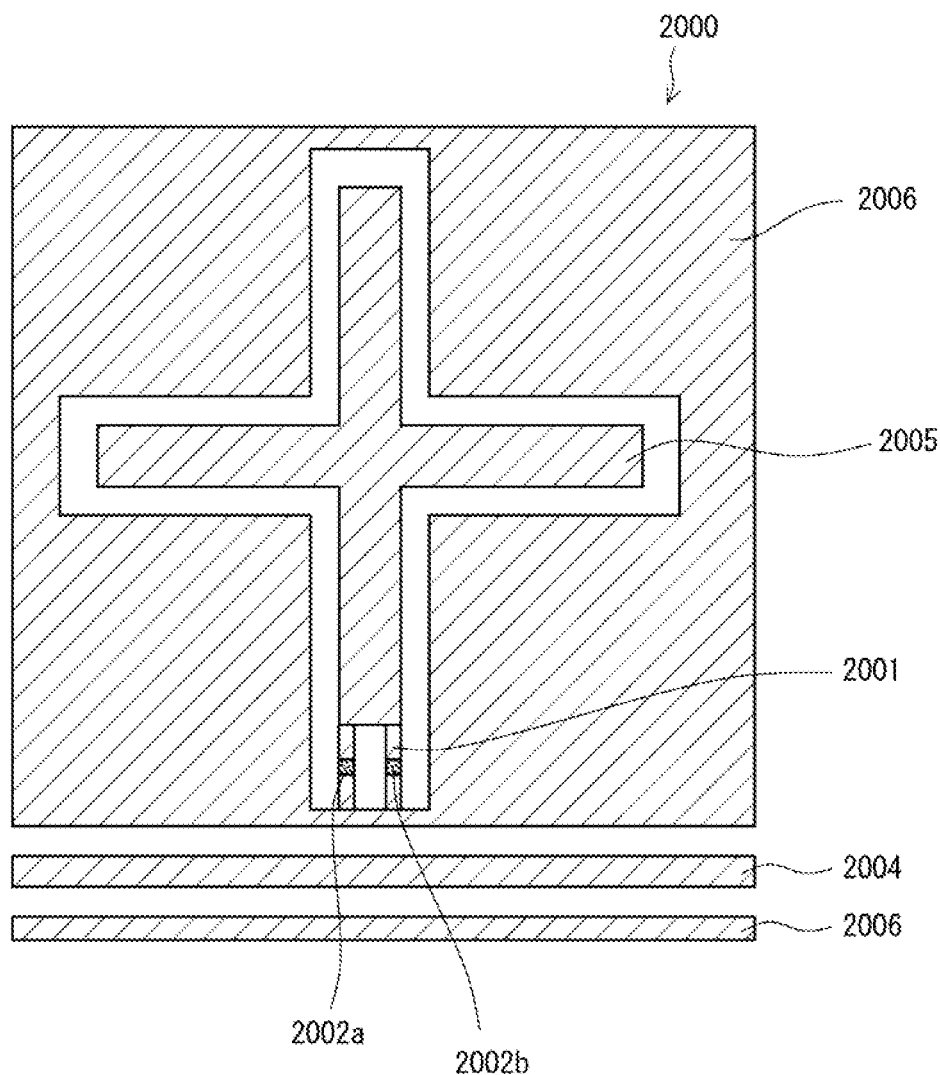
FIG. 28 shows a layout of a lumped constant-type superconducting quantum bit.

FIG. 28 shows an example of a layout of the lumped constant-type quantum bit 2000 shown in FIG. 27. In this example, a quantum bit 2000 having a coplanar waveguide structure is realized (i.e., formed) by forming a thin film of a superconducting material (e.g., niobium or aluminum) on a silicon substrate. As shown in FIG. 28, in the quantum bit 2000, a cross-shaped electrode (also referred to as a conductive member) 2005 is formed inside a cross-shaped area formed in a GND plane 2006 (i.e., a cross-shaped space formed by removing a cross-shaped piece from the GND plane 2006). That is, the GND plane 2006 is disposed around the electrode 2005 so as to surround the electrode 2005. Note that the GND plane 2006 and the electrode 2005 are apart from each other, and there is a gap therebetween. One end of the electrode 2005 is connected to the GND plane 2006 by using two narrow electrodes, and a Josephson junction 2002a is provided in the middle of one of these two narrow electrodes, and a Josephson junction 2002b is provided in the middle of the other narrow electrode. By the above-described configuration, a SQUID 2001 is formed by the electrode 2005, the GND plane 2006, and the two Josephson junctions 2002a and 2002b. That is, in the SQUID 2001, the electrode 2005 and the GND plane 2006 are used to connect the two Josephson junctions 2002a and 2002b, which form the SQUID 2001, in a loop. As described above, one end of the SQUID 2001 is connected to the electrode 2005 and the other end thereof is connected to the GND plane 2006. Note that it can be said that the SQUID 2001 is disposed between the electrode 2005 and the GND plane 2006. As described above, in the quantum bit 2000, as shown in FIG. 28, the SQUID 2001 is connected to one of the four ends, i.e., outwardly protruding parts of the cross-shaped electrode 2005 (i.e., the tip of one of the four arms of the cross-shaped electrode 2005), in such a manner that the SQUID 2001 serves as a bridge between the electrode 2005 and the GND plane 2006. Since there is a gap between the cross-shaped electrode 2005 and the GND plane, a capacitor 2003 is formed between the electrode 2005 and the GND plane 2006. Further, the control line 2004 is disposed in a straight line near the SQUID 2001. That is, in FIG. 28, a horizontally-long electrode disposed below the cross-shaped electrode 2005 is a control line 2004. When a current is fed to the control line 2004, a part of the magnetic flux generated by the current flowing through the control line 2004 passes through the loop of the SQUID 2001, making it possible to control the effective inductance of the SQUID 2001 and/or to make the quantum bit 2000 oscillate.

The layout shown in FIG. 28 is susceptible to the crosstalk described above, especially to the crosstalk that is caused as a current flows through the GND plane. In a chip in which a plurality of quantum bits 2000 are integrated, the aforementioned crosstalk could occur because, for example, when a DC control current is input to a given quantum bit 2000, the SQUID 2001 of another quantum bit 2000 senses (i.e., is affected by) a magnetic field that is generated when the DC control current flows through the GND plane after flowing through the control line thereof. A method similar to the above-described method can be applied in order to reduce the effect of such crosstalk. An example embodiment for reducing the effect of crosstalk in a lumped constant-type quantum bit will be described hereinafter.

Fifth Example Embodiment

Figure 29:
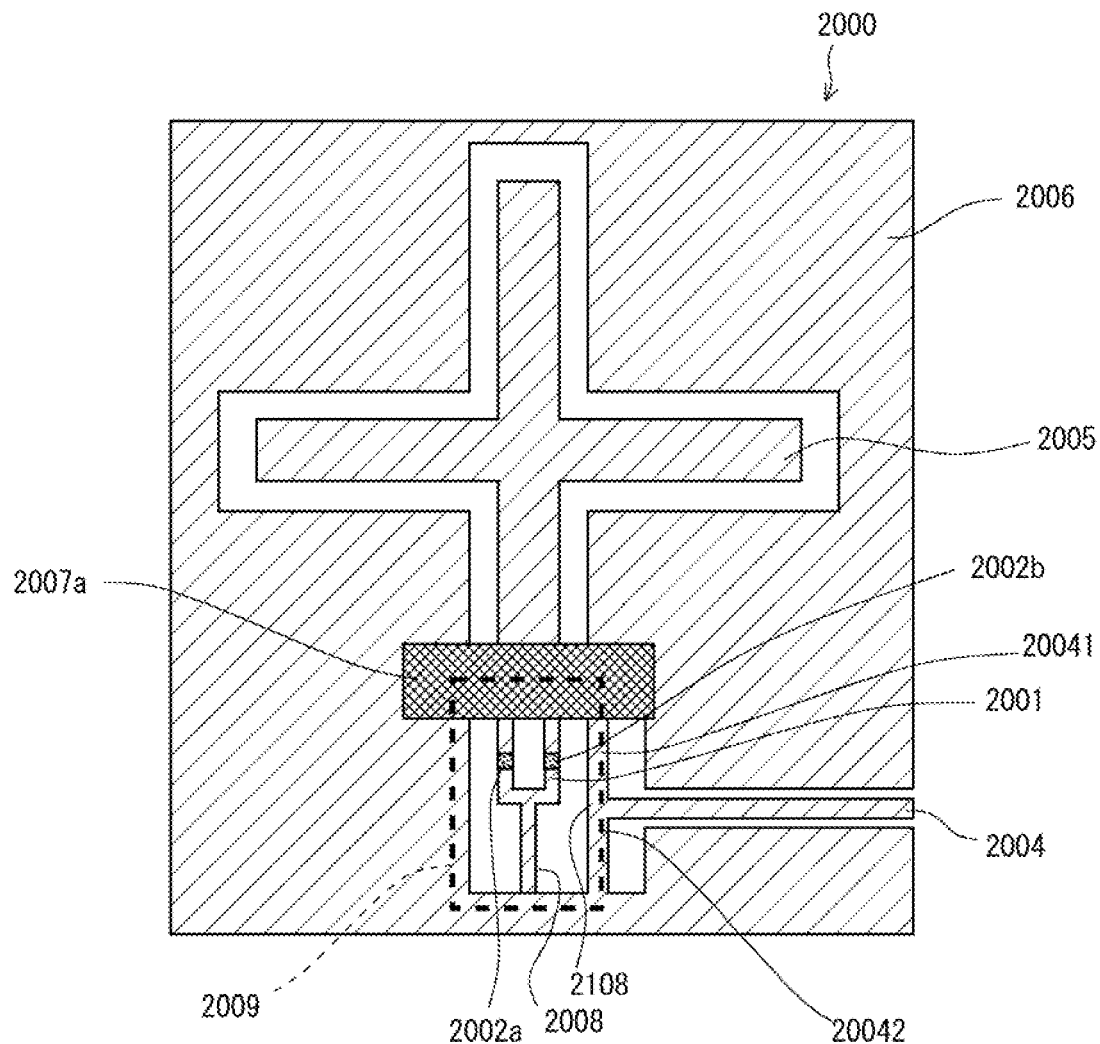
FIG. 29 shows a layout of a lumped constant-type superconducting quantum bit according to a fifth example embodiment.

FIG. 29 shows a layout of a quantum bit according to a fifth example embodiment. Differences from the configuration shown in FIG. 28 will be described hereinafter, and descriptions of similar components/structures will be omitted as appropriate. Since the equivalent circuit of the lumped constant-type quantum bit 2000 according to this example embodiment is similar to that shown in FIG. 27, the layout shown in FIG. 28 will be described. In this example embodiment, a quantum bit 2000 having a coplanar waveguide structure is also shown. Therefore, as shown in FIG. 29, the electrode 2005 and the control line 2004 are formed as a coplanar waveguide, and a GND plane 2006 made of a superconductor is located around the line that is formed as the coplanar waveguide. In this example embodiment, as shown in FIG. 29, in the quantum bit 2000, a cross-shaped electrode (also referred to as a conductive member) 2005 is also formed inside a cross-shaped area formed in the GND plane 2006 (i.e., a cross-shaped space formed by removing a cross-shaped piece from the GND plane 2006). That is, the GND plane 2006 is disposed around the electrode 2005 so as to surround the electrode 2005. Further, there is a gap between the GND plane 2006 and the electrode 2005, and a capacitor 2003 is formed between the electrode 2005 and the GND plane 2006 by this gap. Further, in this example embodiment, in the quantum bit 2000, the SQUID 2001 is connected to one of the four ends, i.e., outwardly protruding parts of the cross-shaped electrode 2005 (i.e., the tip of one of the four arms of the cross-shaped electrode 2005), in such a manner that the SQUID 2001 serves as a bridge between the electrode 2005 and the GND plane 2006. However, while one end of the SQUID 2001 is directly connected to the electrode 2005, the other end thereof is connected to the GND plane 2006 through one narrow electrode 2008. Note that the electrode 2008 may also be referred to as a connection conductive member or a conductive line. In the example shown in FIG. 29, the electrode 2005, the SQUID 2001, and the electrode 2008 are arranged in a first direction (the up/down direction in the drawing). In other words, the SQUID 2001 and the electrode 2008 are arranged in the direction in which the one of the four arms of the cross-shaped electrode 2005 to which the SQUID 2001 is connected extends. Note that, in this example embodiment, the SQUID 2001 is also formed by a Josephson junction 2002*a* provided in the middle of one of the two narrow electrodes and a Josephson junction 2002*b* provided in the middle of the other narrow electrode. That is, in this example embodiment, in the SQUID 2001, the electrodes 2005 and 2008 are used to connect the two Josephson junctions 2002*a* and 2002*b*, which form the SQUID 2001, in a loop. Therefore, as described above, one end of the SQUID 2001 is connected to the electrode 2005, and the other end thereof is connected to the GND plane 2006 through the electrode 2008. Note that it can be said that the SQUID 2001 is disposed between the electrode 2005 and the GND plane 2006.

As shown in FIG. 29, in this example embodiment, the control line 2004 is disposed next to the SQUID 2001, and the tip of the control line 2004 separates into a first branch line 20041 and a second branch line 20042 at a branch point 2108. Further, the first branch line 20041 is disposed near the SQUID 2001 so that the first branch line 20041 and the SQUID 2001 magnetically couple with each other. Meanwhile, the second branch line 20042 is disposed far from the SQUID 2001 in order to prevent the second branch line 20042 and the SQUID 2001 magnetically coupling with each other. Specifically, in order to make the first branch line 20041 and the SQUID 2001 magnetically couple with each other while preventing the second branch line 20042 and the SQUID 2001 from magnetically couple with each other, these branch lines are wired (i.e., routed) as follows. That is, the first branch line 20041 is wired along the SQUID 2001, and the second branch line 20042 is wired along the electrode 2008 in the direction opposite to the direction of the first branch line 20041. The first and second branch lines 20041 and 20042 are both connected to the GND plane 2006.

The control line 2004 is a T-shaped line, and the first and second branch lines 20041 and 20042, which are separated from each other at the branch point 2108, are arranged in a straight line. Note that the positional relationship among the SQUID 2001, the electrode 2005, and the control line 2004 is, for example, as shown in FIG. 29 and will be described hereinafter. As described above, the electrode 2005 and the SQUID 2001 are arranged in a first direction (the up/down direction in the drawing) in the vicinity of the SQUID 2001. Further, the first and second branch lines 20041 and 20042 are also wired in this first direction (the up/down direction in the drawing). Note that the non-branched part of the control line 204 (i.e., the part of the control line 2004 other than the first and second branch lines 20041 and 20042) extends in a second direction (the left/right direction in the drawing) in the vicinity of the SQUID 2001, and extend from the branch point 2108 so as to recede from the SQUID 2001. That is, the non-branched part of the control line 2004 is wired on the side of the branch point 2108 opposite to the side thereof on which the SQUID 2001 is located. While the first branch line 20041 is located so as to be opposed to the SQUID 2001, the second branch line 20042 is located so as to be not opposed to the SQUID 2001.

Further, in this example embodiment, an air bridge 2007*a* is provided in the vicinity of the terminal of the SQUID 2001 on the side thereof on which the electrode 2005 is located. The air bridge 2007*a* is a connection circuit made of a superconductor that connects parts of the GND plane 2006 located on both sides of the connection part between the SQUID 2001 and the electrode 2005 to each other. In the configuration shown in FIG. 29, the air bridge 2007*a* connects the parts of the GND plane 2006 located on both sides of the connection part between the electrode 2005 and the SQUID 2001 to each other by crossing over (i.e., crossing above) the vicinity of this connection part. More specifically, the air bridge 2007*a* connects parts of the GND plane 2006 located on both sides of the end of the electrode 2005 connected to the SQUID 2001 to each other by crossing over (i.e., crossing above) this end of the electrode 2005. In this way, in this example embodiment, a superconducting loop 2009 is formed by the air bridge 2007*a*, the GND plane 2006, and the first and second branch lines 20041 and 20042 so as to surround the SQUID 2001. Specifically, this superconducting loop 2009 surrounds the SQUID 2001 and the narrow electrode 2008. All of the air bridge 2007*a*, the GND plane 2006, and the first and second branch lines 20041 and 20042, which constitute the superconducting loop 2009, are made of a superconductor. The first and second branch lines 20041 and 20042, which constitute the superconducting loop 2009, have shapes identical to each other. As described above, this example embodiment includes the superconducting loop 2009 surrounding the SQUID 2001, so that it provides an advantageous effect that the effect of the crosstalk can be reduced. Further, in the superconducting loop 2009, the first and second branch lines 20041 and 20042 have shapes identical to each other. Therefore, a current input from the control line 2004 is divided into those flowing through the first and second branch lines 20041 and 20042 so that the divided currents have amounts equal to each other and directions opposite to each other. Therefore, the occurrence of a shielding current in the superconducting loop 2009, which would otherwise be caused by the input of the control current to the control line 2004, is suppressed, and the resonance frequency is prevented from being set (i.e., changed) to an unintended frequency.

Figure 30:
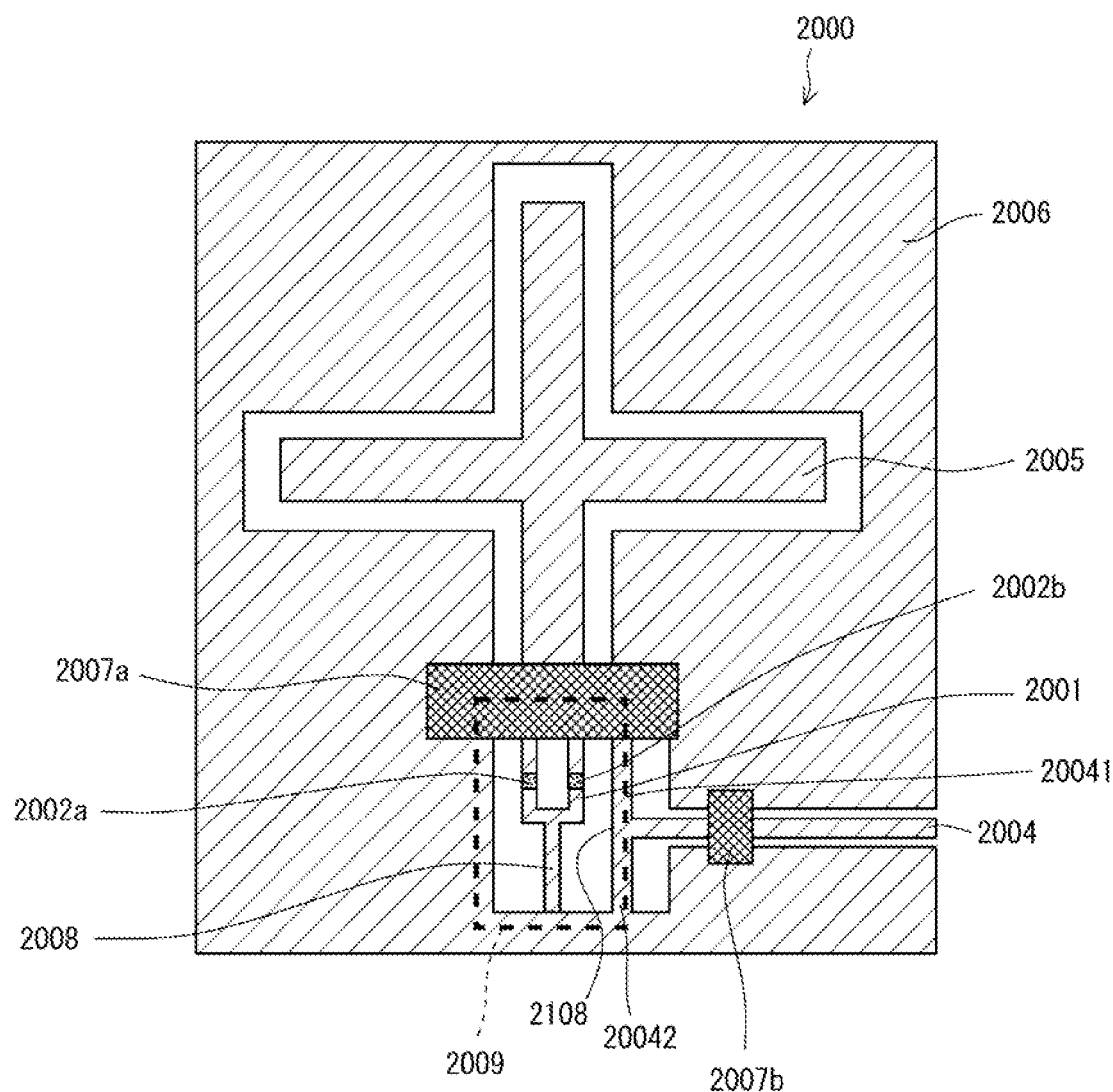
FIG. 30 shows another layout of the lumped constant-type superconducting quantum bit according to the fifth example embodiment.

Note that, as shown in FIG. 30, an air bridge 2007*b* that connects parts of the GND plane 2006 located on both sides of the core line of the non-branched part of the control line 2004 to each other may be further added.

Modified Example of Fifth Example Embodiment

Figure 31:
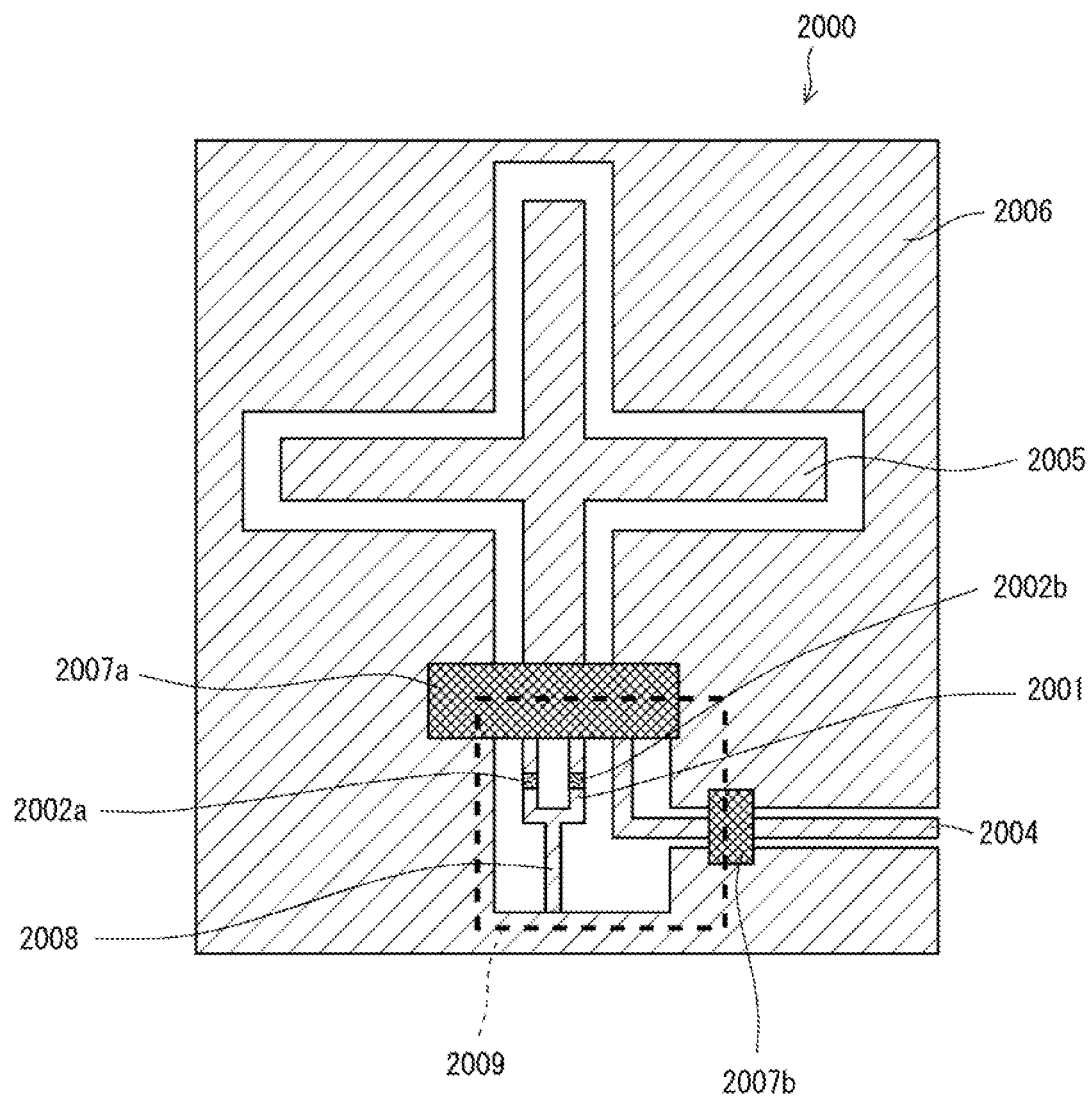
FIG. 31 shows a layout of a lumped constant-type superconducting quantum bit according to a modified example of the fifth example embodiment.

FIG. 31 is a layout of a lumped constant-type quantum bit according to a modified example of the fifth example embodiment. Differences from the fifth example embodiment will be described hereinafter in detail. In the fifth example embodiment, the end side of the control line 2004 separates into two branches, and the two ends of the control line 2004 are connected to the parts of the GND plane 2006 located on both sides of the control line 2004, respectively. In contrast, in this modified example, the end side of the control line 2004 does not separate into branches, and the end of the control line 2004 is connected to only one of parts of the GND plane 2006 located on both sides of the control line 2004. That is, in this modified example, the control line 2004 is a single line having no branch. Note that the end side of the control line 2004 is wired (i.e., routed) along the SQUID 2001 so that the control line 2004 magnetically couples with the SQUID 2001. In the example shown in the drawing, the control line 2004 is an L-shaped line, and specifically is configured as follows. That is, the control line 2004 shown in FIG. 31 is an L-shaped line including a part extending along the SQUID 2001 in a first direction (the up/down direction in the drawing) and a part extending in a second direction (the left/right direction in the drawing). That is, the control line 2004 shown in FIG. 31 is bent at 90 degrees in the vicinity of the SQUID 2001, and the part of the control line 2004 extending in the second direction extends in a direction receding from the SQUID 2001. Note that although the control line 2004 has the L-shape in the example shown in FIG. 31, the control line 2004 may be a straight line extending in the first direction (the up/down direction in the drawing).

In the superconducting quantum bit according to this modified example, a superconducting loop 2009 is formed by air bridges 2007*a* and 2007*b* so as to surround the outside of the SQUID 2001. That is, in this modified example, the superconducting loop 2009 is a circuit made of a superconductor using the GND plane 2006 and the air bridges 2007*a* and 2007*b*. In the configuration shown in FIG. 31, the air bridge 2007*a* is provided in the vicinity of the terminal of the SQUID 2001 on the side thereof on which the electrode 2005 is located as in the case of the fifth example embodiment. The air bridge 2007*a* is a connection circuit made of a superconductor that connects parts of the GND plane 2006 located on both sides of the connection part between the SQUID 2001 and the electrode 2005 to each other. Further, the air bridge 2007*b* is a connection circuit made of a superconductor that connects parts of the GND plane 2006 located on both sides of the control line 2004 to each other.

This modified example also includes the superconducting loop 2009 surrounding the SQUID 2001, so that it provides an advantageous effect that the effect of the crosstalk that is caused as a current flows through the GND plane can be reduced.

Note that although the superconducting loop circuit using the first and second branch lines 20041 and 20042 is formed in the fifth example embodiment, such a superconducting loop circuit is not formed in this modified example. Therefore, as described in the description of the second modified example of the second example embodiment, it is possible to prevent the setting of the resonance frequency to an intended value from being hindered. Further, since the control line 2004 does not separate into branches, it is possible to increase the part of the control current that contributes to applying the magnetic flux to the SQUID 2001 as compared to the case where the control line 2004 separates into branches.

Sixth Example Embodiment

Figure 32:
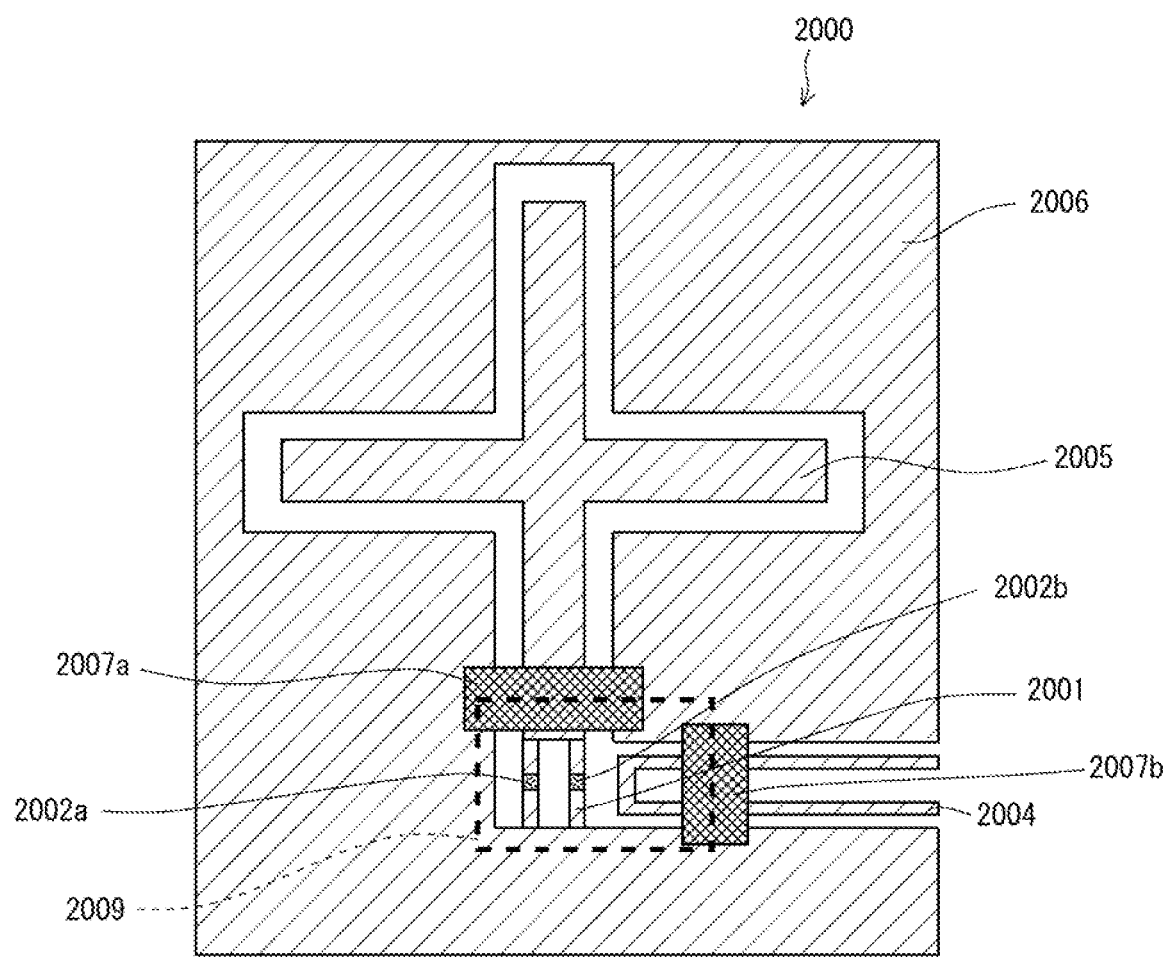
FIG. 32 shows a layout of a lumped constant-type superconducting quantum bit according to a sixth example embodiment.

Next, another example embodiment for reducing the effect of crosstalk in a lumped constant-type quantum bit will be described. FIG. 32 shows a layout of a lumped constant-type quantum bit according to a sixth example embodiment. Differences from the fifth example embodiment will be described hereinafter in detail. As shown in FIG. 32, unlike the fifth example embodiment, the control line 2004 does not separate into branches in this example embodiment. Further, in this example embodiment, a superconducting loop 2009 is formed by air bridges 2007*a* and 2007*b* to surround the outside of the SQUID 2001. That is, in this example embodiment, the superconducting loop 2009 is a circuit made of a superconductor using the GND plane 2006 and the air bridges 2007*a* and 2007*b*. Further, a control line 2004 has such a shape that it enters the superconductor loop 2009 from the outside thereof, is folded back inside the superconductor loop 2009, and then goes out from the superconductor loop 2009 again. That is, in this example embodiment, the control line 2004 is wired (i.e., routed) in a U-shape so that it is folded back in the vicinity of the SQUID 2001. In this example embodiment, the air bridge 2007*a* is provided in the vicinity of the terminal of the SQUID 2001 on the side thereof on which the electrode 2005 is located as in the case of the fifth example embodiment. The air bridge 2007*b* connects the GND plane 106 across the control line 2004. Specifically, the air bridge 2007*b* is a connection circuit made of a superconductor that connects parts of the GND plane 2006 located on both sides of the two straight sections, i.e., the outward and returning sections, of the U-shaped control lines 104 to each other.

Note that the positional relationship among the SQUID 2001, the electrode 2005, and the control line 2004 is, for example, as shown in FIG. 32 and will be described hereinafter. The electrode 2005 and the SQUID 2001 are arranged in a first direction (the up/down direction in the drawing) in the vicinity of the SQUID 2001. Further, the control line 2004 extends in a second direction (the left/right direction in the drawing) in the vicinity of the SQUID 2001 and is folded back in the vicinity of the SQUID 2001. That is, the control line 2004 is wired on the side of the folded-back part opposite to the side thereof on which the SQUID 2001 is located. As described above, the structures of the control line 2004 and the superconducting loop 2009 in this example embodiment are similar to those in the third example embodiment (the example embodiment of a distributed constant-type quantum bit).

This example embodiment also includes the superconducting loop 2009 surrounding the SQUID 2001, so that it provides an advantageous effect that the effect of the crosstalk that is caused as a current flows through the GND plane can be reduced. Further, for a reason similar to that in the third example embodiment, the occurrence of a shielding current in the superconducting loop 2009, which would otherwise be caused by the input of the control current to the control line 2004, is suppressed, and the resonance frequency is prevented from being set (i.e., changed) to an unintended frequency.

Seventh Example Embodiment

Figure 33:
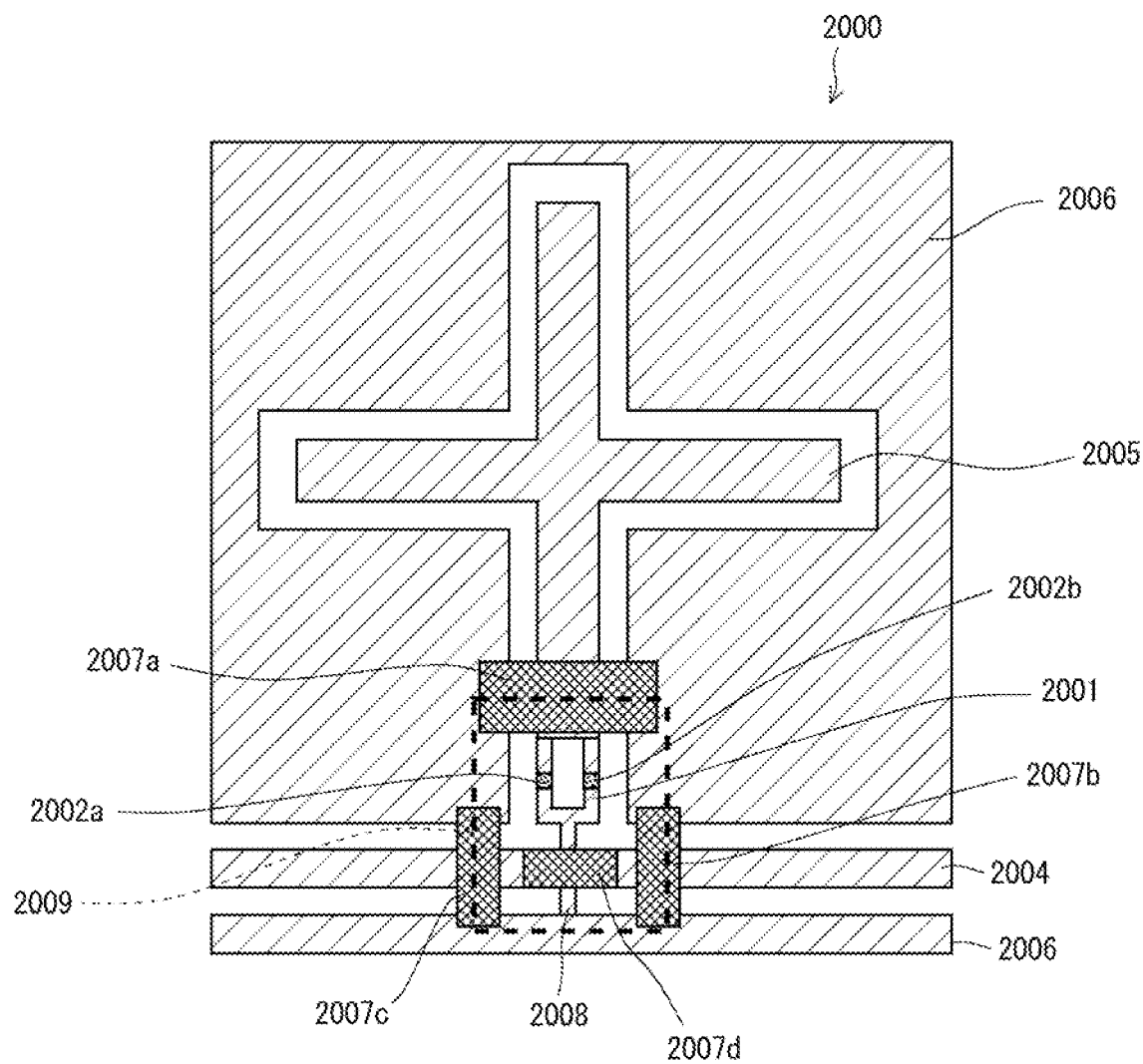
FIG. 33 shows a layout of a lumped constant-type superconducting quantum bit according to a seventh example embodiment.

Next, another example embodiment for reducing the effect of crosstalk in a lumped constant-type quantum bit will be described. FIG. 33 shows a layout of a lumped constant-type quantum bit according to a seventh example embodiment. Differences from the fifth example embodiment will be described hereinafter in detail. As shown in FIG. 33, unlike the fifth example embodiment, the control line 2004 does not separate into branches in this example embodiment. Further, in this example embodiment, a superconducting loop 2009 is formed by air bridges 2007*a*, 2007*b* and 2007*c* so as to surround the outside of the SQUID 2001. That is, in this example embodiment, the superconducting loop 2009 is a circuit made of a superconductor using the GND plane 2006 and the air bridges 2007*a*, 2007*b* and 2007*c*. Further, a control line 2004 has such a shape that it enters the superconductor loop 2009 from the outside thereof, and then goes out from the superconductor loop 2009 again. That is, the control line 2004 is wired in a straight line and intersects with the electrode 2008 connected to the SQUID 2001 in a three-dimensional manner (i.e., like an overpass). Note that the control line 2004 may be wired in a straight line and intersect with the SQUID 2001 in a three-dimensional manner. More specifically, as shown in FIG. 33, an air bridge 2007*d* is provided in the middle of the control line 2004 to cross over (i.e., cross above) the electrode 2008 or the SQUID 2001. That is, the control line 2004 and the electrode 2008, or the control line 2004 and the SQUID 2001 intersect with each other in a three-dimensional manner by the air bridge 2007*d*. In this example embodiment, the air bridge 2007*a* is provided in the vicinity of the terminal of the SQUID 2001 on the side thereof on which the electrode 2005 is located as in the case of the fifth example embodiment. The air bridges 2007*b* and 2007*c* connect parts of the GND plane 106 located on both sides of the control line 2004 to each other. The air bridges 2007*b* and 2007*c* are provided on both sides of the place where the control line 2004 and the electrode 2008, or the control line 2004 and the SQUID 2001 intersect with each other in a three-dimensional manner.

Note that the positional relationship among the SQUID 2001, the electrode 2005, and the control line 2004 is, for example, as shown in FIG. 33 and will be described hereinafter. The electrode 2005, the SQUID 2001, and the electrode 2008 are arranged in a first direction (the up/down direction in the drawing) in the vicinity of the SQUID 2001. Further, the control line 2004 extends in a second direction (the left/right direction in the drawing) in the vicinity of the SQUID 2001 while intersecting the electrode 2008 or the SQUID 2001 in a three-dimensional manner. In other words, the control line 2004 is wired so as to cross over the electrode 2008 or the SQUID 2001 in a direction intersecting the direction in which the electrode 2005 and the SQUID 2001 are arranged. As described above, the structures of the control line 2004 and the superconducting loop 2009 in this example embodiment are similar to those in the fourth example embodiment (the example embodiment of a distributed constant-type quantum bit).

This example embodiment also includes the superconducting loop 2009 surrounding the SQUID 2001, so that it provides an advantageous effect that the effect of the crosstalk that is caused as a current flows through the GND plane can be reduced. Further, for a reason similar to that in the fourth example embodiment, the occurrence of a shielding current in the superconducting loop 2009, which would otherwise be caused by the input of the control current to the control line 2004, is suppressed, and the resonance frequency is prevented from being set (i.e., changed) to an unintended frequency.

The fifth to seventh example embodiments have been described above. The lumped constant-type circuit shown in these example embodiments, i.e., an oscillator including a quantum bit having the above-described configuration, can also be expressed as follows. The oscillator includes a GND plane (a GND plane 2006), a conductive member (an electrode 2005), a SQUID (a SQUID 2001), a first connection circuit (air bridge 2007*a*), and a superconducting loop circuit (a superconducting loop 2009). Note that the GND plane is formed of a superconductor. Further, the conductive member is spaced apart from and surrounded by the GND plane. Note that, in this oscillator, a capacitor (a capacitor 2003) is formed by the gap between the GND plane and the conductive member. Further, one end of the SQUID is connected to the conductive member and the other end thereof is connected to the GND plane. The first connection circuit is a superconductor circuit that connects parts of the GND plane located on both sides of the vicinity of the connection part between the conductive member and the SQUID to each other. Further, the superconducting loop circuit is a circuit using the GND plane and the first connection circuit, and surrounds the SQUID. According to the above-described oscillator, it is possible to reduce the effect of the crosstalk that is caused as a current flows through the GND plane by the superconducting loop surrounding the SQUID. Further, in this oscillator, a control line (a control line 2004) may be disposed so that, by a control signal flowing through the control line, two types of magnetic fluxes having magnitudes equal to each other and directions opposite to each other pass through the superconducting loop circuit. This control line is magnetically coupled with the SQUID, and a control signal is input to the control line. Note that the magnitudes of the above-described two types of magnetic fluxes do not have to be exactly equal to each other, and may include some errors. That is, these two types of magnetic fluxes may be those having magnitudes roughly equal to each other. For example, the difference between them may be equal to or smaller than 10% of the magnitude of either one of them. In this way, the occurrence of a shielding current in the superconducting loop circuit, which would otherwise be caused by the input of the control signal to the control line, is suppressed, and the resonance frequency is prevented from being set (i.e., changed) to an unintended frequency.

Further, in particular, the oscillator shown in the fifth example embodiment can also be described as an oscillator having the following features. That is, in the oscillator shown in the fifth example embodiment, the control line is divided into a first branch line and a second branch line at a branch point on the control line. Note that the first branch line is wired along the SQUID, and the second branch line is wired in the direction opposite to the direction of the first branch line. Further, the superconducting loop circuit is a circuit using the GND plane, the first connection circuit, and the first and second branch lines. Further, the length of the first branch line used for the superconducting loop circuit is equal to that of the second branch line used for the superconducting loop circuit. Note that the lengths of the first and second branch lines do not have to be exactly equal to each other, and may include some errors. That is, the lengths of these two lines may be roughly equal to each other. For example, the difference between them may be equal to or smaller than 10% of the length of either one of them. According to this configuration, it is possible to provide an example of a layout of a control line in which, by a control signal flowing through the control line, two types of magnetic fluxes having magnitudes roughly equal to each other and directions opposite to each other pass through the superconducting loop circuit. Note that this oscillator may include a connection circuit that connects parts of the GND plane located on both sides of the control line to each other (such as the air bridge 2007b that connects parts of the GND plane across the control line).

Further, in particular, the oscillator shown in the sixth example embodiment can also be described as an oscillator having the following features. That is, in the oscillator shown in the sixth example embodiment, the control line is wired in a U-shape so as to is folded back in the vicinity of the SQUID. Further, this oscillator also includes a second connection circuit made of a superconductor that connects parts of the GND plane located on both sides of the two straight sections, i.e., the outward and returning sections, of the U-shaped control line to each other (i.e., the air bridge 2007b that connects parts of the GND plane across the control line). Further, the superconducting loop circuit is a circuit using the GND plane and the first and second connection circuits. According to this configuration, it is possible to provide an example of a layout of a control line in which, by a control signal flowing through the control line, two types of magnetic fluxes having magnitudes equal to each other and directions opposite to each other pass through the superconducting loop circuit.

Further, in particular, the oscillator shown in the seventh example embodiment can also be described as an oscillator having the following features. That is, in the oscillator shown in the seventh example embodiment, the control line is wired in a straight line and intersects with a connection conductive member (the electrode 2008) for connecting the other end of the SQUID to the GND plane, or with the SQUID in a three-dimensional manner. Further, this oscillator also includes a second connection circuit made of a superconductor that connects parts of the GND plane located on both sides of the control line to each other (i.e., the air bridges 2007b and 2007c that connect parts of the GND plane across the control line). The second connection circuit is provided on each of both sides of the place where the control line and the connection conductive member, or the control line and the SQUID intersect with each other in a three-dimensional manner. Further, the superconducting loop circuit is a circuit using the GND plane and the first and second connection circuits. According to the above-described configuration, it is possible to provide an example of a layout of a control line in which, by a control signal flowing through the control line, two types of magnetic fluxes having magnitudes equal to each other and directions opposite to each other pass through the superconducting loop circuit.

First Modified Example of Fifth to Seventh Example Embodiments

The below-described modified example can be provided for the above-described fifth to seventh example embodiments. Note that although a modified example of the fifth example embodiment will be described hereinafter, similar modified examples can be implemented for the sixth and seventh example embodiments.

Figure 34:
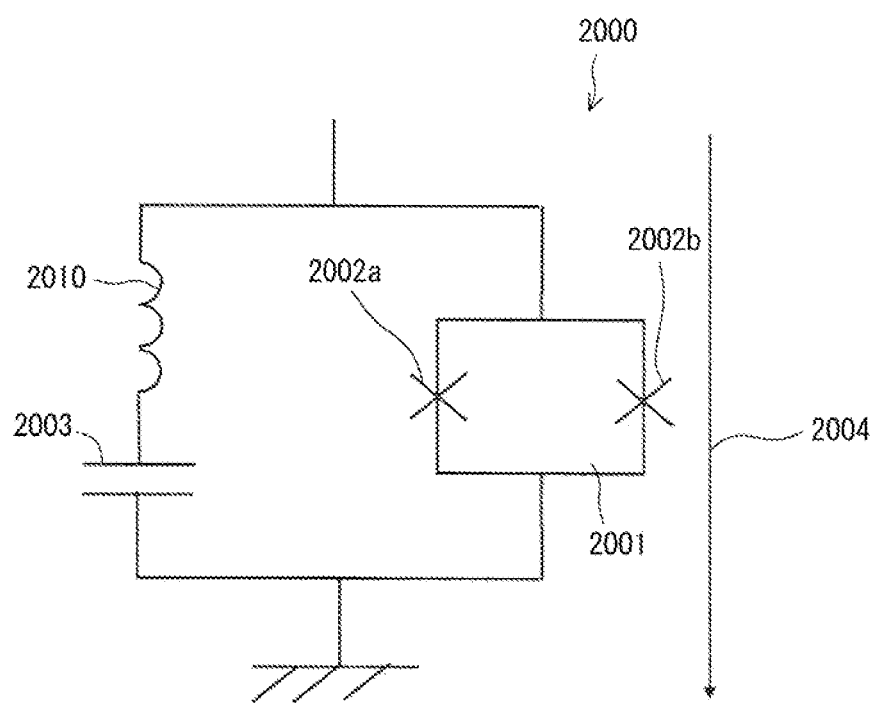
FIG. 34 shows an equivalent circuit of a lumped constant-type superconducting quantum bit according to a first modified example of the fifth example embodiment.
Figure 35:
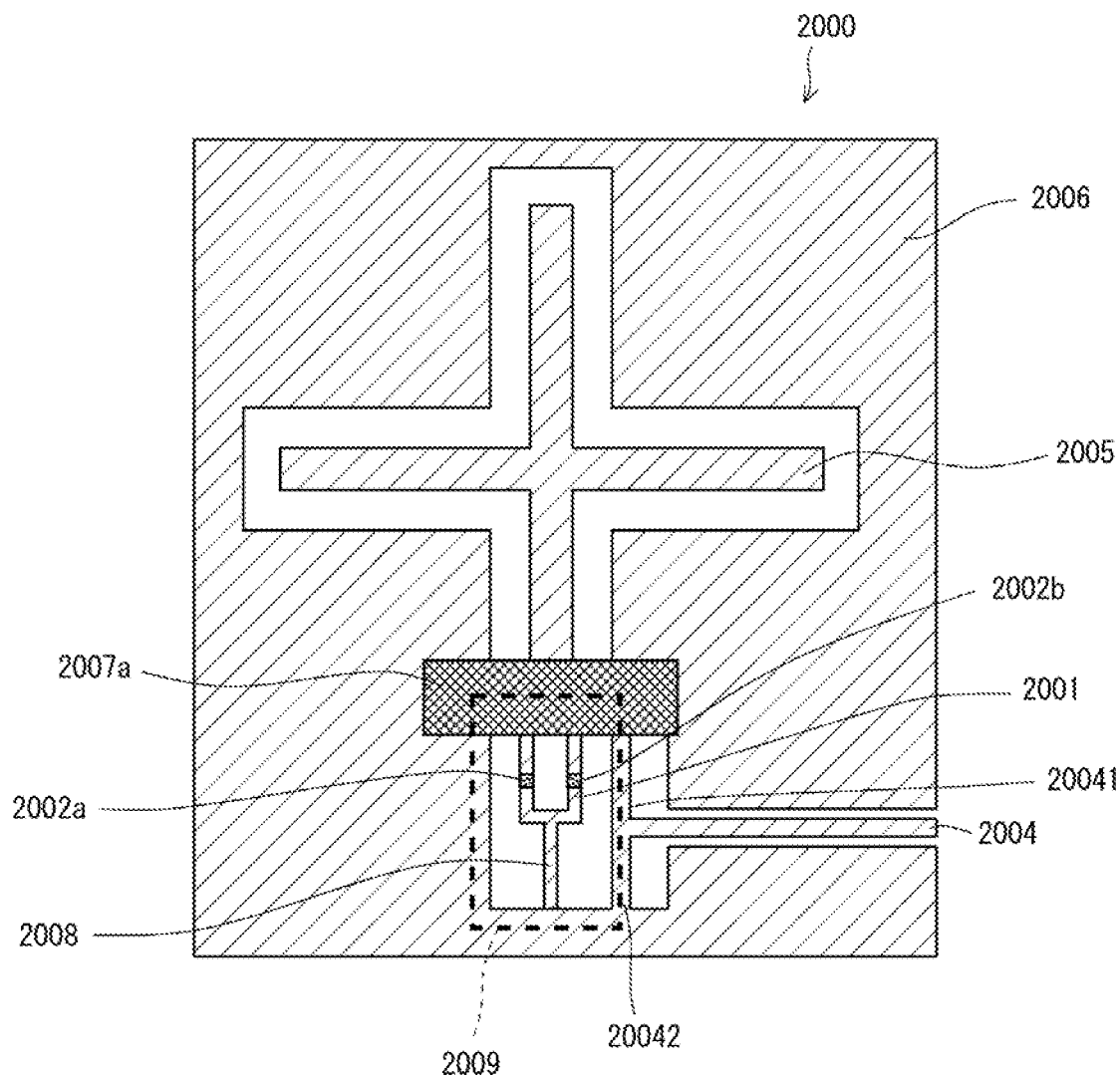
FIG. 35 shows a layout of the lumped constant-type superconducting quantum bit according to the first modified example of the fifth example embodiment.

FIG. 34 shows an equivalent circuit of a lumped constant-type quantum bit 2000 according to a first modified example of the fifth example embodiment. This quantum bit 2000 differs from the lumped constant-type quantum bit 2000 shown in FIG. 27 because a linear inductor 2010 is inserted in the loop formed by the SQUID 2001 and the capacitor 2003. The lumped constant-type quantum bit 2000 shown in FIG. 27 has a problem that its nonlinearity is too high to be applied to a quantum computer. Note that the nonlinearity of a circuit that constitutes a quantum bit is quantified by a coefficient (a nonlinear coefficient) defined by a coefficient of a nonlinear term of a Hamiltonian of the circuit constituting the quantum bit. In the quantum bit 2000 shown in FIG. 34, the nonlinear coefficient can be adjusted by the inductance of the linear inductor 2010. Further, therefore, it is possible to reduce the nonlinearity without increasing the capacitance of the capacitor 2003, and thereby to prevent the loss in the circuit constituting the quantum bit from increasing. FIG. 35 shows a layout of the quantum bit 2000 shown in FIG. 34. The layout shown in FIG. 35 differs from the layout shown in FIG. 29 because the shape of the electrode 2005 is adjusted so that the electrode 2005 has a predetermined linear inductance value. As described above, the electrode 2005 is used as the linear inductor having the predetermined inductance in this modified example. Specifically, in the example shown in FIG. 35, the linear inductance of the electrode 2005 is increased compared to that in the layout shown in FIG. 29 by reducing the width of each of the cross-shaped arms of the electrode 2005 as compared to that in FIG. 29. The layout shown in FIG. 35 is similar to the layout shown in FIG. 29, except for the above-described point. Therefore, in this modified example, the effect of the crosstalk that is caused as a current flows through the GND plane can be reduced, and the resonance frequency can be prevented from being set (i.e., changed) to an unintended frequency due to the shielding current generated in the superconducting loop caused by the control current.

Figure 36:
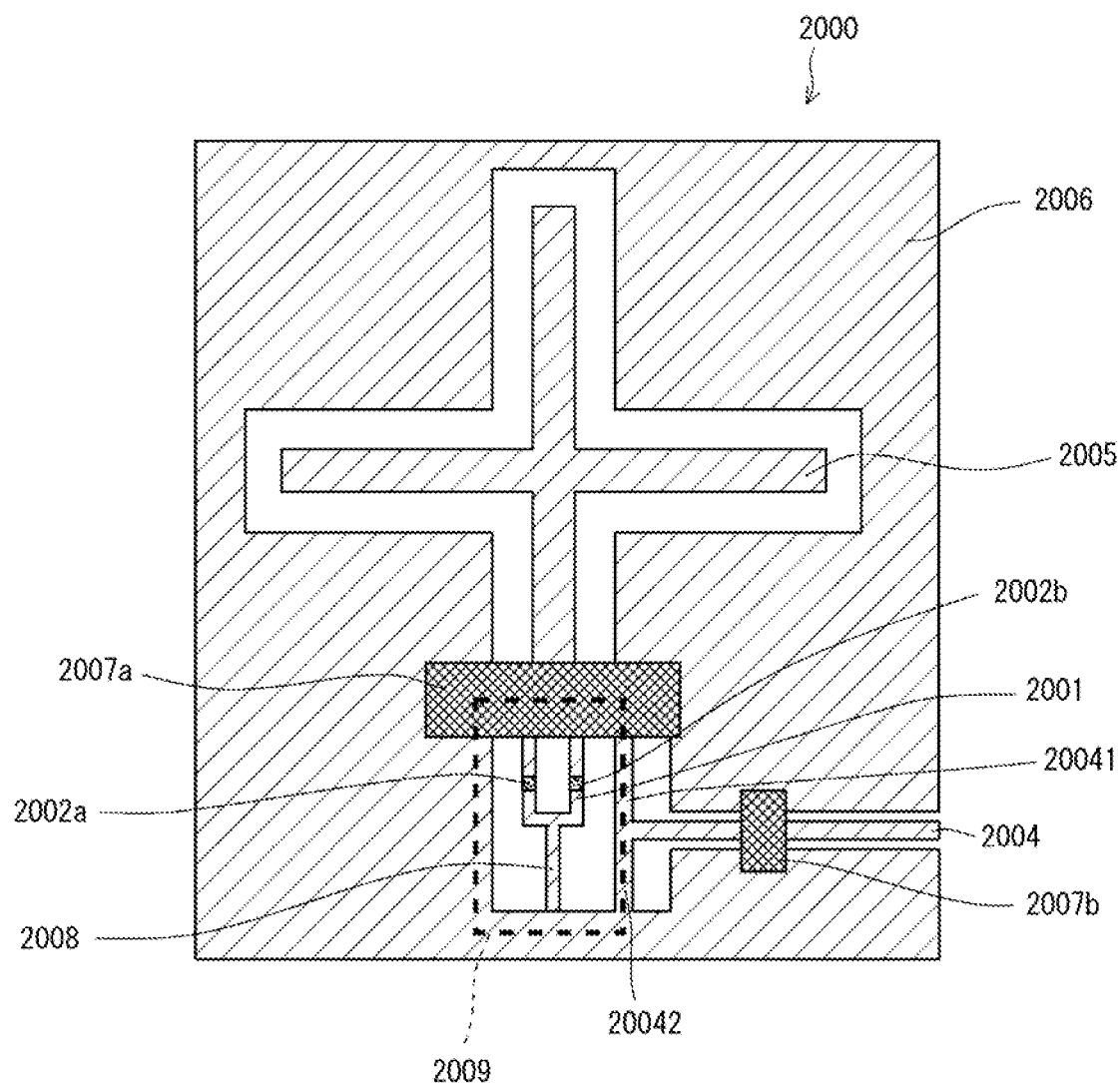
FIG. 36 shows another layout of the lumped constant-type superconducting quantum bit according to the first modified example of the fifth example embodiment.

Note that, as shown in FIG. 36, an air bridge 2007b that connects parts of the GND plane 2006 located on both sides of the core line of the non-branched part of the control line 2004 to each other may be further added.

Second Modified Example of Fifth to Seventh Example Embodiments

The below-described modified example can be provided for the above-described fifth to seventh example embodiments. Note that although a modified example of the fifth example embodiment will be described hereinafter, similar modified examples can be implemented for the sixth and seventh example embodiments.

Figure 37:
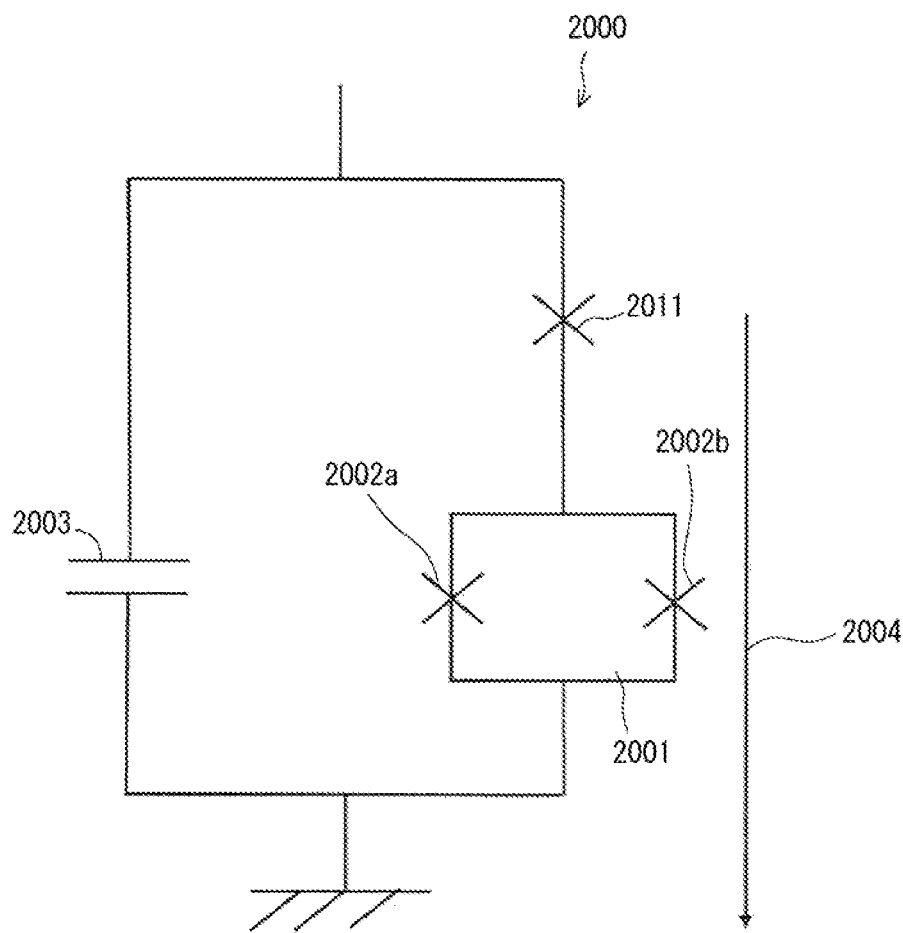
FIG. 37 shows an equivalent circuit of a lumped constant-type superconducting quantum bit according to a second modified example of the fifth example embodiment.
Figure 38:
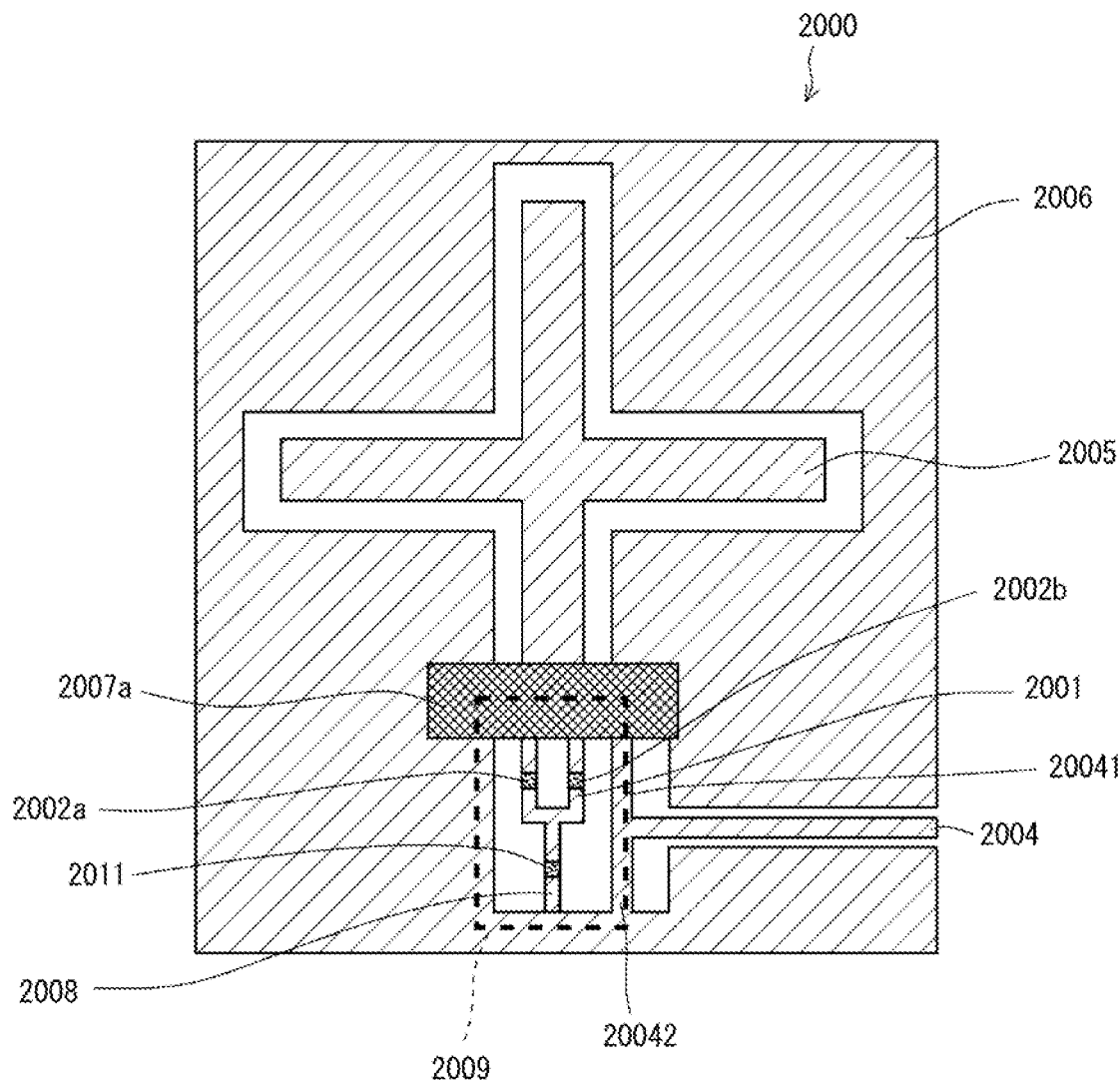
FIG. 38 shows a layout of the lumped constant-type superconducting quantum bit according to the second modified example of the fifth example embodiment.

FIG. 37 shows an equivalent circuit of a lumped constant-type quantum bit 2000 according to a second modified example in accordance with the fifth example embodiment. This quantum bit 2000 differs from the lumped constant-type quantum bit 2000 shown in FIG. 27 because a Josephson junction 2011 is inserted in the loop formed by the SQUID 2001 and the capacitor 2003. As described above, the lumped constant-type quantum bit 2000 shown in FIG. 27 has the problem that its nonlinearity is too high to be applied to a quantum computer. In the quantum bit 2000 shown in FIG. 37, the nonlinear coefficient can be adjusted by adding the Josephson junction 2011 in the loop formed by the SQUID 2001 and the capacitor 2003. Further, since there is no need to increase the capacitance of the capacitor 2003 in order to reduce the nonlinearity, it is also possible to prevent the loss in the circuit constituting the quantum bit from increasing. FIG. 38 shows a layout of the quantum bit 2000 shown in FIG. 37. The layout shown in FIG. 38 differs from the layout shown in FIG. 29 because the Josephson junction 2011 is added in the middle of the narrow electrode 2008. That is, the SQUID 2001 is connected to the GND plane 2006 through the Josephson junction 2011 in this modified example. The layout shown in FIG. 37 is similar to the layout shown in FIG. 29, except for the above-described point. Therefore, in this modified example, the effect of the crosstalk that is caused as a current flows through the GND plane can be reduced, and the resonance frequency can be prevented from being set (i.e., changed) to an unintended frequency due to the shielding current generated in the superconducting loop caused by the control current.

Figure 39:
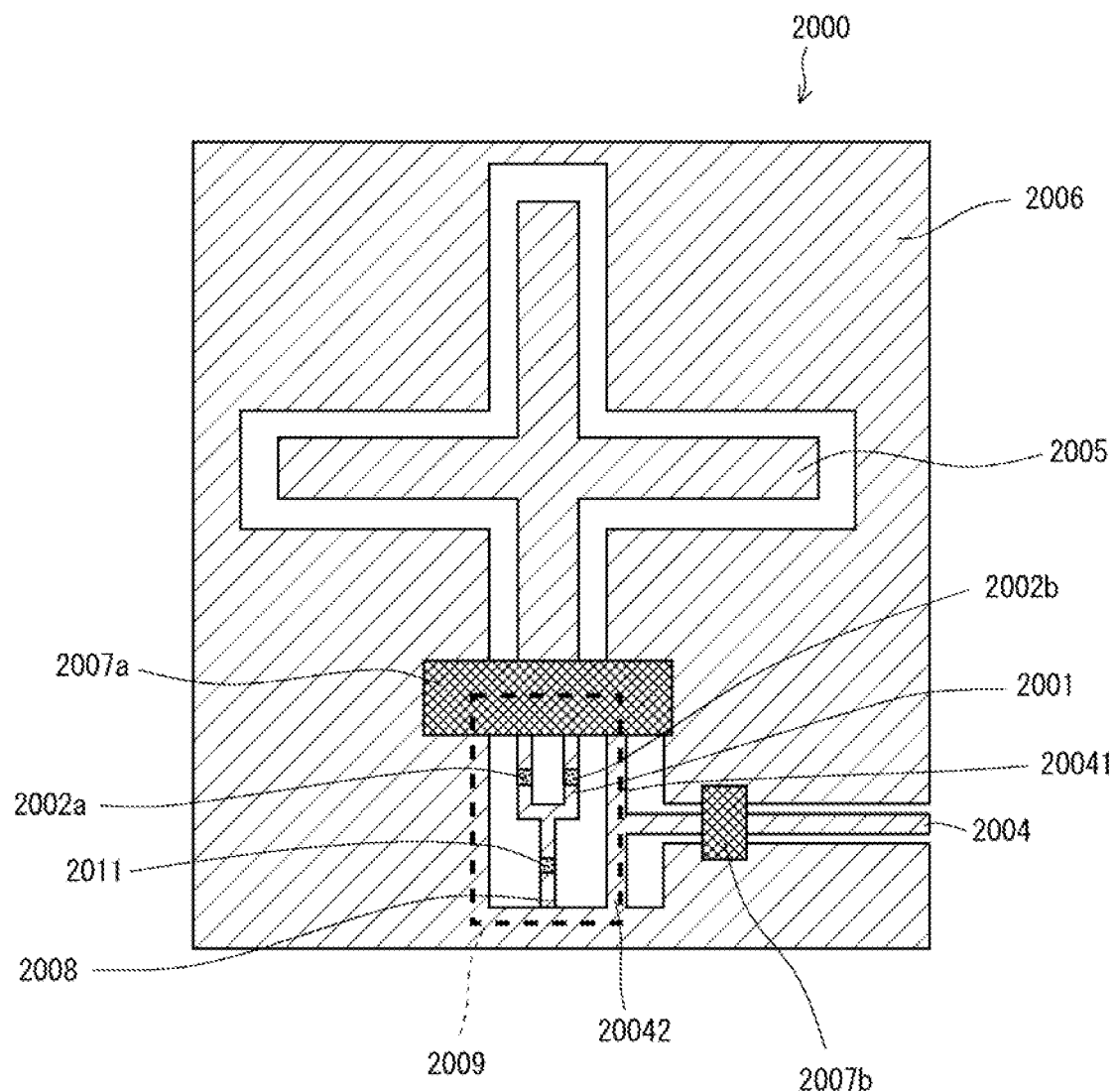
FIG. 39 shows another layout of the lumped constant-type superconducting quantum bit according to the second modified example of the fifth example embodiment.

Note that, as shown in FIG. 39, an air bridge 2007b that connects parts of the GND plane 2006 located on both sides of the core line of the control line 2004 to each other may be further added.

Third Modified Example of Fifth to Seventh Example Embodiments

The below-described modified example can be provided for the above-described fifth to seventh example embodiments. This modified example differs from the above-described fifth to seventh example embodiments because the critical current values of two Josephson junctions 2002a and 2002b constituting the SQUID 2001 are set to values different from each other. By using the above-described configuration, it is possible to provide an inflection point in a function that represents a relationship between the resonance frequency of the loop circuit formed by the SQUID 2001 and the capacitor 2003 and the magnetic field applied to the SQUID 2001 (i.e., a function that represents the dependence of the resonance frequency on the magnetic field). Therefore, by operating the quantum bit 2000 while setting this inflection point as the operating point, it is possible to suppress the imbalance of the changes of the resonance frequency caused by the periodic changes of the magnetic field caused by the AC (Alternating Current) control signal. Therefore, it is possible to reduce the adverse effect which is caused when changes in the resonance frequency are unbalanced. Note that, for example, the area (i.e., the size) of the Josephson junction may be changed in order to change the critical current value of the Josephson junction. That is, by using two Josephson junctions having areas (i.e., sizes) different from each other, it is possible to realize Josephson junctions 2002a and 2002b having critical current values different from each other.

Therefore, in this modified example, the effect of the crosstalk that is caused as a current flows through the GND plane can be reduced, and the resonance frequency can be prevented from being set (i.e., changed) to an unintended frequency due to the shielding current generated in the superconducting loop caused by the control current.

Note that, in this modified example, an air bridge 2007b that connects parts of the GND plane 2006 located on both sides of the core line of the control line 2004 to each other may also be further added.

Eighth Example Embodiment

A distributed constant-type or lumped constant-type quantum bit formed on a chip has been described so far. However, a configuration for reducing crosstalk may be realized in a configuration in which a chip including a quantum circuit formed therein is flip-chip connected to a substrate such as an interposer. That is, instead of using the air bridges as described above, bumps for connecting a chip to a substrate and wiring lines provided on the substrate may be used. Such a configuration will be described as an eighth example embodiment. Note that the flip-chip connection may also be referred to as flip-chip mounting.

Figure 40:
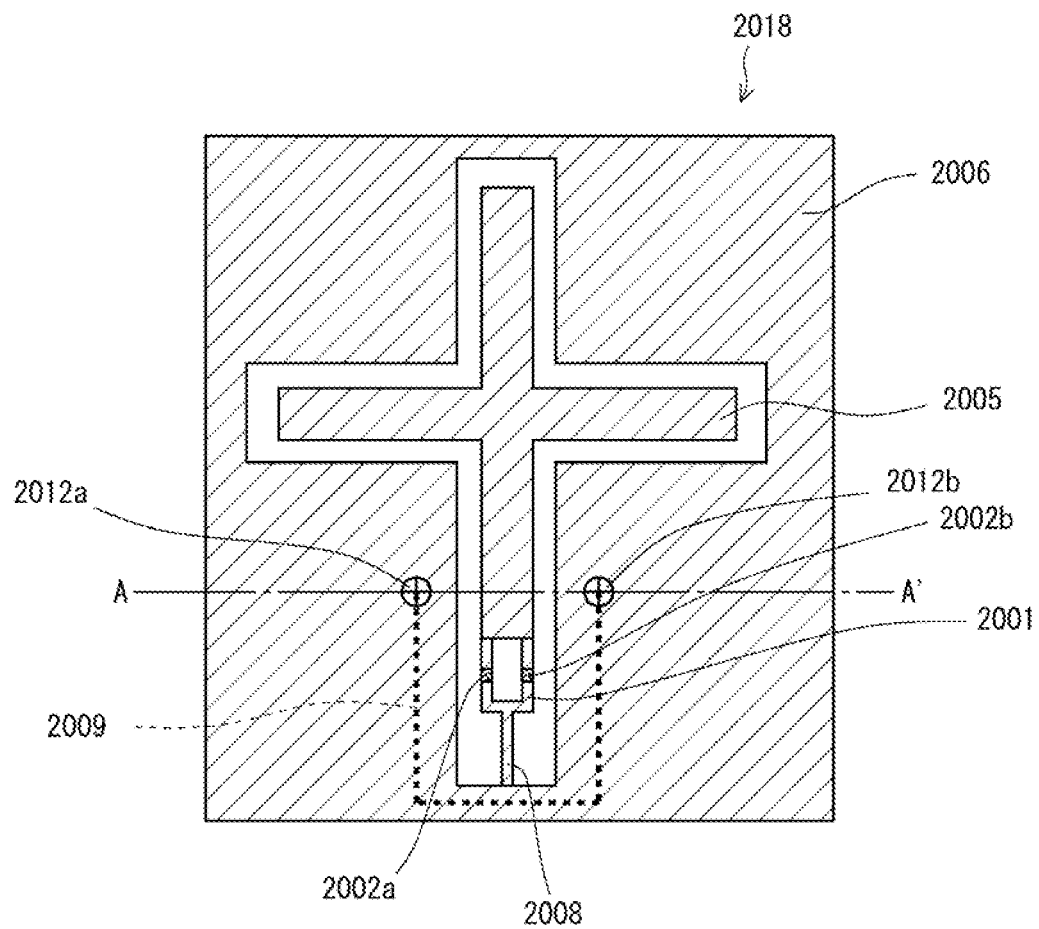
FIG. 40 shows a layout of a chip on which a part of a quantum bit according to an eighth example embodiment is formed.

In this example embodiment, the circuit described in the fifth example embodiment is realized in a configuration in which a chip 2018 is flip-chip connected to a substrate 2019. FIG. 40 shows the chip 2018 on which a part of a quantum bit 2000 is formed. On this chip 2018, a GND plane 2006, an electrode 2005, a SQUID 2001, and the like are formed by using a superconducting material. Since the arrangement of these components are similar to that in the fifth example embodiment, the description thereof is omitted. The equivalent circuit of the circuit according to this example embodiment is similar to that shown in FIG. 27, and a part of this equivalent circuit is formed on the chip 2018. Specifically, the GND plane 2006, the electrode 2005, the SQUID 2001, and the electrode 2008 are formed on the chip 2018. Further, on the chip 2018, a capacitor 2003 is formed by the gap between the GND plane 2006 and the electrode 2005. The chip 2018 is flip-chip connected to a substrate such as an interposer by using bumps, and symbols 2012a and 2012b in FIG. 40 indicate places at which these bumps are connected. As shown in FIG. 40, these bumps (bumps 2022a and 2022b described later) are provided on both sides of the vicinity of the connection part between the electrode 2005 and the SQUID 2001. That is, the positions of these bumps correspond to the places at which the air bridge 2007a connects parts of the GND plane 2006 to each other in the fifth example embodiment.

Figure 41:
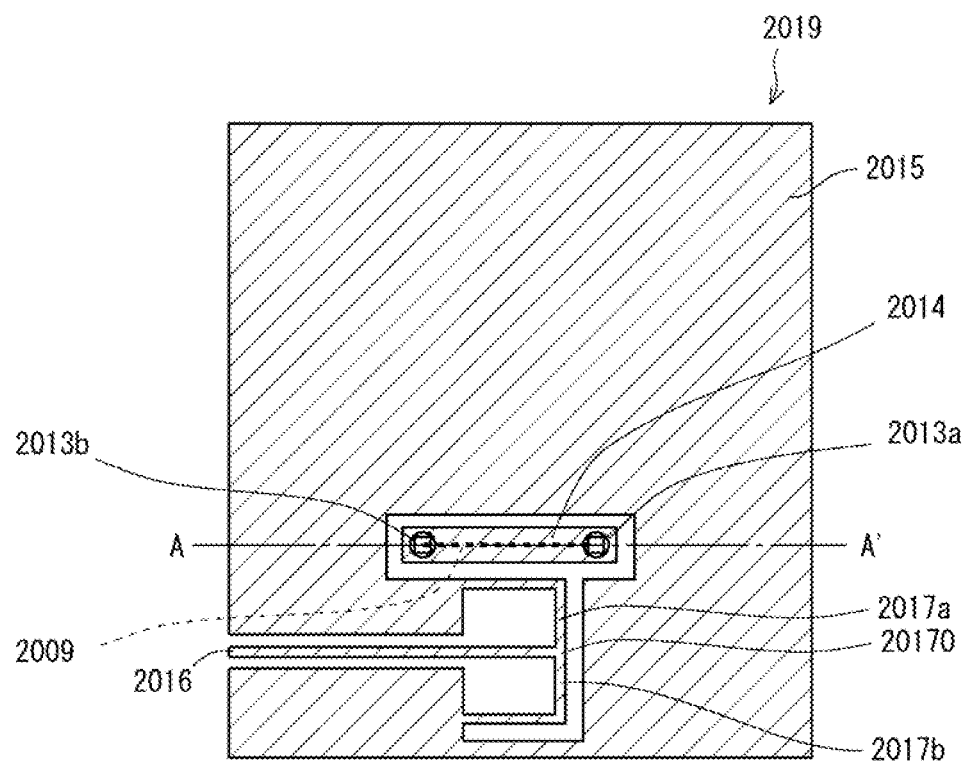
FIG. 41 shows a layout of a substrate on which a part of a quantum bit according to the eighth example embodiment is formed.

FIG. 41 shows the substrate 2019 such as an interposer to which the chip 2018 is flip-chip connected. In the flip-chip connection, the chip 2018 shown in FIG. 40 and the substrate 2019 shown in FIG. 41 are connected to each other through the bumps (the bumps 2022a and 2022b described later) so that the surface of the chip 2018 and the surface of the substrate 2019 are opposed to each other. On the substrate 2019, a GND plane 2015 of the substrate and a control line 2016 are formed by using a superconducting material. The tip of the control line 2016 separates into a first branch line 2017a and a second branch line 2017b at a branch point 20170. Further, the first branch line 2017a is disposed near the SQUID 2001 so that the first branch line 2017a and the SQUID 2001 magnetically couple with each other. Meanwhile, the second branch line 2017b is disposed far from the SQUID 2001 in order to prevent the second branch line 2017b and the SQUID 2001 magnetically coupling with each other. Specifically, in order to make the first branch line 2017a and the SQUID 2001 magnetically couple with each other while preventing the second branch line 2017b and the SQUID 2001 from magnetically couple with each other, these branch lines are wired (i.e., routed) as follows. That is, the first branch line 2017a of the substrate 2019 is wired along the SQUID 2001 of the chip 2018, and the second branch line 2017b of the substrate 2019 is wired along the electrode 2008 of the chip 2018 in the direction opposite to the direction of the first branch line 2017a. The first and second branch lines 2017a and 2017b are both connected to the GND plane 2015. The first and second branch lines 2017a and 2017b are lines symmetrical to each other in the left/right direction, and in the example shown in FIG. 41, they are shaped so as to curve in directions opposite to each other. Specifically, the first and second branch lines 2017a and 2017b extend a predetermined length from the branch point 20170 in a first direction (the up/down direction in the drawing), and then their tips extend a predetermined length in the direction in which the non-branched part of the control line 2016 extends from the branch point 20170 (i.e., the left direction in the drawing). That is, in the example shown in FIG. 41, the first and second branch lines 2017a and 2017b are folded back in the direction in which the non-branched part extends. However, the above-described configuration is merely an example, and the first and second branch lines 2017a and 2017b may not be folded back. That is, the control line 2016 may be a T-shaped line that separates into the first and second branch lines 2017a and 2017b at the branch point 20170. Note that the non-branched part of the control line 2016 means the part of the control line 2016 other than the first and second branch lines 2017a and 2017b. The non-branched part of the control line 2016 extends in a second direction (the left/right direction in the drawing) in the vicinity of the SQUID 2001. Specifically, in the example shown here, as can be seen in FIGS. 40 and 41, the non-branched part of the control line 2016 extends so as to cross the connection part between the SQUID 2001 and the electrode 2008.

In FIG. 41, symbols 2013a and 2013b indicate places at which the above-described bumps are connected. Note that although the connection places of the bumps indicated by the symbols 2013a and 2013b are located inside the bridge electrode (the conductive member) 2014 around which a gap is provided in the example shown in FIG. 41, the gap does not necessarily have to be provided around the bridge electrode 2014. That is, the bumps may be connected to the GND plane 2015. Note that the bridge electrode 2014 is made of a superconductor.

Figure 42:
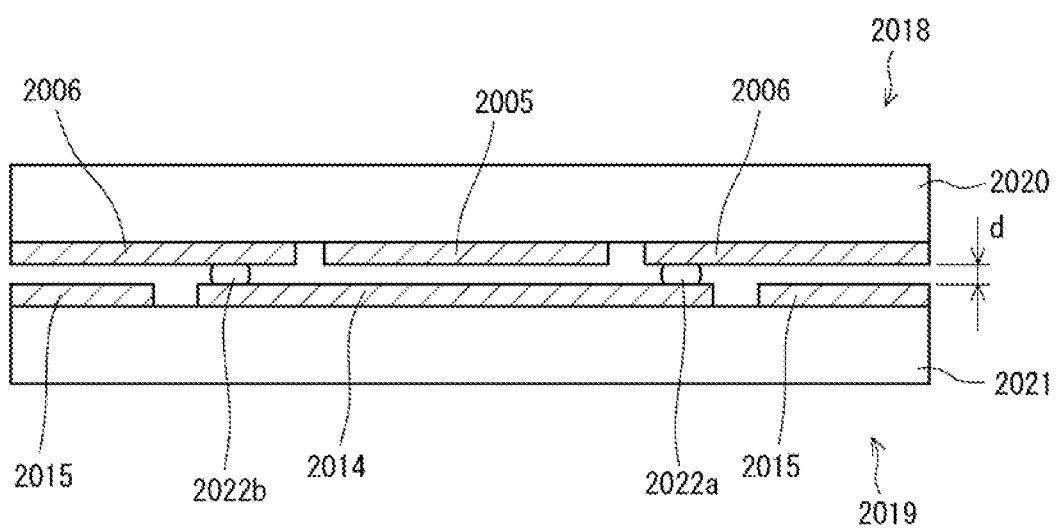
FIG. 42 is a cross-sectional diagram of a structure in which a chip on which a part of a quantum bit according to the eighth example embodiment is formed and a substrate are flip-chip connected to each other.

FIG. 42 shows a cross-sectional diagram of a structure in which the chip 2018 and the substrate 2019 are flip-chip connected to each other by using the bumps 2022a and 2022b. Specifically, it shows a cross-sectional diagram taken along a line A-A' in FIGS. 40 and 41. Note that, in FIG. 42, a symbol 2020 indicates a silicon substrate of the chip 2018, and a symbol 2021 indicates a silicon substrate of the substrate 2019. Further, as shown in FIG. 42, the distance between the chip 2018 and the substrate 2019 is represented by d. Further, although it is not explicitly shown in FIG. 42, the substrate 2019 may further include TSVs (Through Silicon Vias; through silicon electrode). The TSVs can, for example, serve to electrically connect a GND plane formed on the rear surface of the substrate 2019 (the bottom side (i.e., the underside) of the substrate 2019 in FIG. 42) to a GND plane 2015 formed on the front surface of the substrate 2019 (the top side of the substrate 2019 in FIG. 42). The TSVs can serve to electrically connect, for example, a control line formed on the rear surface of the substrate 2019 to a control line 2016 formed on the front surface of the substrate 2019. As shown in FIG. 42, an electrically-connected circuit expressed as "the GND plane 2006 of the chip 2018-the bump 2022a-the bridge electrode 2014 of the substrate 2019-the bump 2022b-the GND plane 2006 of the chip 2018" is formed, and this circuit provides a function similar to that of the air bridge. Therefore, a superconducting loop 2009 that surrounds the outside of the SQUID 2001 is formed by using the GND plane 2006 of the chip 2018, the bumps 2022a and 2022b, and the bridge electrode 2014 of the substrate 2019. Therefore, in this example embodiment, it is also possible to reduce the effect of the crosstalk that is caused as a current flows through the GND plane.

Note that when a control signal is input from the control line 2016 shown in FIG. 41, the control signal is divided and flows into the first and second branch lines 2017a and 2017b. Since the first branch line 2017a is positioned directly below the SQUID 2001 in FIG. 40, the SQUID 2001 senses (i.e., is affected by) the magnetic flux generated by the current flowing through the first branch line 2017a. Meanwhile, since the second branch line 2017b is not positioned directly below the SQUID 2001, the current flowing through the second branch line 2017b hardly affects the SQUID 2001. Further, since the first and second branch lines 2017a and 2017b are shaped so as to curve in directions opposite to each other, the magnetic fluxes generated by the currents flowing through the first and second branch line 2017a and 2017b have, inside the two branch lines, magnitudes equal to each other and directions opposite to each other. Therefore, in this example embodiment, the resonance frequency can also be prevented from being set (i.e., changed) to an unintended frequency due to the shielding current generated in the superconducting loop caused by the control current.

Note that, in FIGS. 40 to 42, an example in which a lumped constant-type quantum bit having a configuration in which a control line separates into branches as in the case of the fifth example embodiment is shown. However, the configuration using flip-chip connection can also be applied to the previously-described various quantum bits in a similar manner. For example, the configuration using flip-chip connection can also be applied to a lumped constant-type quantum bit using a control line having other shapes, or to a distributed constant-type quantum bit. Some examples of such other configurations of quantum bits using flip-chip connection will be described hereinafter.

Figure 43:
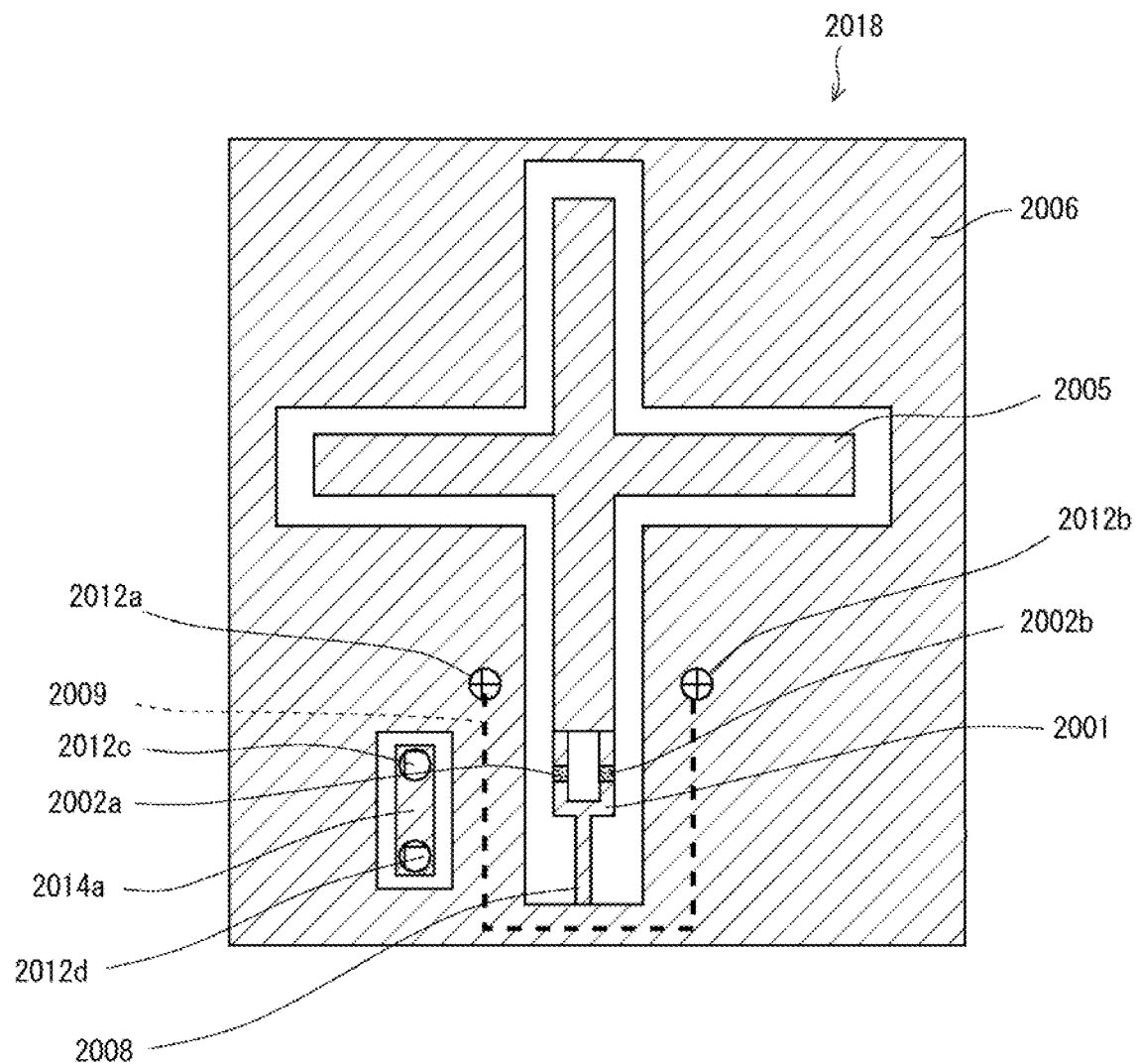
FIG. 43 shows a layout of a chip on which GND planes on both sides of a control line are connected to each other.
Figure 44:
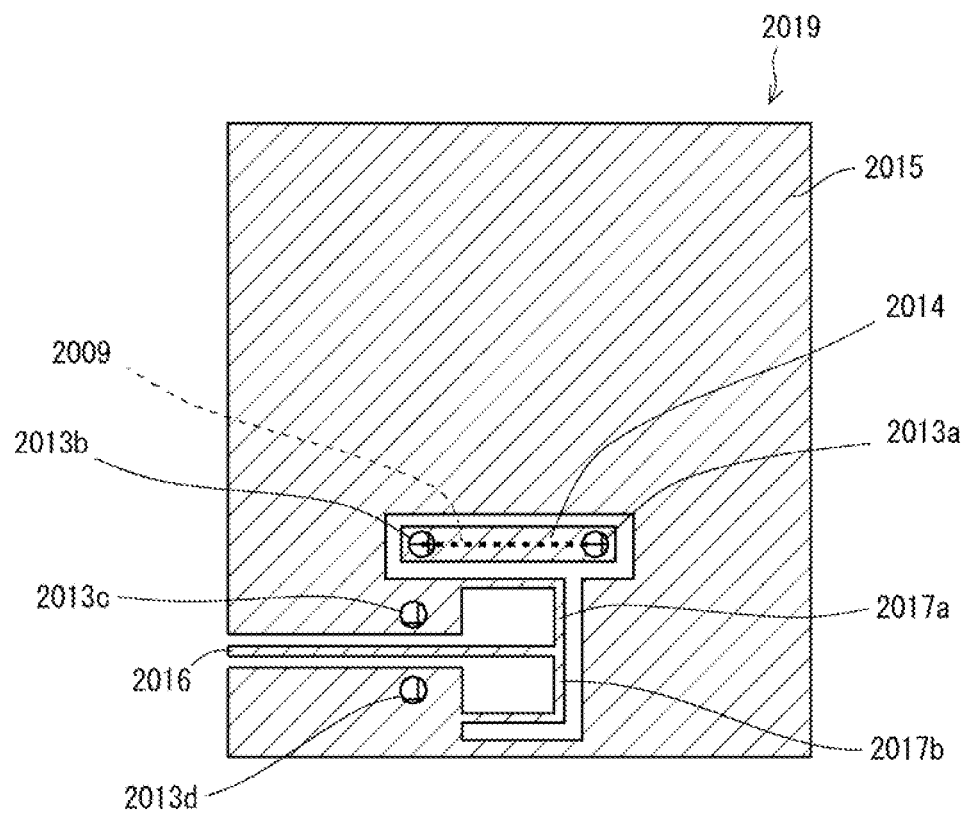
FIG. 44 shows a layout of a substrate in which GND planes on both sides of a control line are connected to each other.

A configuration of a chip and a substrate in which parts of a GND plane located on both sides of a control line are connected to each other as shown in FIG. 30 will be described. FIG. 43 shows a layout of a chip in a case where parts of a GND plane located on both sides of a control line are connected to each other. Further, FIG. 44 shows a layout of a substrate in a case where parts of a GND plane located on both sides of a control line are connected to each other. Differences from those shown in above-described FIGS. 40 and 41 will be described hereinafter. To realize the connection between parts of the GND plane 2015 on both sides of the control line 2016, bumps for connecting the parts of the GND plane 2015 on both sides of the control line 2016 on the substrate 2019 to the bridge electrodes (the conductive members) 2014a of the chip 2018 are provided between the chip 2018 and the substrate 2019. In FIG. 43, symbols 2012c and 2012d indicate the connection places of these bumps on the chip 2018. Further, in FIG. 44, symbols 2013c and 2013d indicate the connection places of these bumps on the substrate 2019. Note that although the connection places of the bumps are located inside the bridge electrode 2014a around which a gap is provided in the example shown in FIG. 43, the gap does not necessarily have to be provided around the bridge electrode 2014a. That is, the bumps may be connected to the GND plane 2006. Note that the bridge electrode 2014a is made of a superconductor. Therefore, the above-described bumps and the bridge electrode 2014a of the chip 2018 can serve as the air bridge 2007b in FIG. 30. As described above, by flip-chip connecting the chip shown in FIG. 43 and the substrate shown in FIG. 44 to each other, a configuration similar to that in the example embodiment shown in FIG. 30 can be realized by a three-dimensional circuit, and advantageous effects similar to those in the example embodiment in FIG. 30 can be obtained.

Figure 45:
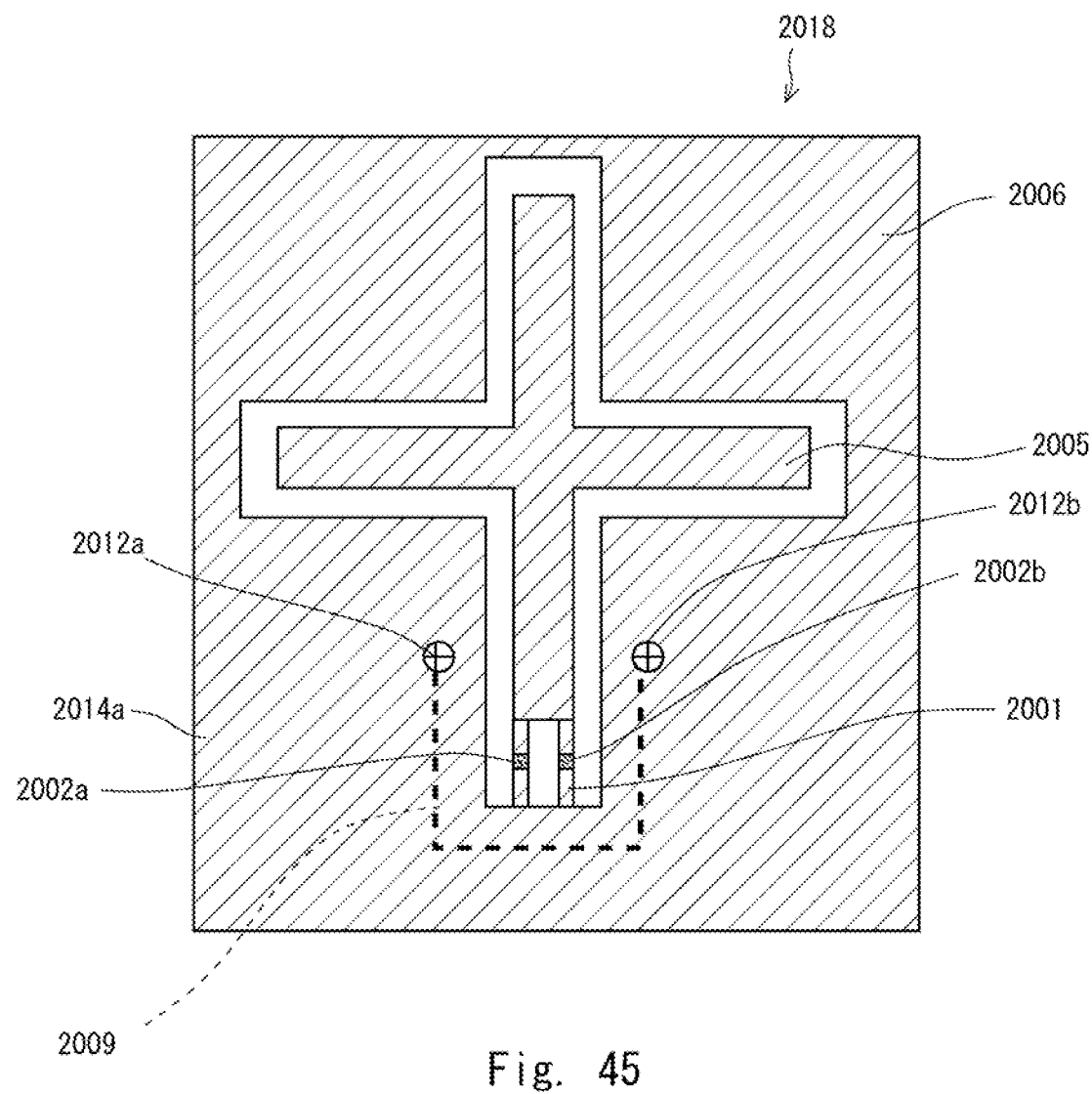
FIG. 45 shows a layout of a chip on which a U-shaped control line is used.
Figure 46:
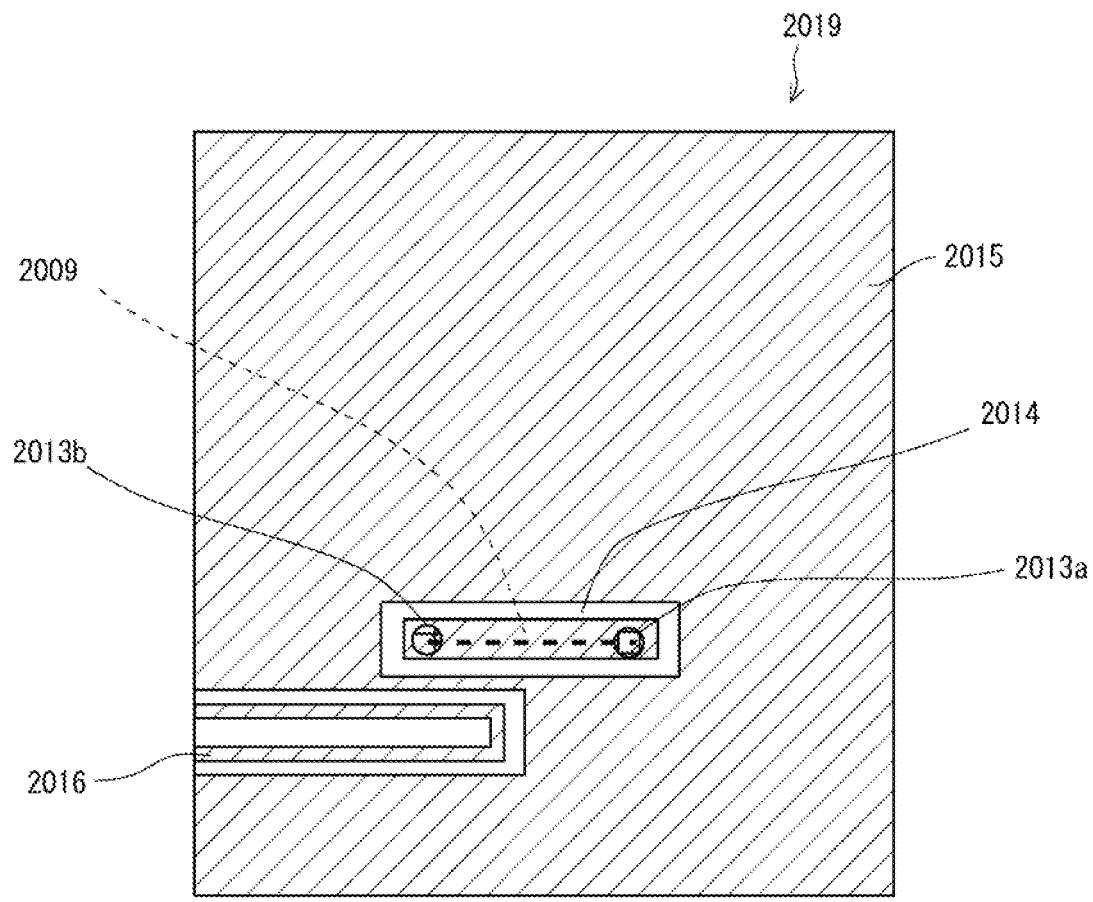
FIG. 46 shows a layout of a substrate in which a U-shaped control line is used.

Next, a configuration of a chip and a substrate in which a U-shaped control line is used as shown in FIG. 32 will be described. FIG. 45 shows a layout on a chip in which a U-shaped control line is used. Further, FIG. 46 shows a layout on a substrate in which a U-shaped control line is used. Differences from those shown in above-described FIGS. 40 and 41 will be described hereinafter.

FIG. 45 shows a chip 2018 on which a part of a quantum bit 2000 is formed. On this chip 2018, a GND plane 2006, an electrode 2005, and a SQUID 2001 are formed by using a superconducting material. Since the arrangement of these components are similar to that in the sixth example embodiment, the description thereof is omitted. In FIG. 45, symbols 2012a and 2012b indicate places at which bumps are connected, and these places are similar to those shown in FIG. 40.

FIG. 46 shows a substrate 2019 such as an interposer to which the chip 2018 is flip-chip connected. On the substrate 2019, a GND plane 2015 of the substrate and a control line 2016 are formed by using a superconducting material. When the projection of the later-described superconducting loop 2009 onto the substrate 2019 is considered, the control line 2016 has such a shape that it enters the projected superconductor loop 2009 from the outside thereof, is folded back inside the superconductor loop 2009, and then goes out from the superconductor loop 2009 again. That is, the control line 2016 is wired in a U-shape so that it is folded back in the vicinity of the SQUID 2001. The control line 2016 extends in a second direction (the left/right direction in the drawing) in the vicinity of the SQUID 2001, and is folded back in the vicinity of the SQUID 2001.

In FIG. 46, symbols 2013a and 2013b indicate places at which the above-described bumps are connected. Note that although the connection places of the bumps indicated by the symbols 2013a and 2013b are located inside the bridge electrode (the conductive member) 2014 around which a gap is provided in the example shown in FIG. 46, the gap does not necessarily have to be provided around the bridge electrode 2014. That is, the bumps may be connected to the GND plane 2015. Note that the bridge electrode 2014 is made of a superconductor.

As can be seen from FIGS. 45 and 46, an electrically-connected circuit expressed as "the GND plane 2006 of the chip 2018-the bump-the bridge electrode 2014 of the substrate 2019-the bump-the GND plane 2006 of the chip 2018" is formed. Therefore, a superconducting loop 2009 that surrounds the outside of the SQUID 2001 is formed by using the GND plane 2006 of the chip 2018, the bumps, and the bridge electrode 2014 of the substrate 2019. Note that, as obvious from the above-described fact, in the configuration using flip-chip connection, the structure that serves as the air bridge 2007b in FIG. 32 is unnecessary.

As described above, by flip-chip connecting the chip shown in FIG. 45 to the substrate shown in FIG. 46 to each other, a configuration similar to that in the sixth example embodiment can be realized by a three-dimensional circuit, and advantageous effects similar to those in the sixth example embodiment can be obtained.

Figure 47:
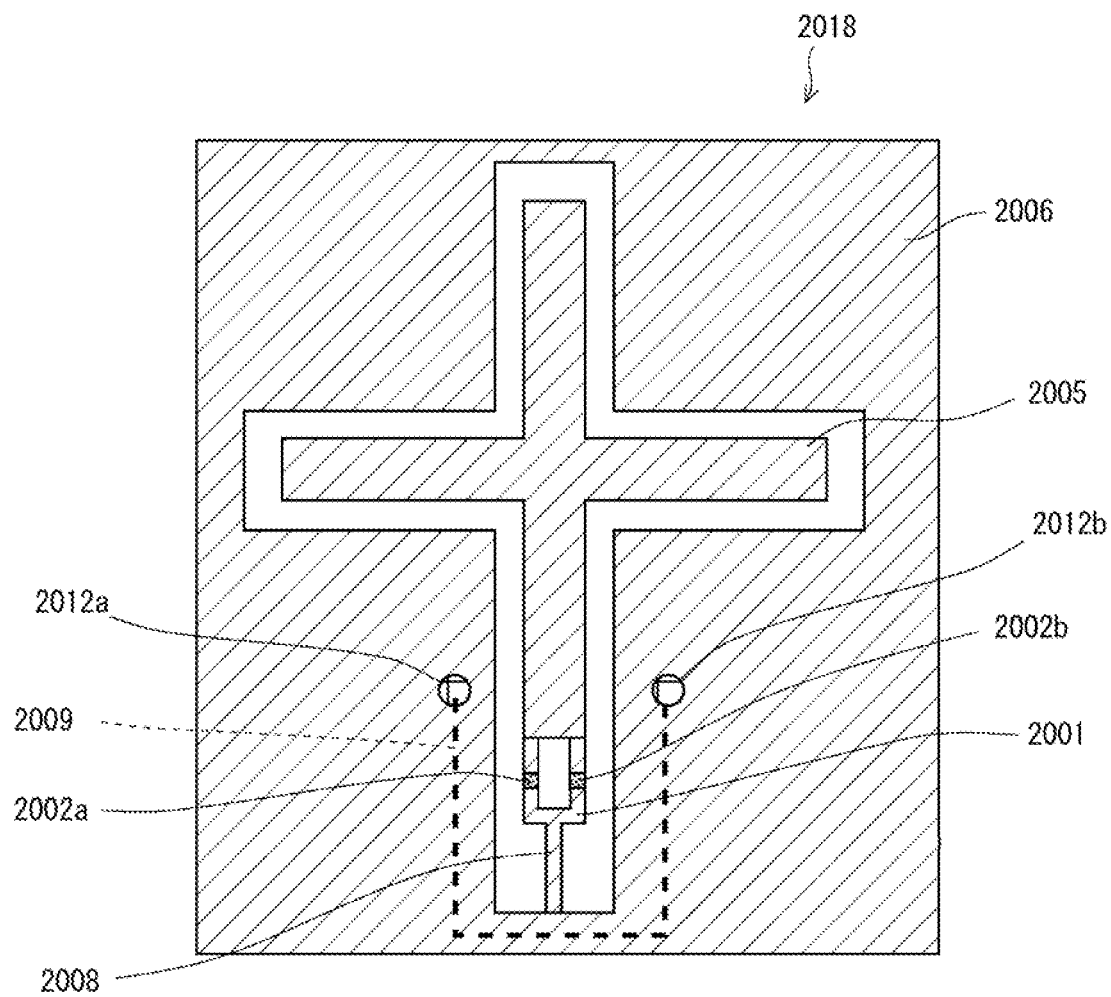
FIG. 47 shows a layout of a chip on which a straight control line is used.
Figure 48:
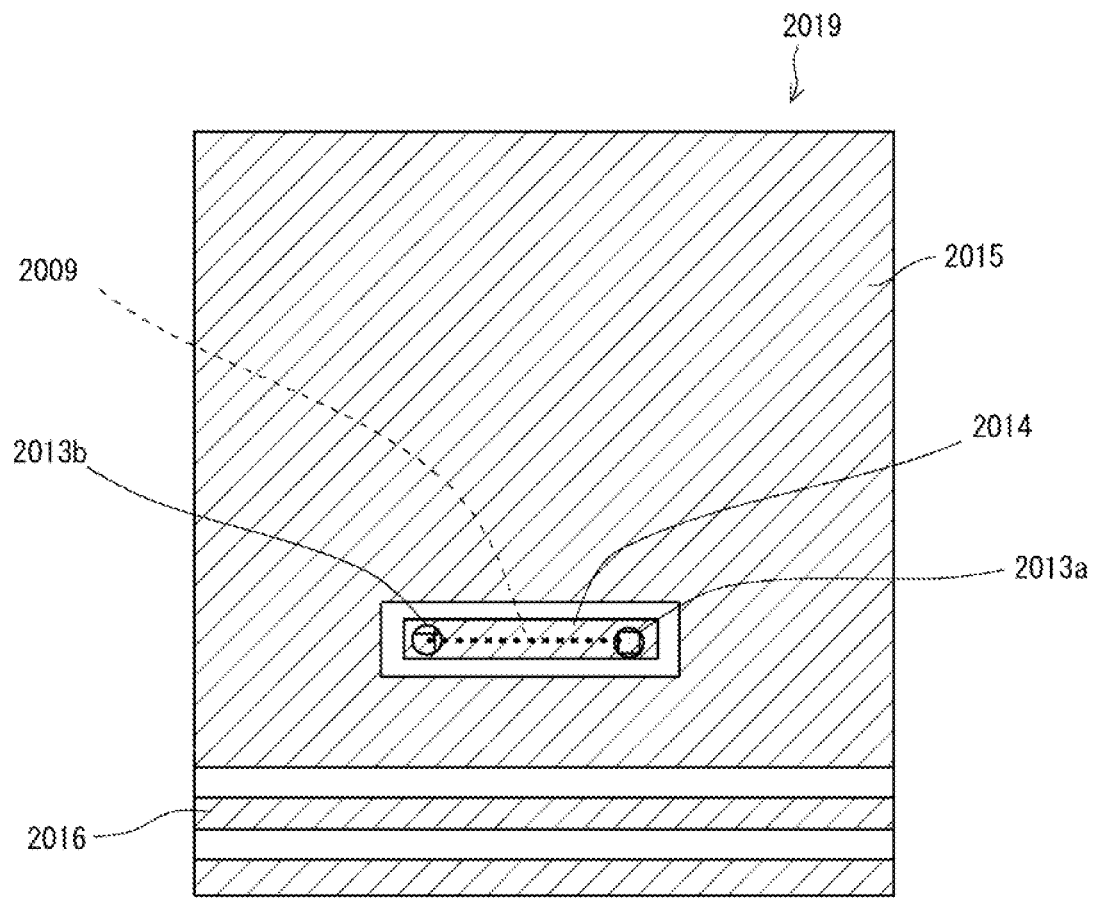
FIG. 48 shows a layout of a substrate in which a straight control line is used.

Next, a configuration of a chip and a substrate in which a straight control line is used as shown in FIG. 33 will be described. FIG. 47 shows a layout on a chip in which a straight control line is used. Further, FIG. 48 shows a layout on a substrate in which a straight control line is used. Differences from those shown in above-described FIGS. 40 and 41 will be described hereinafter.

FIG. 47 shows a chip 2018 on which a part of a quantum bit 2000 is formed. On this chip 2018, a GND plane 2006, an electrode 2005, a SQUID 2001, and an electrode 2008 are formed by using a superconducting material. Since the arrangement of these components are similar to that in the seventh example embodiment, the description thereof is omitted. In FIG. 47, symbols 2012a and 2012b indicate places at which bumps are connected, and these places are similar to those shown in FIG. 40.

FIG. 48 shows a substrate 2019 such as an interposer to which the chip 2018 is flip-chip connected. On the substrate 2019, a GND plane 2015 of the substrate and a control line 2016 are formed by using a superconducting material. When the projection of the later-described superconducting loop 2009 onto the substrate 2019 is considered, the control line 2016 has such a shape that it enters the projected superconductor loop 2009 from the outside thereof, and then goes out from the superconductor loop 2009 again. That is, the control line 2016 is wired in a straight line above the electrode 2008 connected to the SQUID 2001, or above the SQUID 2001. The control line 2016 extends in a second direction (the left/right direction in the drawing) in the vicinity of the SQUID 2001 while intersecting the electrode 2008 or the SQUID 2001 in a three-dimensional manner (i.e., like an overpass). In other words, the control line 2016 is wired so as to cross over (i.e., cross above) the electrode 2008 or the SQUID 2001 in a direction intersecting the direction in which the electrode 2005 and the SQUID 2001 are arranged.

In FIG. 48, symbols 2013a and 2013b indicate places at which the above-described bumps are connected. Note that although the connection places of the bumps indicated by the symbols 2013a and 2013b are located inside the bridge electrode (the conductive member) 2014 around which a gap is provided in the example shown in FIG. 48, the gap does not necessarily have to be provided around the bridge electrode 2014. That is, the bumps may be connected to the GND plane 2015. Note that the bridge electrode 2014 is made of a superconductor.

As can be seen in FIGS. 47 and 48, an electrically-connected circuit expressed as "the GND plane 2006 of the chip 2018-the bump-the bridge electrode 2014 of the substrate 2019-the bump-the GND plane 2006 of the chip 2018" is formed. Therefore, a superconducting loop 2009 that surrounds the outside of the SQUID 2001 is formed by using the GND plane 2006 of the chip 2018, the bumps, and the bridge electrode 2014 of the substrate 2019. Note that, as obvious from the above-described fact, in the configuration using flip-chip connection, the structure that serves as the air bridges 2007b and 2007c in FIG. 33 is unnecessary.

As described above, by flip-chip connecting the chip shown in FIG. 47 to the substrate shown in FIG. 48 to each other, a configuration similar to that in the seventh example embodiment can be realized by a three-dimensional circuit, and advantageous effects similar to those in the seventh example embodiment can be obtained.

Ninth Example Embodiment

Another example embodiment of a configuration in which a chip 2018 is flip-chip connected to a substrate 2019 will be described as a ninth example embodiment. Before describing details of the ninth example embodiment, firstly, the eighth example embodiment will be examined.

Figure 49:
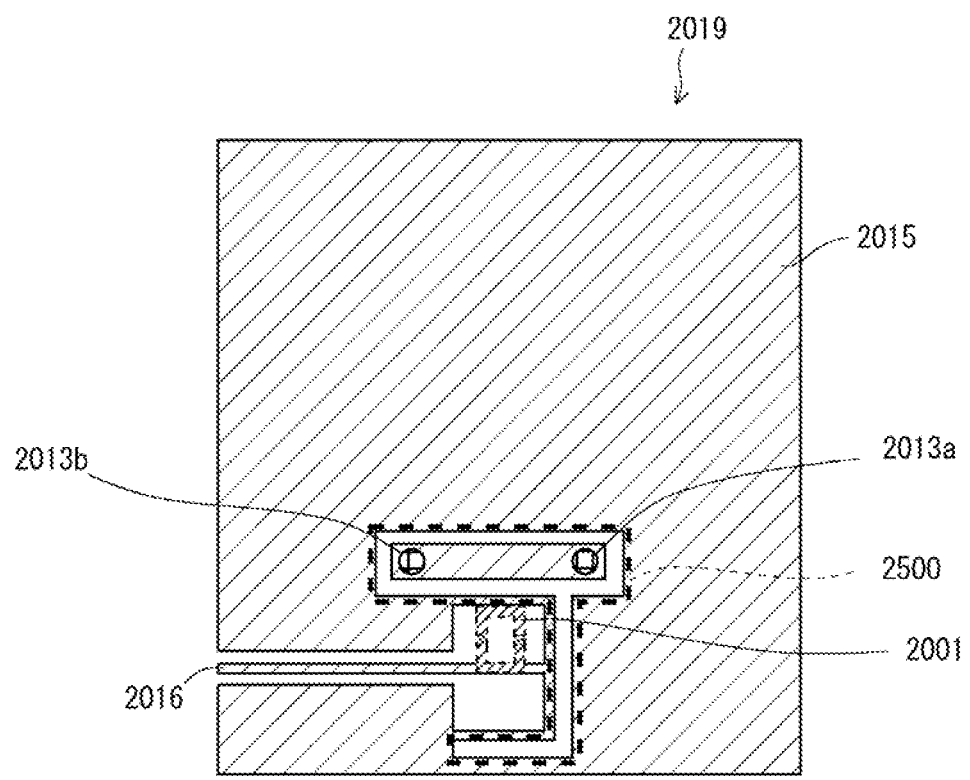
FIG. 49 is a diagram that is obtained by adding a drawing for explanation in the layout shown in FIG. 41.

FIG. 49 is a diagram that is obtained by adding a drawing for explanation in the layout shown in FIG. 41. Specifically, it is a diagram in which a drawing in which the SQUID 2001 of the chip 2018 is projected onto the substrate 2019 is added. Note that a drawing in which the SQUID 2001 of the chip 2018 is projected onto the substrate 2019 is added is also added in some of the later-described drawings.

As shown in FIG. 49, on a substrate 2019 according to the eighth example embodiment, a superconducting loop 2500, which is closed on the substrate 2019, is formed. This superconducting loop 2500 is a superconducting loop different from any of the superconducting loops 2009 described above. In the configuration where the chip 2018 is flip-chip connected to the substrate 2019, when the quantum circuit is operated, a current could flow to the GND plane 2015 of the substrate 2019. This phenomenon occurs because, for example, when a control current is input to the control line 2016 on the substrate 2019, the control current flows to the GND plane 2015 of the substrate 2019 after flowing through the control line 2016. A configuration for reducing crosstalk that is caused as a current flows through the GND plane 2006 of the chip 2018 has been described so far. In contrast, a configuration for reducing crosstalk that is caused as a current flows through the GND plane 2015 of the substrate 2019 will be described in the ninth example embodiment.

Figure 50:
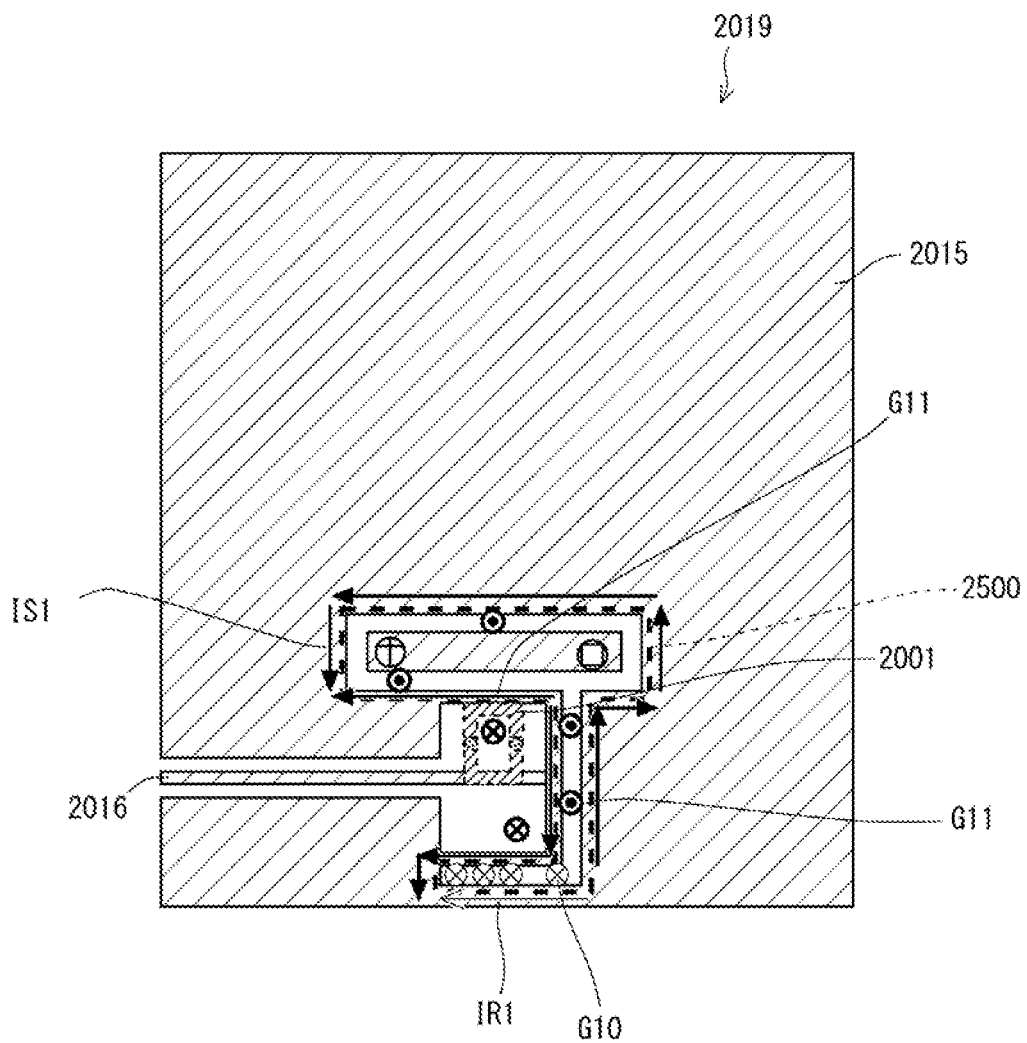
FIG. 50 is a diagram for explaining a problem that occurs when a current causing crosstalk is flowing in the GND plane of the substrate shown in FIG. 49.

FIG. 50 is a diagram for explaining a problem that occurs when a current IR1, which causes crosstalk, has flowed to the GND plane 2015 of the substrate 2019 shown in FIG. 49. In this case, a part of the magnetic flux G10 generated by the current IR1 passes through the superconducting loop 2500 of the substrate 2019. Since the magnetic flux that passes through inside the superconducting loop 2500 of the substrate 2019 must be conserved, a shielding current IS1 flows as shown in FIG. 50. As a result, the current IS1 generates a magnetic flux G11, and a part of the magnetic flux G11 that is generated inside the superconducting loop 2500 of the substrate 2019 cancels the part of the magnetic flux G10 that is generated inside the superconducting loop 2500 of the substrate 2019 by the current IR1. However, since the shielding current IS1 passes through an area very close to the SQUID 2001 as shown in FIG. 50, there is a possibility that the SQUID 2001 on the chip 2018 could sense (i.e., be affected by) a part of the magnetic flux G11 generated by the shielding current IS1. As a result, the SQUID 2001 is unintentionally controlled (e.g., the resonance frequency of the quantum bit is unintentionally changed). The layout on the substrate is preferably designed so that such a possibility is eliminated as much as possible.

Figure 51:
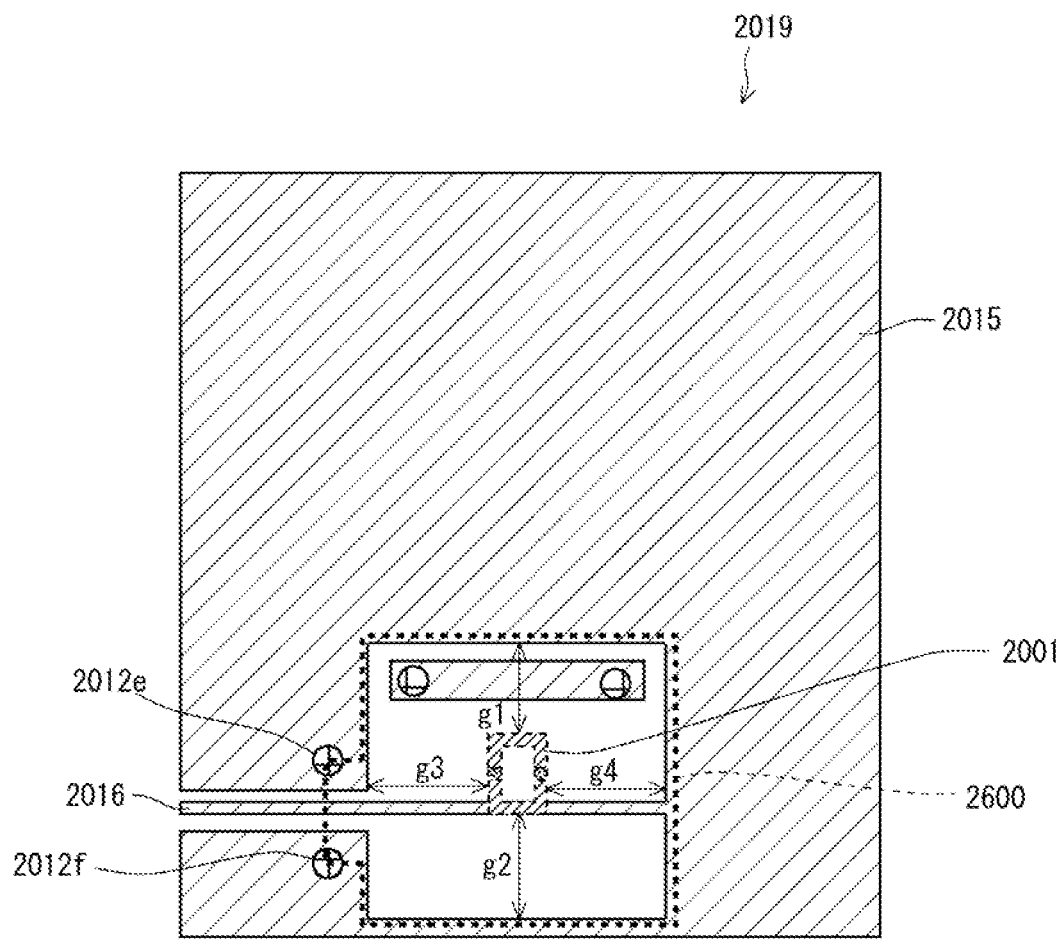
FIG. 51 shows a layout of a substrate according to a ninth example embodiment.

FIG. 51 shows an example of such a layout of a substrate, and shows a layout of the substrate 2019 according to the ninth example embodiment. In the configuration shown in FIG. 51, a superconducting loop 2600 is formed by using bumps for connecting the GND plane 2015 of the substrate 2019 to the GND plane 2006 of the chip 2018. In FIG. 51, symbols 2012e and 2012f indicate places at which these bumps are connected. As shown in FIG. 51, in this example embodiment, a part of the GND plane 2015 corresponding to the area of the SQUID 2001 projected onto the substrate 2019 and its surrounding area is cut out. That is, the GND plane 2015 is shaped as if a part having a predetermined shape (i.e., a rectangle in the example shown in FIG. 51) is cut out from the GND plane 2015 so that the GND plane 2015 is spaced apart from the SQUID 2001 projected onto the substrate 2019 by a predetermined interval. Note that, in this example embodiment, in order to secure the path of the control line 2016, the GND plane 2015 is shaped as if the outside of the aforementioned rectangle is cut out along the control line 2016.

The superconducting loop 2600 is a loop circuit having a shape corresponding to the periphery of the above-described rectangle, and is a three-dimensional superconducting loop using the substrate 2019, the above-described bumps, and the chip 2018. In FIG. 51, as indicated by symbols 2012e and 2012f, the bumps are provided on both sides of the control line 2016 so as to form a superconducting loop 2600 across the control line 2016. Specifically, in the example shown in FIG. 51, they are provided in the vicinity of the aforementioned rectangle. By the above-described configuration, a three-dimensional superconducting loop 2600 using the GND plane 2015 of the substrate 2019, the bumps, and the GND plane 2006 of the chip 2018 is formed. Note that the line crossing over the control line 2016 in the superconducting loop 2600 is realized (i.e., formed) by using the bumps and the GND plane 2006 of the chip 2018, and the other lines in the superconducting loop 2600 are realized (i.e., formed) by the GND plane 2015 of the substrate 2019. That is, the superconducting loop 2600 is a circuit that uses the GND plane 2015 of the substrate 2019 and the connection circuit (the bumps and the GND plane 2006 of the chip 2018) that connects parts of the GND plane 2015 of the substrate 2019 located on both sides of the control line 2016 to each other. Note that, as shown in FIG. 51, the superconducting loop 2600 is a circuit that surrounds the area in the substrate 2019 corresponding to the area where the SQUID 2001 is located (the area where the projected SQUID 2001 is located) with a predetermined interval (see g1, g2, g3 and g4 in FIG. 51) therebetween. The control line 2016 does not separate into branches, and is a straight line. The control line 2016 enters the superconducting loop 2600 of the substrate 2019 from the outside thereof, and connects to the superconducting loop 2600 (the GND plane 2015 of the substrate 2019). That is, the straight control line 2016 is provided so as to cross the superconducting loop 2600 (the aforementioned rectangle). More specifically, the control line 2016 is wired in a straight line above the electrode 2008 connected to the SQUID 2001, or above the SQUID 2001. The control line 2016 extends in a second direction (the left/right direction in the drawing) in the vicinity of the SQUID 2001 while intersecting the electrode 2008 or the SQUID 2001 in a three-dimensional manner (i.e., like an overpass). In other words, the control line 2016 is wired so as to cross over (i.e., cross above) the electrode 2008 or the SQUID 2001 in a direction intersecting the direction in which the electrode 2005 and the SQUID 2001 are arranged.

Figure 52:
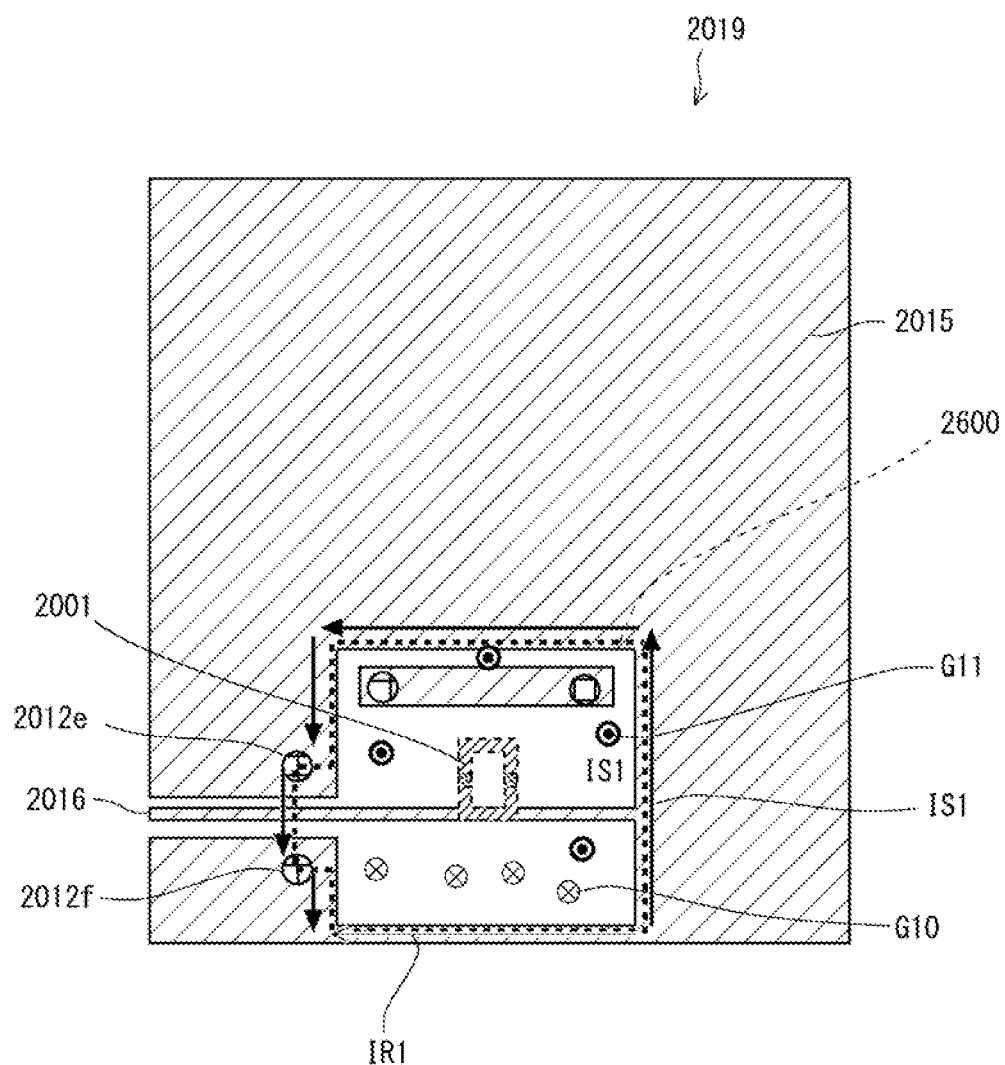
FIG. 52 is a diagram for explaining an effect of a current that flows to the GND plane of the substrate shown in FIG. 51.

According to the configuration in accordance with the ninth example embodiment, the superconducting loop 2600 of the substrate 2019 can be disposed far from the position of the projected SQUID 2001. Therefore, as shown in FIG. 52, even when the current IR1, which causes crosstalk, flows through the GND plane 2015 of the substrate 2019, the magnetic flux G11 generated by the shielding current IS1, which flows through the superconducting loop 2600 of the substrate 2019 because of the flow of the current IR1, does not affect the SQUID 2001. Alternatively, even if it affects the SQUID 2001, its effect can be reduced as compared to that in the configuration of the layout shown in FIG. 50.

Here, when the distance between the chip and the substrate is represented by d (see FIG. 42), the distances between the sides of the superconducting loop 2600 (the aforementioned rectangle) and the respective sides of the projected SQUID 2001, i.e., the gaps g1, g2, g3 and g4 in FIG. 51, are preferably as long as possible. That is, the separation distance between the SQUID 2001 and the superconducting loop 2600 is preferably as long as possible. For example, the gaps g1, g2, g3 and g4 are preferably equal to or longer than d, more preferably equal to or longer than 2d, and even more preferably equal to or longer than 3d.

First Modified Example of Ninth Example Embodiment

Figure 53:
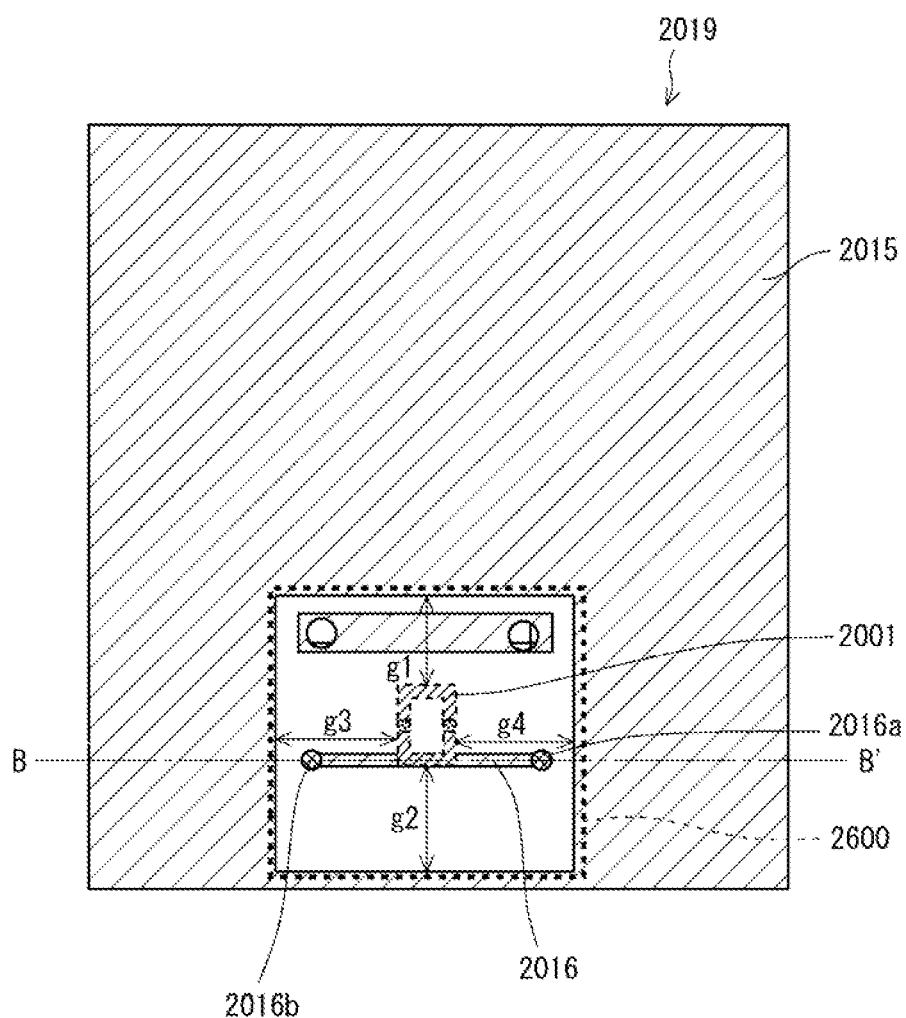
FIG. 53 shows a layout of a substrate according to a first modified example of the ninth example embodiment.
Figure 54:
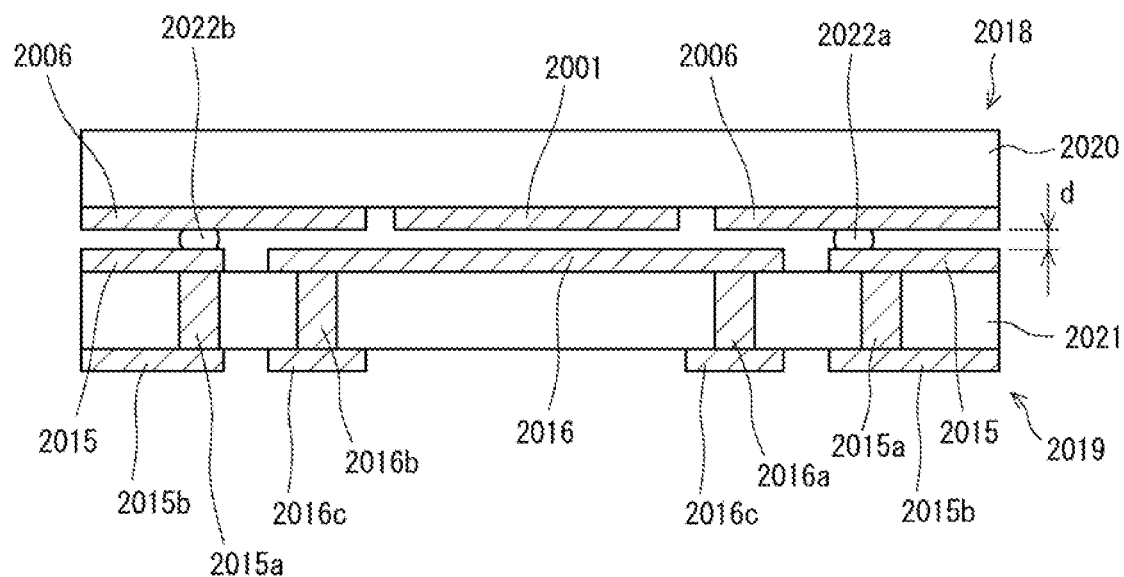
FIG. 54 is a cross-sectional diagram of a structure in which a chip and a substrate are flip-chip connected to each other by using bumps.

A first modified example of the ninth example embodiment will be described. Note that descriptions of components/structures similar to those in the ninth example embodiment are omitted as appropriate. FIG. 53 shows a layout of a substrate 2019 according to the first modified example of the ninth example embodiment. Further, FIG. 54 shows a cross-sectional diagram of a structure in which the chip 2018 and the substrate 2019 are flip-chip connected to each other by using bumps 2022*a* and 2022*b*. Specifically, it shows a cross-sectional diagram taken along a line B-B' in FIG. 53. As shown in FIG. 53, the control line 2016 may be disposed only inside the superconducting loop 2600 of the substrate 2019. In this case, as shown in FIG. 54, the control line 2016 is configured so as to reach the front surface of the substrate 2019 from the rear surface of the substrate 2019 through a TSV 2016*a*, which passes (i.e., extends) through the substrate 2019, pass through a wiring line for the control line provided on the front surface of the substrate 2019, and return to the rear surface of the substrate 2019 through a TSV 2016*b*. Note that the rear surface of the substrate 2019 means the bottom side (i.e., the underside) of the substrate 2019 in FIG. 54, and the front surface of the substrate 2019 means the top side of the substrate 2019 in FIG. 54. Further, in FIG. 54, a symbol 2016*c* indicates a wiring line for the control line provided on the rear surface of the substrate 2019. Further, in the configuration shown in FIG. 54, the GND plane 2015 on the front surface of the substrate 2019 is connected to the GND plane 2015*b* on the rear surface of the substrate 2019 through the TSV 2015*a*.

In the ninth example embodiment, the superconducting loop 2600 uses, as a part thereof, the GND plane 2006 of the chip 2018. In contrast, in this modified example, the superconducting loop 2600 is closed on the substrate 2019 as shown in FIG. 53. That is, in this modified example, as shown in FIG. 53, the superconducting loop 2600 is the GND plane 2015 of the substrate 2019, which completely surrounds the area in the substrate 2019 corresponding to the area where the SQUID 2001 is located with a predetermined interval therebetween. Even in the above-described configuration, advantageous effects similar to those in the ninth example embodiment can be obtained.

Second Modified Example of Ninth Example Embodiment

Figure 55:
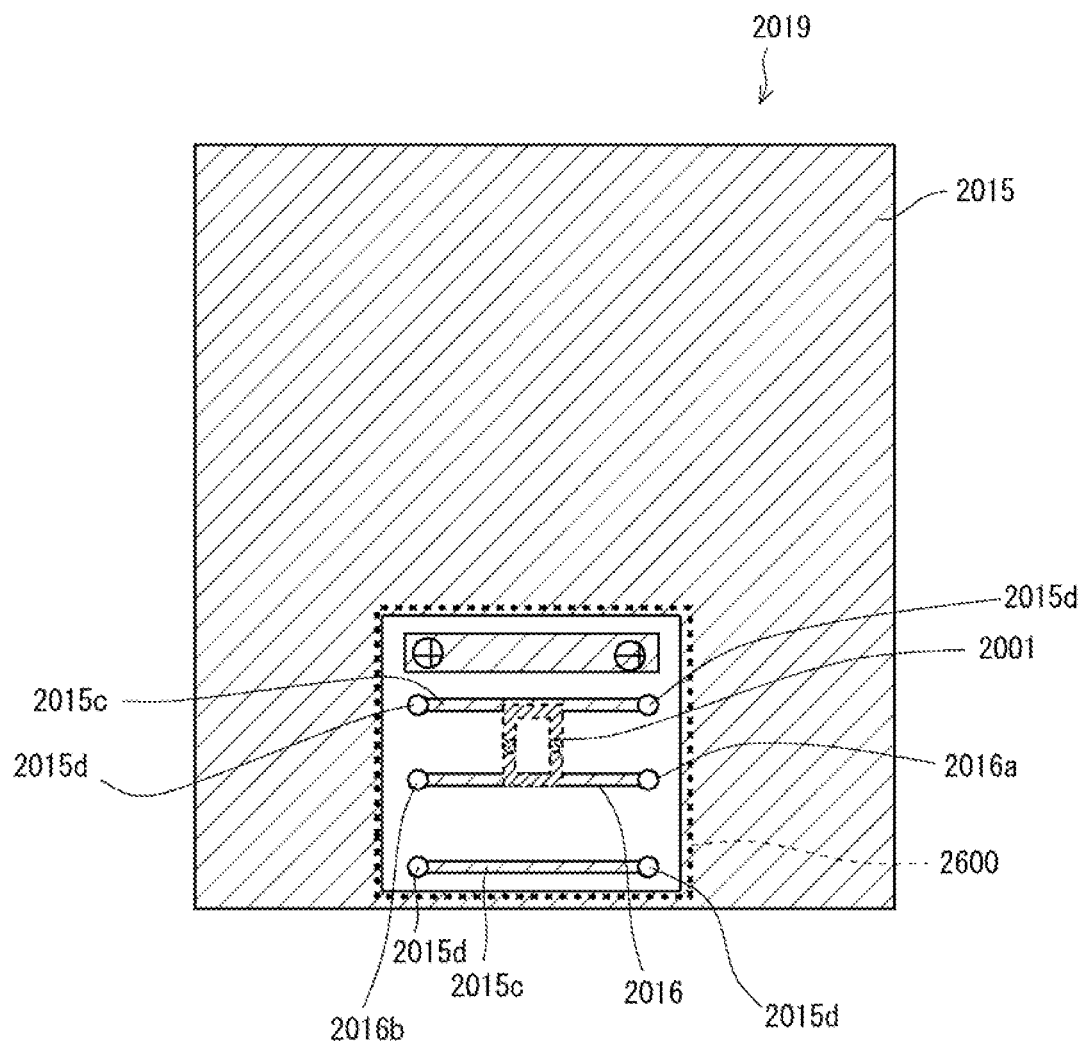
FIG. 55 shows a layout of a substrate according to a second modified example of the ninth example embodiment.

A second modified example of the ninth example embodiment will be described. Note that descriptions of components/structures similar to those in the first modified example of the ninth example embodiment are omitted as appropriate. FIG. 55 shows a layout of a substrate 2019 according to the second modified example of the ninth example embodiment.

Since the current flowing through the control line 2016 is a current in which a DC current and a high-frequency current such a current having a frequency of 20 GHz are superimposed, a high-frequency signal flows through the control line 2016. Therefore, the transmission characteristics of the control line 2016 at high frequencies preferably should be improved. In general, the impedance of a signal source apparatus that supplies a signal to the control line 2016 is 50Ω. Therefore, it is necessary to make the characteristic impedance of the control line 2016 as close as 50Ω in order to improve the transmission characteristics of the control line 2016 at high frequencies. In the first modified example of the ninth example embodiment, since the control line 2016 is somewhat far from the GND plane 2015, the characteristic impedance of the control line 2016 could be higher than 50Ω In particular, as shown in FIG. 53, the control line 2016 is far from the GND plane 2015 on both sides of the control line 2016 (the upper and lower sides of the control line 2016 in FIG. 53). In the configuration shown in FIG. 53, if the characteristic impedance of the control line 2016 becomes higher than 50Ω, it is preferred to lower the characteristic impedance of the control line 2016 and thereby to bring it closer to 50Ω. To that end, it is necessary to dispose the GNDs on both sides of the control line 2016 closer to the control line 2016 than in the configuration shown in FIG. 53. In the second modified example of the ninth example embodiment, as shown in FIG. 55, GNDs (GND lines 2015*c*) are disposed in places on both sides of the control line 2016 that are closer to the control line 2016 than the GND plane 2015 is. That is, GND lines 2015*c* are provided on both sides of the control line 2016 along the control line 2016. In this way, the characteristic impedance of the control line 2016 is brought closer to a predetermined value (e.g., 50Ω). Therefore, it is expected that the transmission characteristics of the control line 2016 at high frequencies will improve as compared to those in the configuration of the first modified example. Note that the above-described GND lines 2015*c* are connected to the GND plane on the rear surface of the substrate 2019 through TSVs 2015*d*. Further, the control line 2016 is connected to a wiring line for the control line on the rear surface of the substrate 2019 through the TSV 2016*a* (the TSV 2016*b*). Further, the control line 2016 and the GND lines 2015*c* are wired inside the superconducting loop 2600 on the surface of the substrate 2019 that is opposed to the chip 2018. Further, the control line 2016 is connected to the TSV 2016*a* (the TSV 2016*b*), which passes (i.e., extends) through the substrate 2019, and the GND lines 2015*c* are connected to the TSVs 2015*d*, which passes through the substrate 2019. Further, the TSVs 2015*d* are disposed (i.e., formed) along the TSV 2016*a* (the TSV 2016*b*).

Third Modified Example of Ninth Example Embodiment

Figure 56:
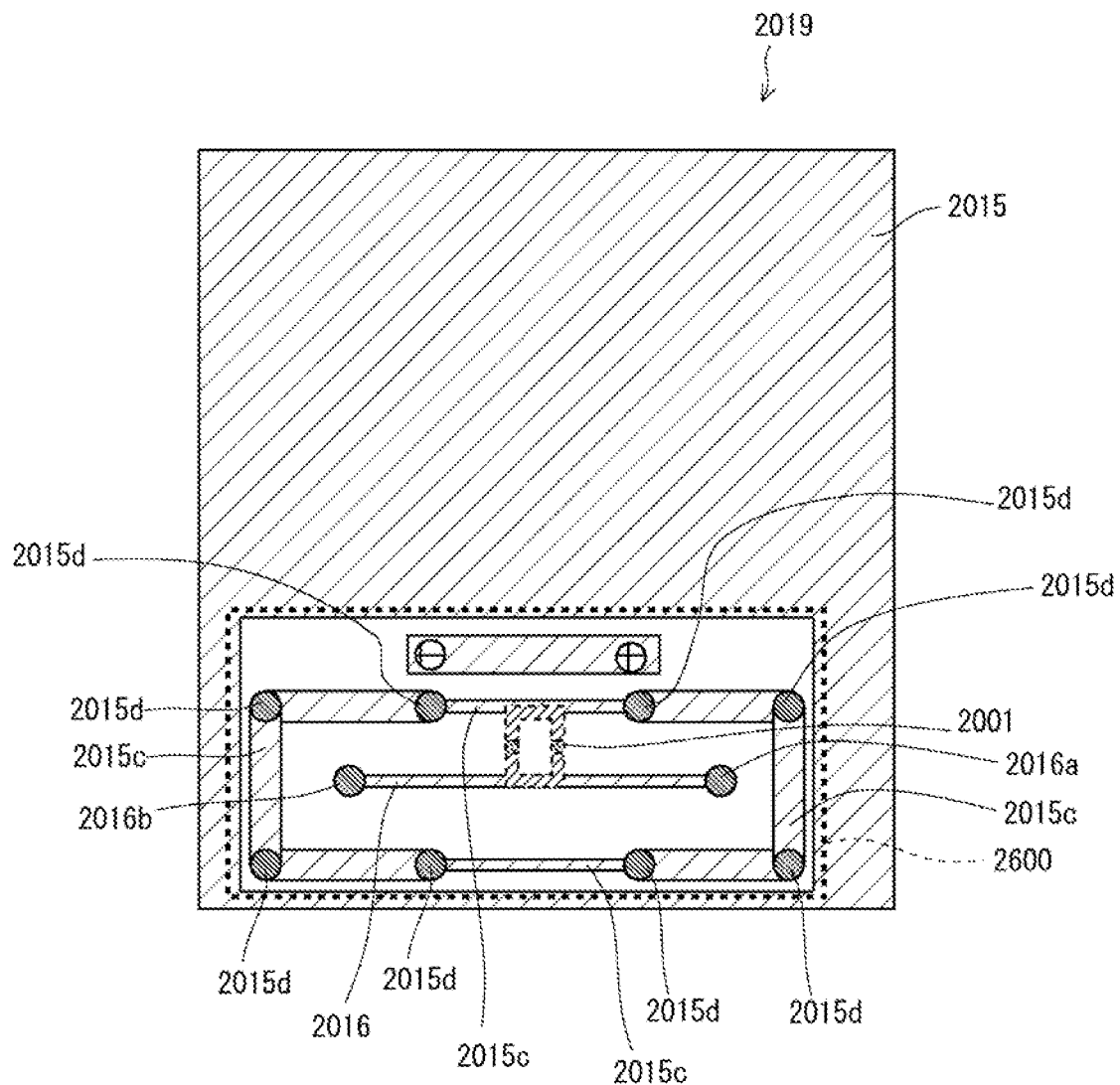
FIG. 56 shows a layout of a substrate according to a third modified example of the ninth example embodiment.

A third modified example of the ninth example embodiment will be described. Note that descriptions of components/structures similar to those in the second modified example of the ninth example embodiment are omitted as appropriate. FIG. 56 shows a layout of a substrate 2019 according to the third modified example of the ninth example embodiment. Similarly to the above-described second modified example, the configuration shown in FIG. 56 is also used to make the characteristic impedance of the control line 2016 close to a predetermined value (e.g., 50Ω). In the configuration shown in FIG. 55, two TSVs 2015*d* for the GNDs are disposed on the respective sides (i.e., both sides) of each of the TSVs 2016*a* and 2016*b* for the control line 2016. In contrast, in the configuration shown in FIG. 56, four TSVs 2015*d* for the GNDs are disposed around each of the TSVs 2016*a* and 2016*b* for the control line 2016. Note that the GND lines 2015*c* are wired so as to surround the control line 2016 on the front surface of the substrate 2019.

It should be noted that, in order to improve the high-frequency characteristics of the control line 2016, most preferably, TSVs for the GNDs are arranged so as to completely surround the TSVs for the control line, and thereby forming a structure of the TSVs similar to that of the coaxial cable. That is, in order to improve the high-frequency characteristics of the control line, it is most preferred to use a dual-structure TSV including a hollow cylindrical TSV for the GND and a TSV for the control line that passes through the hollow part of the TSV for the GND and is electrically insulated from the TSV for GND through silicon. However, if it is difficult to form such a coaxial TSV, for example, as shown in FIG. 56, the high-frequency characteristics of the control line is improved by arranging four TSVs 2015*d* for the GNDs around the TSV 2016*a* (the TSV 2016*b*) for the control line 2016 and thereby forming a structure resembling the coaxial structure. The configuration in which four TSVs 2015*d* for the GNDs are arranged as shown in FIG. 56 is closer to the coaxial structure than the configuration in which two TSVs 2015*d* for the GNDs are arranged as shown in FIG. 55 is. Therefore, it is expected that the high-frequency characteristics of the control line 2016 will be improved by adopting the configuration shown in FIG. 56 rather than adopting the configuration shown in FIG. 55. As described above, a plurality of TSVs 2015*d* may be provided for one TSV 2016*a* (one TSV 2016*b*) so as to surround the TSV 2016*a* (the TSV 2016*b*). Note that the number of TSVs 2015*d* surrounding the TSV 2016*a* (the TSV 2016*b*) is not limited to two or four, but may be three, or five or more.

Other Modified Example of Ninth Example Embodiment

Figure 57:
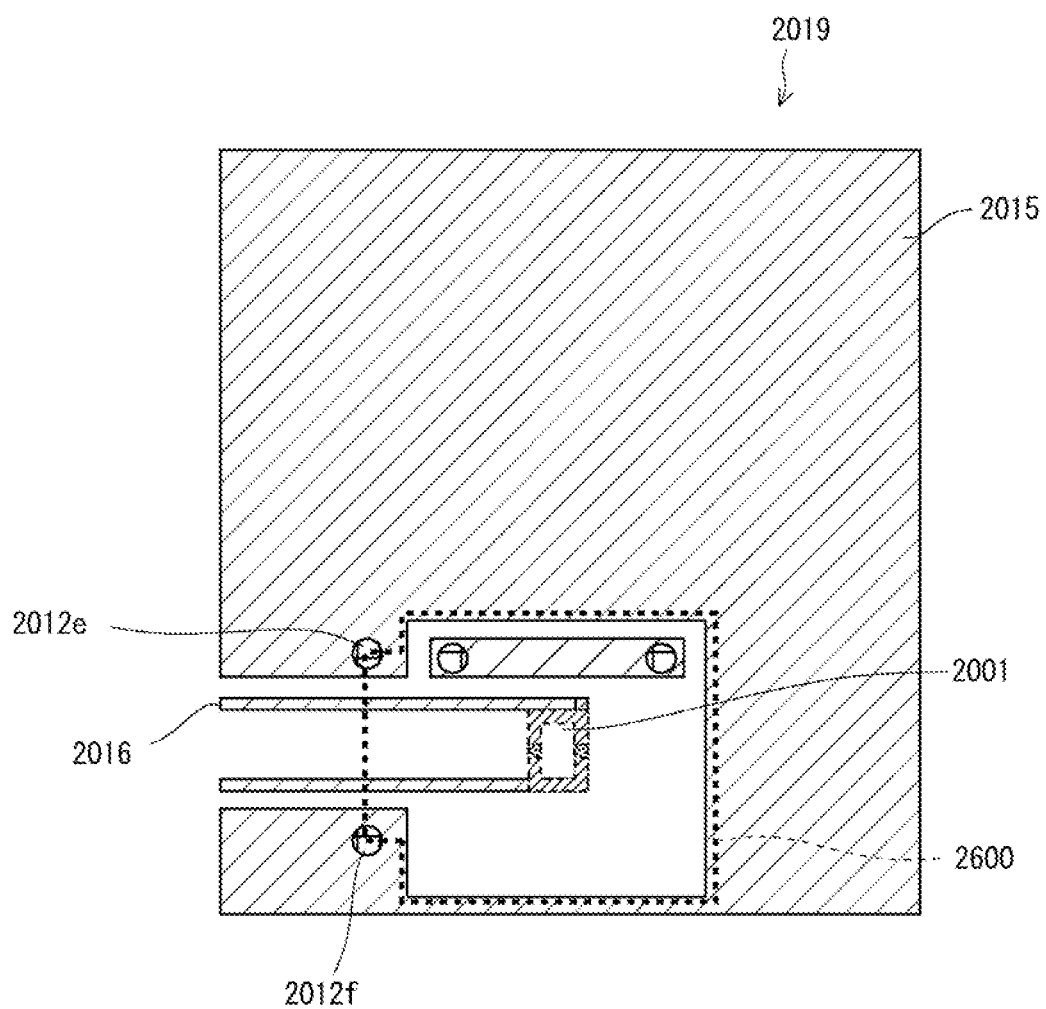
FIG. 57 shows a layout of a substrate according to another modified example of the ninth example embodiment.
Figure 58:
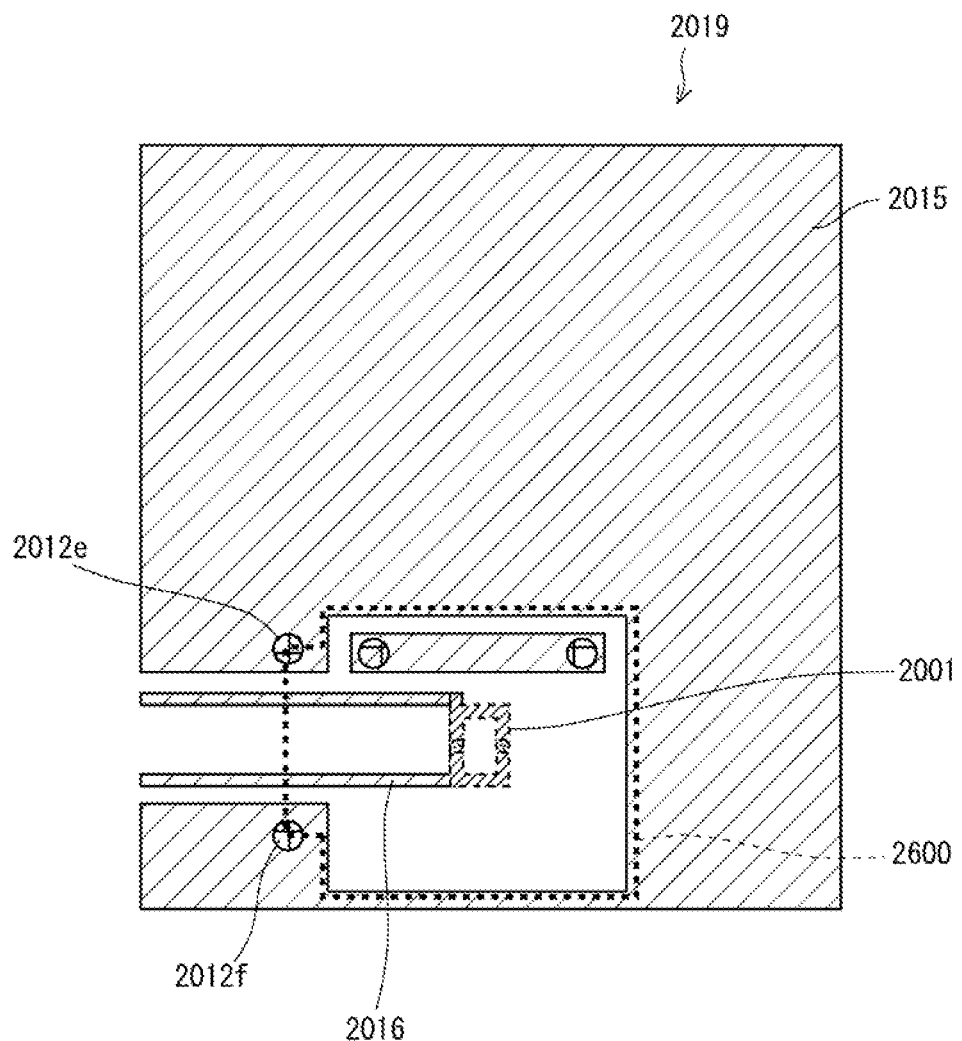
FIG. 58 shows a layout of a substrate according to another modified example of the ninth example embodiment.

Other conceivable modified examples of the ninth example embodiment include configurations shown in FIGS. 57 and 58. These examples are similar to the ninth example embodiment, except that the control line 2016 has a U-shape. That is, as shown in FIG. 57 or FIG. 58, the control line 2016 may have such a shape that it enters the superconductor loop 2600 of the substrate 2019 from the outside thereof, is folded back inside the superconductor loop 2600 of the substrate 2019, and then goes out from the superconductor loop 2600 again. Further, in the configurations shown in FIGS. 57 and 58, the control line 2016 may be disposed only inside the superconducting loop 2600 of the substrate 2019 by using TSVs as in the case of the configurations shown in FIGS. 53, 55 and 56.

Note that the present disclosure is not limited to the above-described example embodiments, and various modifications can be made to them within the scope and spirit of the disclosure. For example, the above-described oscillator can be used for an arbitrary purpose. For example, the above-described oscillator may be used as a phase detector, or as a quantum computer.

According to the present disclosure, an oscillator in which crosstalk can be reduced can be provided.

The first to ninth embodiments can be combined as desirable by one of ordinary skill in the art.

While the disclosure includes been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. An oscillator comprising:
   a Superconducting Quantum Interference Device (SQUID);
   a transmission line connected to the SQUID;
   a ground plane; and
   a first connection circuit connecting parts of the ground plane located on both sides of the transmission line to each other,
   wherein the first connection circuit is disposed at a place a distance of which from a part at which the transmission line and the SQUID are connected to each other is ¹/₂₀ or less of a length of ¼ of a wavelength of a standing wave generated on the transmission line.

2. The oscillator according to claim 1, further comprising:
   a control line configured to magnetically couple with the SQUID, and to which a control signal is input; and
   a second connection circuit connecting parts of the ground plane located on both sides of the control line to each other.

3. An oscillator comprising:
   a component in which two Josephson junctions are connected in a loop by superconducting lines a transmission line connected to the component;
   a ground plane; and
   a first connection circuit connecting parts of the ground plane located on both sides of the transmission line to each other,
   wherein the first connection circuit is disposed at a place a distance of which from a part at which the transmission line and the component are connected to each other is ¹/₂₀ or less of a length of ¼ of a wavelength of a standing wave generated on the transmission line.

4. The oscillator according to claim 3, further comprising:
   a control line configured to magnetically couple with the component, and to which a control signal is input; and a second connection circuit connecting parts of the ground plane located on both sides of the control line to each other.

\* \* \* \* \*